(12) United States Patent
Yamazaki

(10) Patent No.: US 8,860,030 B2
(45) Date of Patent: Oct. 14, 2014

(54) THIN FILM TRANSISTOR AND DISPLAY DEVICE INCLUDING THE SAME

(75) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 120 days.

(21) Appl. No.: 13/166,871

(22) Filed: Jun. 23, 2011

(65) Prior Publication Data

US 2011/0248275 A1    Oct. 13, 2011

Related U.S. Application Data

(62) Division of application No. 12/343,800, filed on Dec. 24, 2008, now Pat. No. 7,968,879.

(30) Foreign Application Priority Data

Dec. 28, 2007  (JP) .................................. 2007-339409

(51) Int. Cl.
| | |
|---|---|
| H01L 29/04 | (2006.01) |
| H01L 29/06 | (2006.01) |
| H01L 29/10 | (2006.01) |
| H01L 31/00 | (2006.01) |
| H01L 29/786 | (2006.01) |
| H01L 29/49 | (2006.01) |
| H01L 27/12 | (2006.01) |
| H01L 29/45 | (2006.01) |

(52) U.S. Cl.
CPC ....... *H01L 29/78684* (2013.01); *H01L 29/4908* (2013.01); *H01L 27/1214* (2013.01); *H01L 29/458* (2013.01); *H01L 29/78696* (2013.01)
USPC .......... 257/63; 257/19; 257/59; 257/E21.414; 257/E29.291

(58) Field of Classification Search
USPC .............. 257/19, 52, 57, 59, 61, 63, E33.034, 257/E33.046, E33.049, E31.049, E29.291, 257/E21.414; 438/158–159
See application file for complete search history.

(56) References Cited

U.S. PATENT DOCUMENTS

| | | | |
|---|---|---|---|
| 4,409,134 A |  | 10/1983 | Yamazaki |
| 4,778,773 A | * | 10/1988 | Sukegawa .................... 438/160 |

(Continued)

FOREIGN PATENT DOCUMENTS

| | | |
|---|---|---|
| EP | 473988 A1 | 3/1992 |
| JP | 60-098680 A | 6/1985 |

(Continued)

OTHER PUBLICATIONS

Mohammad R. Esmaeili-Rad et al., "Absence of Defect State Creation in Nanocrystalline Silicon Thin Film Transistors Deduced from Constant Current Stress Measurements," Applied Physics Letters, vol. 91, No. 11, pp. 113511-1-113511-3, 2007.

(Continued)

*Primary Examiner* — Cheung Lee
*Assistant Examiner* — Jeremy Joy
(74) *Attorney, Agent, or Firm* — Fish & Richardson P.C.

(57) ABSTRACT

One object of the present invention is reduction of off current of a thin film transistor. Another object of the present invention is improvement of electric characteristics of the thin film transistor. Further, another object of the present invention is improvement of image quality of the display device including the thin film transistor. The thin film transistor includes a semiconductor film containing germanium at a concentration greater than or equal to 5 at. % and less than or equal to 100 at. % or a conductive film which is provided over a gate electrode with the gate insulating film interposed therebetween and which is provided in an inner region of the gate electrode so as not to overlap with an end portion of the gate electrode, a film covering at least a side surface of the semiconductor film containing germanium at a concentration greater than or equal to 5 at. % and less than or equal to 100 at. % or the conductive film, a pair of wirings formed over the film covering the side surface of the semiconductor film containing germanium at a concentration greater than or equal to 5 at. % and less than or equal to 100 at. % or the conductive film.

18 Claims, 35 Drawing Sheets

(56) References Cited

U.S. PATENT DOCUMENTS

| | | | |
|---|---|---|---|
| 5,294,811 A * | 3/1994 | Aoyama et al. | 257/59 |
| 5,355,002 A * | 10/1994 | Wu | 257/57 |
| 5,358,925 A | 10/1994 | Neville et al. | |
| 5,365,081 A | 11/1994 | Yamazaki et al. | |
| 5,371,380 A | 12/1994 | Saito et al. | |
| 5,453,858 A | 9/1995 | Yamazaki | |
| 5,514,879 A | 5/1996 | Yamazaki | |
| 5,591,987 A | 1/1997 | Yamazaki et al. | |
| 5,614,732 A | 3/1997 | Yamazaki | |
| 5,648,293 A | 7/1997 | Hayama et al. | |
| 5,648,662 A | 7/1997 | Zhang et al. | |
| 5,693,238 A | 12/1997 | Schmitt et al. | |
| 5,701,167 A | 12/1997 | Yamazaki | |
| 5,766,989 A | 6/1998 | Maegawa et al. | |
| 5,811,328 A | 9/1998 | Zhang et al. | |
| 5,825,050 A * | 10/1998 | Hirakawa | 257/57 |
| 5,834,345 A | 11/1998 | Shimizu | |
| 5,849,601 A | 12/1998 | Yamazaki | |
| 5,859,445 A | 1/1999 | Yamazaki | |
| 6,011,277 A | 1/2000 | Yamazaki | |
| 6,023,075 A | 2/2000 | Yamazaki | |
| 6,107,654 A | 8/2000 | Yamazaki | |
| 6,118,151 A * | 9/2000 | Tsutsu | 257/347 |
| 6,124,155 A | 9/2000 | Zhang et al. | |
| 6,166,399 A | 12/2000 | Zhang et al. | |
| 6,232,242 B1 | 5/2001 | Hata et al. | |
| 6,252,249 B1 | 6/2001 | Yamazaki | |
| 6,296,735 B1 | 10/2001 | Marxer et al. | |
| 6,306,213 B1 | 10/2001 | Yamazaki | |
| 6,307,220 B1 | 10/2001 | Yamazaki | |
| 6,335,213 B1 | 1/2002 | Zhang et al. | |
| 6,387,737 B1 * | 5/2002 | Yamazaki et al. | 438/149 |
| 6,388,270 B1 | 5/2002 | Yamazaki et al. | |
| 6,444,390 B1 | 9/2002 | Yamazaki et al. | |
| 6,533,534 B2 | 3/2003 | Schmitt et al. | |
| 6,545,319 B2 | 4/2003 | Deane et al. | |
| 6,673,255 B2 | 1/2004 | Marxer et al. | |
| 6,683,012 B2 | 1/2004 | Hata et al. | |
| 6,690,068 B2 | 2/2004 | Yamazaki et al. | |
| 6,703,265 B2 | 3/2004 | Asami et al. | |
| 6,756,258 B2 | 6/2004 | Zhang et al. | |
| 6,759,677 B1 | 7/2004 | Yamazaki et al. | |
| 6,797,548 B2 | 9/2004 | Zhang et al. | |
| 6,847,064 B2 | 1/2005 | Zhang et al. | |
| 6,893,922 B2 | 5/2005 | Joo et al. | |
| 6,939,755 B1 | 9/2005 | Ohtani et al. | |
| 6,956,236 B1 | 10/2005 | Sasaki et al. | |
| 7,015,507 B2 | 3/2006 | Yonehara et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,220,610 B2 | 5/2007 | Kim | |
| 7,459,338 B2 | 12/2008 | Nakayama et al. | |
| 7,808,000 B2 | 10/2010 | Yamazaki et al. | |
| 7,923,725 B2 * | 4/2011 | Irizumi | 257/57 |
| 8,101,444 B2 * | 1/2012 | Yamazaki et al. | 438/30 |
| 8,420,462 B2 * | 4/2013 | Kobayashi et al. | 438/151 |
| 2002/0043660 A1 | 4/2002 | Yamazaki et al. | |
| 2003/0071307 A1 * | 4/2003 | Noguchi et al. | 257/347 |
| 2004/0169177 A1 * | 9/2004 | Asami et al. | 257/64 |
| 2004/0188685 A1 * | 9/2004 | Lin et al. | 257/66 |
| 2004/0201023 A1 * | 10/2004 | Yamazaki et al. | 257/75 |
| 2005/0012097 A1 | 1/2005 | Yamazaki | |
| 2005/0017243 A1 | 1/2005 | Zhang et al. | |
| 2006/0086935 A1 * | 4/2006 | Suzawa et al. | 257/59 |
| 2007/0007630 A1 * | 1/2007 | Fang et al. | 257/644 |
| 2007/0018165 A1 | 1/2007 | Yamazaki | |
| 2007/0040971 A1 * | 2/2007 | Maekawa et al. | 349/122 |
| 2007/0072439 A1 * | 3/2007 | Akimoto et al. | 438/795 |
| 2007/0161160 A1 * | 7/2007 | Chen | 438/149 |
| 2008/0044962 A1 | 2/2008 | Zhang et al. | |
| 2008/0164473 A1 * | 7/2008 | Tai et al. | 257/59 |
| 2008/0237596 A1 * | 10/2008 | Kim et al. | 257/59 |
| 2009/0001375 A1 | 1/2009 | Yamazaki et al. | |
| 2009/0002591 A1 | 1/2009 | Yamazaki et al. | |
| 2009/0020759 A1 * | 1/2009 | Yamazaki | 257/59 |
| 2009/0047760 A1 * | 2/2009 | Yamazaki et al. | 438/158 |
| 2009/0140251 A1 | 6/2009 | Yamazaki | |
| 2009/0140259 A1 | 6/2009 | Yamazaki | |
| 2009/0142909 A1 | 6/2009 | Jinbo et al. | |

FOREIGN PATENT DOCUMENTS

| | | |
|---|---|---|
| JP | 61-087371 A | 5/1986 |
| JP | 03-205830 A | 9/1991 |
| JP | 04-242724 A | 8/1992 |
| JP | 305190857 A | 7/1993 |
| JP | 05267662 A | 10/1993 |
| JP | 06-045354 A | 2/1994 |
| JP | 06-077483 A | 3/1994 |
| JP | 06-346245 A | 12/1994 |
| JP | 07-045833 A | 2/1995 |
| JP | 08-023099 A | 1/1996 |
| JP | 08055993 A | 2/1996 |
| JP | 08122819 A | 5/1996 |
| JP | 08-195492 A | 7/1996 |
| JP | 09-092841 A | 4/1997 |
| JP | 11-121761 A | 4/1999 |
| JP | 2002-246605 A | 8/2002 |
| JP | 2005-049832 A | 2/2005 |
| JP | 2005-167051 A | 6/2005 |
| JP | 2005-203638 A | 7/2005 |
| JP | 2007-005508 A | 1/2007 |
| JP | 2007-035964 A | 2/2007 |

OTHER PUBLICATIONS

Mohammad R. Esmaeili-Rad et al., "Stability of Nanocrystalline Silicon Bottom-Gate Thin-Film Transistors with Silicon Nitride Gate Dielectric," Journal of Applied Physics, vol. 102, No. 6, pp. 064512-1-064512-7, 2007.

Czang-Ho Lee et al., "Postdeposition Thermal Annealing and Material Stability of 75° C. Hydrogenated Nanocrystalline Silicon Plasma-Enhanced Chemical Vapor Deposition Films," Journal of Applied Physics, vol. 98, No. 3. pp. 034305-1-034305-7, Aug. 4, 2005.

Hyun Jung Lee et al.; "Leakage current mechanisms in top-gate nanocrystalline silicon thin film transistors"; Applied Physics Letters, vol. 92, pp. 083509-1-083509-3; 2008.

Mohammad R. Esmaeili-Rad et al.; "Absence of defect state creation in nanocrystalline silicon thin film transistors deduced from constant current stress measurements"; Applied Physics Letters, vol. 91; pp. 113511-1-113511-3; 2007.

Czang-Ho Lee et al.; "Stability of nc-Si:H TFTs With Silicon Nitride Gate Dielectric"; IEEE Transactions on Electron Devices, vol. 54, No. 1; pp. 45-51; Jan. 1, 2007.

Andrei Sazonov et al.; "Low-Temperature Materials and Thin Film Transistors for Flexible Electronics"; Proceedings of the IEEE, vol. 93, No. 8; pp. 1420-1428; Aug. 2005.

Mohammad R. Esmaeili-Rad et al.; "Stability of nanocrystalline silicon bottom-gate thin film transistors with silicon nitride gate dielectric"; Journal of Applied Physics, vol. 102; pp. 064512-1-064512-7; 2007.

Czang-Ho Lee et al.; "Top-Gate TFTs Using 13.56 MHz PECVD Microcrystalline Silicon"; IEEE Electron Device Letters, vol. 26, No. 9; pp. 637-639; Sep. 5, 2005.

Czang-Ho Lee et al.; "Postdeposition thermal annealing and material stability of 75° C. hydrogenated nanocrystalline silicon plasma-enhanced chemical vapor deposition films"; Journal of Applied Physics, vol. 98; pp. 034305-1-034305-7; Aug. 4, 2005.

Toshiaki Arai et al.; "41.2: Micro Silicon Technology for Active Matrix OLED Display"; SID 07 Digest: SID International Symposium Digest of Technical Papers, vol. XXXVIII, pp. 1370-1373; 2007.

Esmaeili-Rad, M. et al., "High Stability, Low Leakage Nanocrystalline Silicon Bottom Gate Thin Film Transistors for AMOLED Displays," IEDM 06: Technical Digest of International Electron Devices Meeting, 2006, pp. 303-306.

(56) References Cited

OTHER PUBLICATIONS

Lee, C. et al., "Directly Deposited Nanocrystalline Silicon Thin-Film Transistors With Ultra High Mobilities," Appl. Phys. Lett. (Applied Physics Letters), Dec. 18, 2006, vol. 89, No. 25, pp. 252101-1-252101-3.

Lee, C. et al., "High-Mobility N-Channel and P-Channel Nanocrystalline Silicon Thin-Film Transistors," IEDM 05: Technical Digest of International Electron Devices Meeting, 2005, pp. 937-940.

Lee, C. et al., "High-Mobility Nanocrystalline Silicon Thin-Film Transistors Fabricated by Plasma-Enhanced Chemical Vapor Deposition," Appl. Phys. Lett. (Applied Physics Letters), May 24, 2005, vol. 86, pp. 222106-1-222106-3.

Lee, C. et al., "How to Achieve High Mobility Thin Film Transistors by Direct Deposition of Silicon Using 13.56 MHZ RF PECVD," IEDM 06: Technical Digest of International Electron Devices Meeting, Dec. 11, 2006, pp. 295-298.

\* cited by examiner

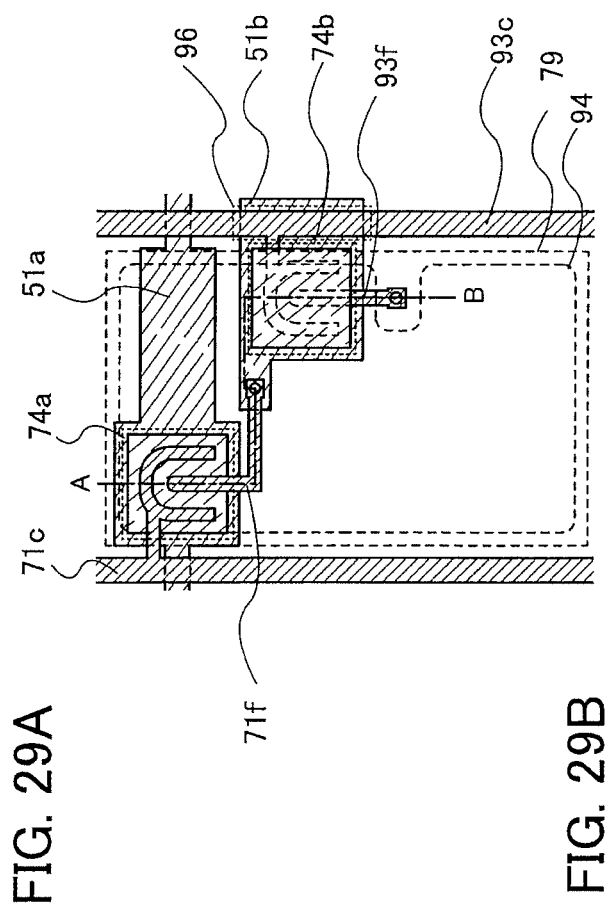
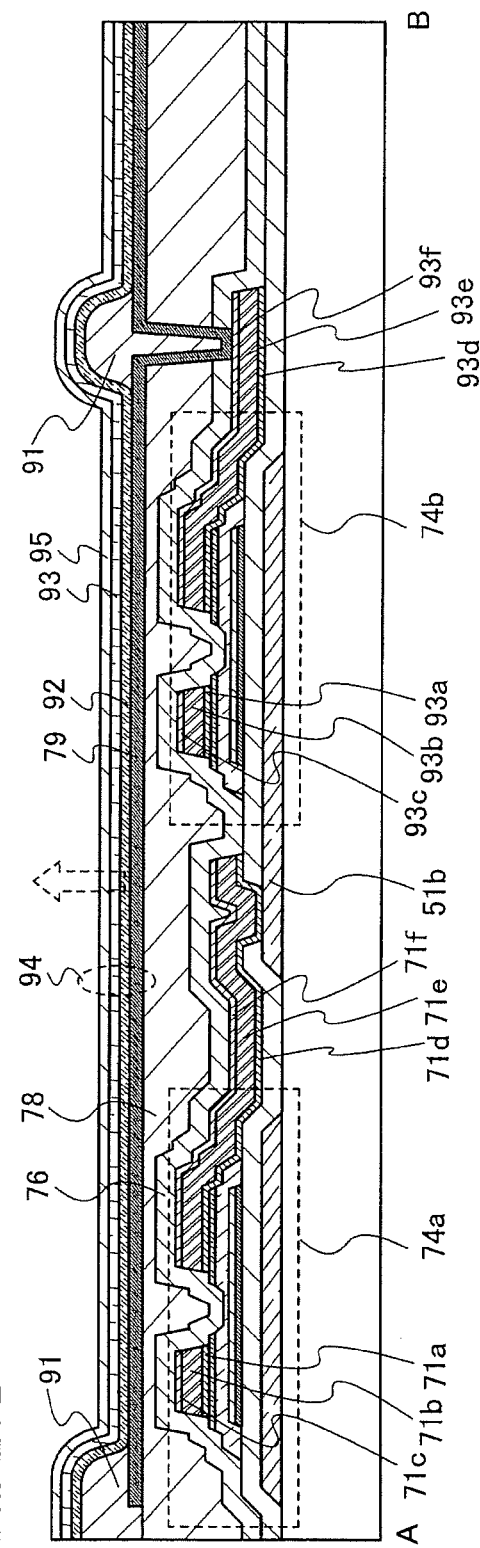
FIG. 29A
FIG. 29B

THIN FILM TRANSISTOR AND DISPLAY DEVICE INCLUDING THE SAME

CROSS-REFERENCE TO RELATED APPLICATIONS

This application is a divisional of U.S. application Ser. No. 12/343,800, filed Dec. 24, 2008, now allowed, which claims the benefit of a foreign priority application filed in Japan as Serial No. 2007-339409 on Dec. 28, 2007, both of which are incorporated by reference.

BACKGROUND OF THE INVENTION

1. Field of the Invention

The present invention relates to a thin film transistor and a display device using the thin film transistor at least in a pixel portion.

2. Description of the Related Art

In recent years, techniques for forming a thin film transistor using a semiconductor thin film (with a thickness of about several tens to several hundreds of nanometers) which is formed over a substrate having an insulating surface have attracted attention. A thin film transistor is widely used in an electronic device such as ICs and electro-optical devices, and their development especially as a switching element for a display device has been accelerated.

As a switching element of a display device, a thin film transistor using an amorphous semiconductor film for a channel formation region, a thin film transistor using a polycrystalline semiconductor film with a crystal grain diameter of 100 nm or more for a channel formation region, or the like is used. As a method for forming a polycrystalline semiconductor film, a technique is known in which a pulsed excimer laser beam is shaped into a linear laser beam with an optical system and an amorphous silicon film is crystallized by being scanned and irradiated with the linear laser beam.

As a switching element of a display device, a thin film transistor using a microcrystalline semiconductor film with a crystal grain diameter of less than 100 nm for a channel formation region is also used (see Reference 1: Japanese Published Patent Application No. H4-242724 and Reference 2: Japanese Published Patent Application No. 2005-49832).

SUMMARY OF THE INVENTION

A thin film transistor using a polycrystalline semiconductor film for a channel formation region has advantages in that its field effect mobility is two or more orders of magnitude greater than that of a thin film transistor using an amorphous semiconductor film for a channel formation region and a pixel portion of a display device and peripheral driver circuits thereof can be formed over the same substrate. However, the thin film transistor using a polycrystalline semiconductor film requires a more complicated process than the thin film transistor including an amorphous semiconductor film because of crystallization of the semiconductor film. Thus, there are problems such as reduction in yield and increase in cost.

Further, an inverted staggered thin film transistor using a microcrystalline semiconductor film for a channel formation region has problems in that the crystallinity of an interface region between a gate insulating film and the microcrystalline semiconductor film is low and electric characteristics of the thin film transistor are poor.

In addition, an inverted staggered thin film transistor using a microcrystalline semiconductor film for a channel formation region can improve ON current compared to an inverted staggered thin film transistor using an amorphous semiconductor film for a channel formation region; however, off current also increases. A display device using thin film transistors having high off current has a problem in that contrast decreases and power consumption increases.

In view of the above problems, it is an object of the present invention to reduce off current of a thin film transistor. In addition, it is another object of the present invention to improve electric characteristics of a thin film transistor. Further, it is still another object of the present invention to improve image quality of a display device using the thin film transistor.

One aspect of the present invention is a thin film transistor including a semiconductor film containing germanium at a concentration greater than or equal to 5 at. % and less than or equal to 100 at. % or a conductive film which is provided over a gate electrode with a gate insulating film interposed therebetween and which is provided in an inner region of the gate electrode so as not to overlap with an end portion of the gate electrode, a film covering at least a side surface of the semiconductor film containing germanium at a concentration ranging greater than or equal to 5 at. % and less than or equal to 100 at. % or the conductive film, and a pair of wirings formed over the film covering the side surface of the semiconductor film containing germanium at a concentration greater than or equal to 5 at. % and less than or equal to 100 at. % or the conductive film. The film covering the side surface of the semiconductor film containing germanium at a concentration greater than or equal to 5 at. % and less than or equal to 100 at. % or the conductive film is an amorphous semiconductor film or an insulating film. Further an impurity semiconductor film to which an impurity element imparting one conductivity type is added, which forms a source region and a drain region, may be formed in contact with the film covering the side surface of the semiconductor film or the conductive film.

Another aspect of the present invention is a thin film transistor including a semiconductor film containing germanium at a concentration greater than or equal to 5 at. % and less than or equal to 100 at. % or a conductive film which is provided over a gate electrode with an insulating film interposed therebetween and which is provided in an inner region of the gate electrode so as not to overlap with an end portion of the gate electrode, an amorphous semiconductor film covering a top surface and a side surface of the semiconductor film containing germanium at a concentration greater than or equal to 5 at. % and less than or equal to 100 at. % or the conductive film, and an impurity semiconductor film to which an impurity element imparting one conductivity type is added, which forms a source region and a drain region formed over the amorphous semiconductor film. Note that an end portion of the semiconductor film containing germanium at a concentration greater than or equal to 5 at. % and less than or equal to 100 at. % or the conductive film on the source and drain regions side may overlap with the amorphous semiconductor film and the impurity semiconductor film. Further, an end portion of the amorphous semiconductor film may be located beyond the source and drain regions.

Further, in the present invention described above, an amorphous semiconductor film which is different from the above-described amorphous semiconductor film may be provided on the top surface of the semiconductor film containing germanium at a concentration greater than or equal to 5 at. % and less than or equal to 100 at. % or the conductive film.

Another aspect of the present invention is a thin film transistor including a semiconductor film containing germanium at a concentration greater than or equal to 5 at. % and less than or equal to 100 at. % or a conductive film which is provided over a gate electrode with a gate insulating film interposed therebetween and which is provided in an inner region of the gate electrode so as not to overlap with an end portion of the gate electrode, an amorphous semiconductor film formed over the semiconductor film containing germanium at a concentration greater than or equal to 5 at. % and less than or equal to 100 at. % or the conductive film, an impurity semiconductor film formed over the amorphous semiconductor film to which an impurity element imparting one conductivity type is added and which forms source and drain regions, an insulating film covering a side surface of the semiconductor film containing germanium at a concentration greater than or equal to 5 at. % and less than or equal to 100 at. % or the conductive film, an insulating film covering a side surface of the amorphous film and a side surface of the impurity semiconductor film, and a pair of wirings which are formed over the insulating film and in contact with the impurity semiconductor film.

Another aspect of the present invention is a thin film transistor including a semiconductor film containing germanium at a concentration greater than or equal to 5 at. % and less than or equal to 100 at. % or a conductive film which is provided over a gate electrode with a gate insulating film interposed therebetween and which is provided in an inner region of the gate electrode so as not to overlap with an end portion of the gate electrode, an amorphous semiconductor film formed over the semiconductor film containing germanium at a concentration greater than or equal to 5 at. % and less than or equal to 100 at. % or the conductive film, an insulating film covering a side surface of the semiconductor film and a side surface of the amorphous semiconductor film, an impurity semiconductor film to which an impurity element imparting one conductivity type is added, which forms a source region and a drain region formed over the insulating film, and a pair of wirings in contact with the impurity semiconductor film.

Note that an end portion of the semiconductor film containing germanium at a concentration greater than or equal to 5 at. % and less than or equal to 100 at. % or the conductive film on the source region and the drain region side overlap with the insulating film.

As the semiconductor film containing germanium at a concentration greater than or equal to 5 at. % and less than or equal to 100 at. %, an amorphous germanium film, an amorphous silicon germanium film, a microcrystalline germanium film, a microcrystalline silicon germanium film, a polycrystalline germanium film, a polycrystalline silicon germanium film, or the like is employed. Further, as the conductive film, a metal film, a metal alloy film, a metal nitride film, a metal carbide film, a metal boride film, a metal silicide film, or the like is employed.

In addition, another aspect of the present invention is a method for manufacturing the above-described thin film transistor.

Further, another aspect of the present invention is a display device including a pixel electrode connected to the above-described thin film transistor.

Further, another aspect of the present invention is manufacturing a display device using the above-described thin film transistor for a pixel portion, and furthermore, for a drive circuit. The thin film transistor of the present invention has higher field effect mobility and a higher ON current compared to a transistor using an amorphous semiconductor film because a semiconductor film to which a donor having low resistivity is added is formed in contact with a gate insulating film in the thin film transistor of the present invention, whereby part of or entire drive circuit can be formed over the same substrate as the pixel portion and a system-on-panel can be formed.

The display device includes a light-emitting device and a liquid crystal display device in its category. The light-emitting device and the liquid crystal display device include a light-emitting element and a liquid crystal element, respectively. The light-emitting element includes, in its category, an element whose luminance is controlled by a current or a voltage, and specifically includes an organic EL (electroluminescence) and an inorganic EL.

In addition, the display device includes, in its category, a panel in which a display element is sealed, and a module in which an IC and the like including a controller are mounted on the panel. Further another aspect of the present invention relates one mode of an element substrate before the display element is completed in the manufacturing process of the display device, and the element substrate is provided with a means for supplying a current or a voltage to the display element in each of a plurality of pixels. Specifically, the element substrate may be in a state provided with only a pixel electrode of the display element, a state after a conductive film to be a pixel electrode is formed and before the conductive film is etched to form the pixel electrode, or any other state.

Note that the display device in this specification refers to an image display device, a light-emitting device, or a light source (including a lighting device). Further, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display portion by a chip on glass (COG) method.

According to the present invention, a semiconductor film with low resistivity containing germanium at a concentration greater than or equal to 5 at. % and less than or equal to 100 at. % or a conductive film with low resistivity is formed on a surface of an insulating film, an amorphous semiconductor film or an insulating film is formed, which covers a side surface of the semiconductor film containing germanium at a concentration greater than or equal to 5 at. % and less than or equal to 100 at. % or the conductive film, and a pair of wirings are formed over the amorphous semiconductor film or the insulating film, whereby increase of ON current and field effect mobility and improvement of electrical characteristics of the thin film transistor can be realized as well as reduction of off current of the thin film transistor. In addition, by manufacturing a display device including the thin film transistor, the image quality of the display device can be improved.

BRIEF DESCRIPTION OF THE DRAWINGS

FIG. 29A is a top view illustrating a display device according to the present invention and FIG. 29B is a cross-sectional view thereof.

DETAILED DESCRIPTION OF THE INVENTION

Figure 1A:
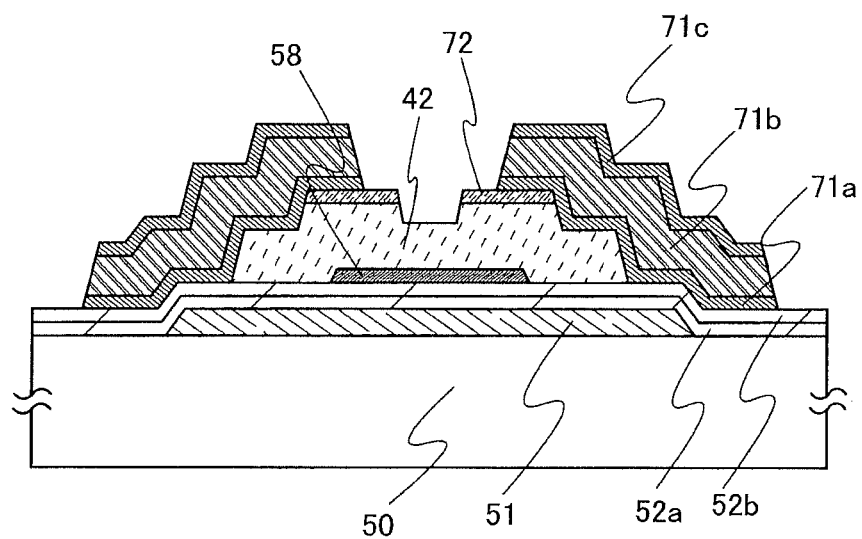
FIGS. 1A and 1B are cross-sectional views each illustrating a thin film transistor according to the present invention.

Embodiment modes of the present invention will be explained with reference to the drawings. Note that the present invention is not limited to the following description, and it is easily understood by those skilled in the art that modes and details thereof can be modified in various ways without departing from the purpose and the scope of the invention. Thus, the present invention is not interpreted while limiting to the following description of the embodiment modes. In the following structure, the reference numeral indicating the same part will be used in common throughout the drawings.

Embodiment Mode 1

In this embodiment mode, a structure of a thin film transistor will be described, which has higher field effect mobility, a higher ON current, and a lower off current compared with a conventional thin film transistor including a microcrystalline semiconductor film in a channel formation region, with reference to FIGS. 1A and 1B, FIG. 2, FIG. 3, FIG. 4, FIG. 5, FIG. 6, FIG. 7, FIGS. 8A to 8C, FIGS. 9A to 9F, and FIGS. 35A and 35B.

FIG. 1A illustrates a thin film transistor in which a gate electrode 51 is formed over a substrate 50, gate insulating films 52a and 52b are formed over the gate electrode 51, a semiconductor film 58 containing germanium at a concentration greater than or equal to 5 at. % and less than or equal to 100 at % or a conductive film 58 is formed over the gate insulating films 52a and 52b, a buffer layer 42 is formed over the semiconductor film 58 containing germanium at a concentration greater than or equal to 5 at. % and less than or equal to 100 at. % or the conductive film 58, a pair of source and drain regions 72 to which an impurity element functioning as a donor is added is formed over the buffer layer 42, and wirings 71a to 71c are formed over the pair of source and drain regions 72 to which an impurity element functioning as a donor is added.

Described below is an example of the semiconductor film 58 containing germanium at a concentration greater than or equal to 5 at. % and less than or equal to 100 at. % or the conductive film 58. As the semiconductor film 58 containing germanium at a concentration greater than or equal to 5 at. % and less than or equal to 100 at. %, an amorphous germanium film, an amorphous silicon germanium film, a microcrystalline germanium film, a microcrystalline silicon germanium film, a polycrystalline germanium film, a polycrystalline silicon germanium film, or the like is employed.

The microcrystalline germanium film or the microcrystalline silicon germanium film here is a film including a semiconductor having an intermediate structure between amorphous and crystalline structures (including single crystal and polycrystal). Such a film is a semiconductor which has a third state that is stable in terms of free energy, and is a crystalline semiconductor which has short-range order and lattice distortion, and column-like or needle-like crystals with a grain size, seen from the film surface, of 0.5 nm to 20 nm grown in the direction of a normal line with respect to the surface of the substrate. An amorphous semiconductor is present between a plurality of microcrystalline germanium or between a plurality of microcrystalline silicon germanium.

Further, as the conductive film, a metal film, a metal alloy film, a metal nitride film, a metal carbide film, a metal boride film, a metal silicide film, or the like is employed.

As the metal film, a film formed of aluminum, copper, titanium, neodymium, scandium, molybdenum, tantalum, tungsten, cobalt, nickel, silver, gold, platinum, tin, or iridium, or a metal alloy film formed of two or more of these elements can be used as appropriate. In addition, the metal film can be formed of a single layer or a stacked layer of the above-described metal films or metal alloy films.

As the metal nitride film, a titanium nitride film, a zirconium nitride film, a hafnium nitride film, a tantalum nitride film, a vanadium nitride film, a niobium nitride film, a chromium nitride film, a lanthanum nitride film, an yttrium nitride film, or the like can be used. In addition, the metal nitride film can be formed of a single layer or a stacked layer of the above-described metal nitride films.

As the metal carbide film, a titanium carbide film, a hafnium carbide film, a niobium carbide film, a tantalum carbide film, a vanadium carbide film, a zirconium carbide film, a chromium carbide film, a cobalt carbide film, molybdenum carbide film, a tungsten carbide film or the like can be used. In addition, the metal carbide film can be formed of a single layer or a stacked layer of the above-described metal carbide films.

As the metal boride film, a titanium boride film can be used.

As the metal silicide film, a platinum silicide film, a titanium silicide film, a molybdenum silicide film, a nickel silicide film, a chromium silicide film, a cobalt silicide film, a vanadium silicide film, a tungsten silicide film, a zirconium silicide film, a hafnium silicide film, a niobium silicide film, a tantalum silicide film, or the like can be used. In addition, the metal silicide film can be formed of a single layer or a stacked layer of the above-described metal silicide films.

Further, a stacked layer film formed of two or more of the metal film, the metal nitride film, the metal carbide film, the metal boride film, and the metal silicide film can be employed.

By providing the semiconductor film containing germanium at a concentration greater than or equal to 5 at. % and less than or equal to 100 at. % or the conductive film over the gate insulting film, resistance at the interface between the gate insulating film 52b and the semiconductor film containing germanium at a concentration greater than or equal to 5 at. % and less than or equal to 100 at. % or the conductive film can be reduced, whereby a thin film transistor with high field effect mobility and a high ON current can be manufactured.

The semiconductor film containing germanium at a concentration greater than or equal to 5 at. % and less than or equal to 100 at. % or the conductive film is preferably formed to have a thickness greater than or equal to 5 nm and less than or equal to 50 nm, preferably, greater than or equal to 5 nm and less than or equal to 20 nm.

A concentration of oxygen and a concentration of nitrogen in the semiconductor film containing germanium at a concentration greater than or equal to 5 at. % and less than or equal to 100 at. % are each preferably set to $3 \times 10^{19}$ atoms/cm$^3$ typically, more preferably, less than $3 \times 10^{18}$ atoms/cm$^3$. A concentration of carbon is preferably set to less than or equal to $3 \times 10^{18}$ atoms/cm$^3$. By decreasing a concentration of oxygen, nitrogen, or carbon to be mixed into the semiconductor film containing germanium at a concentration greater than or equal to 5 at. % and less than or equal to 100 at. %, when the semiconductor film containing germanium at a concentration greater than or equal to 5 at. % and less than or equal to 100 at. % is a microcrystalline semiconductor film, a generation of defects in the microcrystalline semiconductor film can be suppressed. Furthermore, oxygen or nitrogen in a microcrystalline semiconductor film hinders crystallization. Therefore, in the case where the semiconductor film containing germanium at a concentration greater than or equal to 5 at. % and less than or equal to 100 at. % is a microcrystalline semiconductor film, by relatively decreasing a concentration of oxygen or nitrogen in the microcrystalline semiconductor film, crystallinity of the microcrystalline semiconductor film can be increased.

Further, the semiconductor film containing germanium at a concentration greater than or equal to 5 at. % and less than or equal to 100 at. % in this embodiment mode is an n-type semiconductor. Therefore, by adding an impurity element functioning as an acceptor at the same time as or after film formation, a threshold voltage can be controlled. A typical example of the impurity element functioning as an acceptor is boron, and an impurity gas such as $B_2H_6$ or $BF_3$ is preferably mixed into silicon hydride at from 1 ppm to 1000 ppm, preferably from 1 ppm to 100 ppm. A concentration of boron is preferably set to $1 \times 10^{14}$ atoms/cm$^3$ to $6 \times 10^{16}$ atoms/cm$^3$.

It is preferable that the buffer layer 42 cover side and top surfaces of the semiconductor film containing germanium at a concentration greater than or equal to 5 at. % and less than or equal to 100 at. % or the conductive film 58. Furthermore, the gate insulating film 52b and the buffer layer 42 are preferably in contact with each other at the periphery of the semiconductor film 58 containing germanium at a concentration greater than or equal to 5 at. % and less than or equal to 100 at. % or the conductive film 58.

Figure 1B:
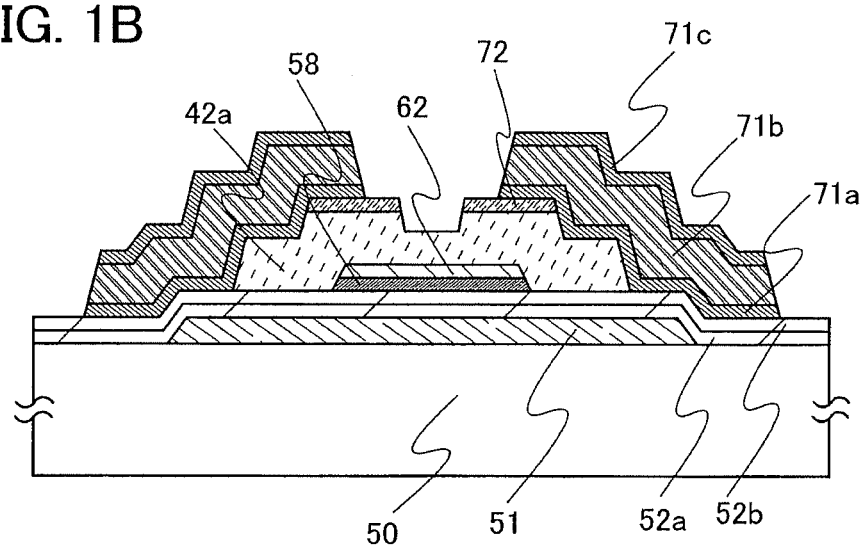

Further, as illustrated in FIG. 1B, a first buffer layer 62 covering the top surface of the semiconductor film 58 containing germanium at a concentration greater than or equal to 5 at. % and less than or equal to 100 at. % or the conductive film 58 and a second buffer layer 42a covering the a top surface of the first buffer layer 62 and the side surface of the semiconductor film 58 containing germanium at a concentration greater than or equal to 5 at. % and less than or equal to 100 at. % or the conductive film 58 may be formed instead of the buffer layer 42 illustrated in FIG. 1A.

As the buffer layer 42, the first buffer layer 62, and the second buffer layer 42a, an amorphous semiconductor film is used. Alternatively, an amorphous semiconductor film containing fluorine or chlorine is used. Each thickness of the buffer layer 42 and the second buffer layer 42a is set to be 50 nm to 200 nm. Examples of the amorphous semiconductor film are an amorphous silicon film, an amorphous silicon film including germanium, and the like.

Since the buffer layer 42 or the second buffer layer 42a is provided between the semiconductor film 58 containing germanium at a concentration greater than or equal to 5 at. % and less than or equal to 100 at. % or the conductive film 58 and the wirings 71a to 71c, the semiconductor film 58 containing germanium at a concentration greater than or equal to 5 at. % and less than or equal to 100 at. % or the conductive film 58 and the wirings 71a to 71c are not in contact with each other. In addition, since the buffer layer 42 and the second buffer layer 42a are each formed of an amorphous semiconductor film, each energy gap of the buffer layer 42 and the second buffer layer 42a is larger than that of the semiconductor film containing germanium at a concentration greater than or equal to 5 at. % and less than or equal to 100 at. %, resistivity thereof is higher, and the carrier mobility thereof is lower than that of the semiconductor film 58 containing germanium at a concentration greater than or equal to 5 at. % and less than or equal to 100 at. % or the conductive film 58. Therefore, in the thin film transistor to be formed later, the buffer layer 42 or the second buffer layer 42*a* function as a high-resistance region, and can reduce leakage current generated between the source drain regions 72 and a microcrystalline semiconductor film 58. Further, off current can be reduced.

As for the semiconductor film 58 containing germanium at a concentration greater than or equal to 5 at. % and less than or equal to 100 at. % or the conductive layer 58, when the semiconductor film containing germanium at a concentration greater than or equal to 5 at. % and less than or equal to 100 at. % is formed of a microcrystalline semiconductor film, an amorphous semiconductor film, or an amorphous film containing hydrogen, nitrogen, or halogen is formed on the surface of the semiconductor film containing germanium at a concentration greater than or equal to 5 at. % and less than or equal to 100 at. % as the buffer layer 42 or the second buffer layer 42*a*, whereby spontaneous oxidation of a surface of crystal grains contained in the semiconductor film containing germanium at a concentration greater than or equal to 5 at. % and less than or equal to 100 at. % can be prevented. In particular, in a region of the microcrystalline semiconductor film where an amorphous semiconductor is in contact with microcrystal grains, a crack is likely to be caused due to local stress. If a crack is exposed to oxygen, the crystal grains are oxidized to form silicon oxide. However, the buffer layer 42 or the first buffer layer 62 is formed over the surface of the semiconductor film 58 containing germanium at a concentration greater than or equal to 5 at % and less than or equal to 100 at. % or the conductive film 58, whereby oxidation of the microcrystal grains can be prevented. Therefore, a defect of capture of carriers can be reduced or a region in which carriers are prevented from moving can be reduced.

As the substrate 50, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, a metal substrate of a stainless steel alloy and the like with the surface provided with an insulating film may be employed. When the substrate 50 is a mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

The gate electrode 51 is formed using a metal material. As a metal material, aluminum, chromium, titanium, tantalum, molybdenum, copper, or the like is applied. The gate electrode 51 is preferably formed using aluminum or a stacked layer structure of aluminum and a barrier metal. As a barrier metal, a refractory metal such as titanium, molybdenum, or chromium is applied. A barrier metal is preferably provided for preventing hillocks and oxidation of aluminum.

The gate electrode 51 is formed to have a thickness greater than or equal to 50 nm and less than or equal to 300 nm. By setting the thickness of gate electrode 51 to be greater than or equal to 50 nm and less than or equal to 100 nm, a disconnection of a semiconductor film, an insulating film, or a wiring, which is formed later can be prevented. The gate electrode 51 is formed to have a thickness greater than or equal to 150 nm and less than or equal to 300 nm, which leads to reduction in resistance of the gate electrode 51 and increase in area of a display device using the gate electrode.

Since the semiconductor film and the wiring are formed over the gate electrode 51, the gate electrode 51 is preferably processed to have a tapered end portion so that breaking of the semiconductor film and the wiring thereover due to level differences is prevented. Further, although not illustrated, a wiring or a capacitor wiring which is connected to the gate electrode can also be formed at the same time.

The gate insulating films 52*a* and 52*b* can each be formed using a silicon oxide film, a silicon nitride film, a silicon oxynitride film, or a silicon nitride oxide film with a thickness of 50 nm to 150 nm. Here, an mode is described in which a silicon nitride film or a silicon nitride oxide film is formed as the gate insulating film 52*a*, and a silicon oxide film or a silicon oxynitride film is formed as the gate insulating film 52*b* to form a stacked-layer structure. Note that instead of a two-layer structure, the gate insulating film can be formed of a single layer of a silicon oxide film, a silicon nitride film, a silicon oxynitride film, or a silicon nitride oxide film.

By forming the gate insulating layer 52*a* with use of a silicon nitride film or a silicon nitride oxide film, adhesion between the substrate 50 and the gate insulating film 52*a* is increased. When a glass substrate is used for the substrate 50, impurities from the substrate 50 can be prevented from diffusing into the semiconductor film 58 containing germanium at a concentration greater than or equal to 5 at. % and less than or equal to 100 at. % or the conductive film 58, the buffer layer 42, and the second buffer layer 42*a*, and furthermore, oxidation of the gate electrode 51 can be prevented. That is to say, film peeling can be prevented, and electric characteristics of a thin film transistor which is completed later can be improved. Further, the gate insulating films 52*a* and 52*b* with a thickness of greater than or equal to 50 nm are preferable because the gate insulating films 52*a* and 52*b* with the above thickness can alleviate reduction in coverage caused by unevenness due to the gate electrode 51.

Here, a silicon oxynitride film refers to a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations from 55 to 65 at. %, 1 to 20 at. %, 25 to 35 at. %, and 0.1 to 10 at. %, respectively. Further, a silicon nitride oxide film refers to a film contains more nitrogen than oxygen and, in the case where measurements are performed using RBS and HFS, includes oxygen, nitrogen, silicon, and hydrogen at concentrations from 15 to 30 at. %, 20 to 35 at. %, 25 to 35 at. %, and 15 to 25 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

When an n-channel thin film transistor is formed, phosphorus may be added as a typical impurity element to the pair of source and drain regions 72 formed of an impurity semiconductor film to which an impurity element imparting one conductivity type is added, and an impurity gas such as $PH_3$ may be added to silicon hydride. When a p-channel thin film transistor is formed, boron may be added as a typical impurity element, and an impurity gas such as $B_2H_6$ may be added to silicon hydride. By setting a concentration of phosphorus or boron to $1 \times 10^{19}$ to $1 \times 10^{21}$ atoms/cm$^3$, the impurity semiconductor film to which an impurity imparting one conductivity type is added can have an ohmic contact with the wirings 71*a* to 71c, and functions as the source and drain regions. The pair of source and drain regions 72 can be formed of a microcrystalline semiconductor film or an amorphous semiconductor film. The pair of source and drain regions 72 are formed with a thickness greater than or equal to 2 nm and less than or equal to 50 nm. When the pair of source and drain regions 72 are thinned, throughput can be increased.

The wirings 71a to 71c are preferably formed of a single layer or stacked layer of aluminum; copper; or an aluminum alloy to which an element for preventing migration or hillocks or an element for improving heat resistance property, such as silicon, titanium, neodymium, scandium, or molybdenum, is added. Alternatively the wirings may have a stacked layer structure in which a film on a side in contact with the impurity semiconductor film to which an impurity element imparting one conductivity type is added is formed of titanium, tantalum, molybdenum, tungsten, or a nitride of any of these elements, and an aluminum film or an aluminum alloy film is formed thereover. Further alternatively, top and bottom surfaces of aluminum or an aluminum alloy may be each covered with titanium, tantalum, molybdenum, tungsten, or nitride thereof to form a stacked layer structure. Here, the conductive film having a three-layer structure of the conductive films 71a to 71c is indicated as the conductive film, and a stacked layer structure in which molybdenum films are used as the wirings 71a and 71c and an aluminum film is used as the wiring 71b, or a stacked layer structure in which titanium films are used as the wirings 71a and 71c and an aluminum film is used as the wiring 71b is employed.

Figure 2:
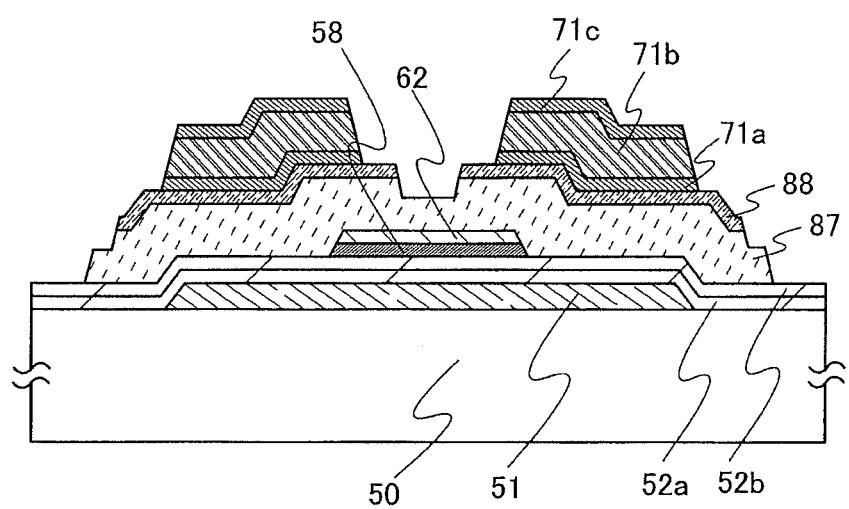
FIG. 2 is a cross-sectional view illustrating a thin film transistor according to the present invention.

Although the thin film transistor illustrated in FIG. 1A has a structure in which a side surface of the buffer layer 42 is in contact with the wiring 71a to 71c, the thin film transistor may have a structure as illustrated in FIG. 2, in which a buffer layer 87 is not in contact with the wirings 71a to 71c and the wirings 71a to 71c are formed over the buffer layer 87 with a pair of source and drain regions 88 interposed therebetween. Such a transistor can be formed with a photolithography process using a multi-tone mask. The details thereof will be described in Embodiment Mode 4.

By employing the structure illustrated in FIG. 2, the semiconductor film containing germanium at a concentration greater than or equal to 5 at. % and less than or equal to 100 at. % or the conductive film 58 is not in contact with the pair of source or drain regions 88 formed of an impurity semiconductor film to which an impurity element imparting one conductivity type is added and the wirings 71a to 71c, whereby leakage current and off current of the thin film transistor can be reduced.

A thin film transistor having a structure different from that in FIGS. 1A and 1B and FIG. 2 will be described with reference to FIG. 3.

Figure 3:
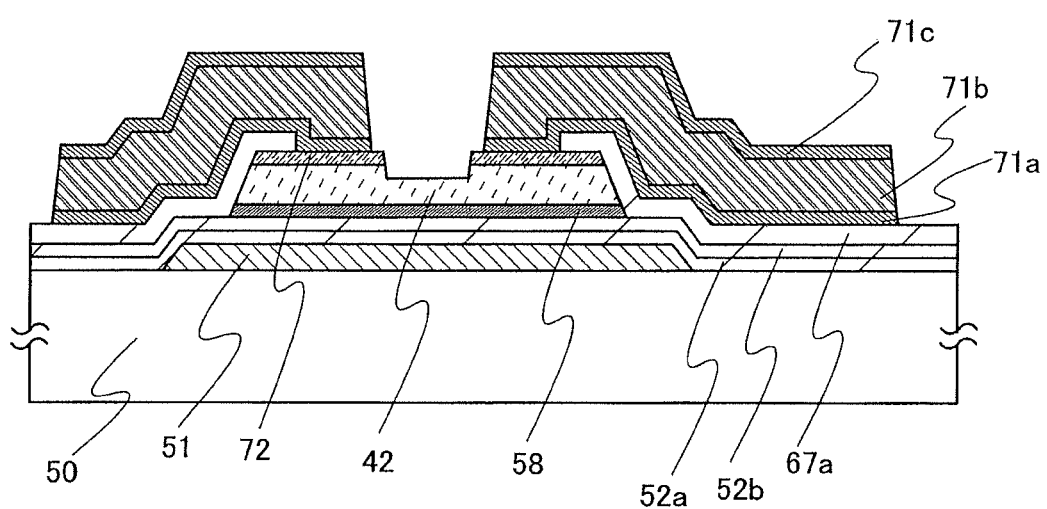
FIG. 3 is a cross-sectional view illustrating a thin film transistor according to the present invention.

In a thin film transistor illustrated in FIG. 3, the gate electrode 51 is formed over the substrate 50, the gate insulating films 52a and 52b are formed over the gate electrode 51, the semiconductor film containing germanium at a concentration greater than or equal to 5 at. % and less than or equal to 100 at. % or the conductive film 58 is formed over the gate insulating films 52a and 52b, the buffer layer 42 is formed over the semiconductor film 58 containing germanium at a concentration greater than or equal to 5 at. % and less than or equal to 100 at. % or the conductive film 58, and the pair of source and drain regions 72 to which an impurity element functioning as a donor is added are formed over the buffer layer 42. Side surfaces of the semiconductor film 58 containing germanium at a concentration greater than or equal to 5 at. % and less than or equal to 100 at. % or the conductive film 58, the buffer layer 42, and the pair of source and drain regions 72 are covered with an insulating film 67a and pairs of the wirings 71a to 71c are formed over the pair of source and drain regions 72 and the insulating film 67a.

As the insulating film 67a, a film similar to the gate insulating films 52a and 52b can be used. Alternatively, an organic resin can be used. Since the insulating film 67a covers at least the side surface of the semiconductor film 58 containing germanium at a concentration greater than or equal to 5 at. % and less than or equal to 100 at. % or the conductive film 58, the semiconductor film 58 containing germanium at a concentration greater than or equal to 5 at. % and less than or equal to 100 at. % or the conductive film 58 and the wirings 71a to 71c are not in contact with each other, whereby leakage current and off current can be reduced. The buffer layer 42 is formed between the semiconductor film 58 containing germanium at a concentration greater than or equal to 5 at. % and less than or equal to 100 at. % or the conductive film 58 and the source and drain regions 72. The energy gap of the buffer layer 42 is larger than that of the semiconductor film 58 containing germanium at a concentration greater than or equal to 5 at. % and less than or equal to 100 at. % or the conductive film 58, and resistivity thereof is high, and mobility thereof is as low as one-fifth to one-tenth of that of the semiconductor film 58 containing germanium at a concentration greater than or equal to 5 at. % and less than or equal to 100 at. % or the conductive film 58. For this reason, in the transistor to be formed later, the buffer layer 42 functions as a high-resistance region, whereby leakage current generated between the source and drain regions 72 and the semiconductor film 58 containing germanium at a concentration greater than or equal to 5 at. % and less than or equal to 100 at. % or the conductive film 58 can be reduced. Further, off current can be reduced.

Figure 4:
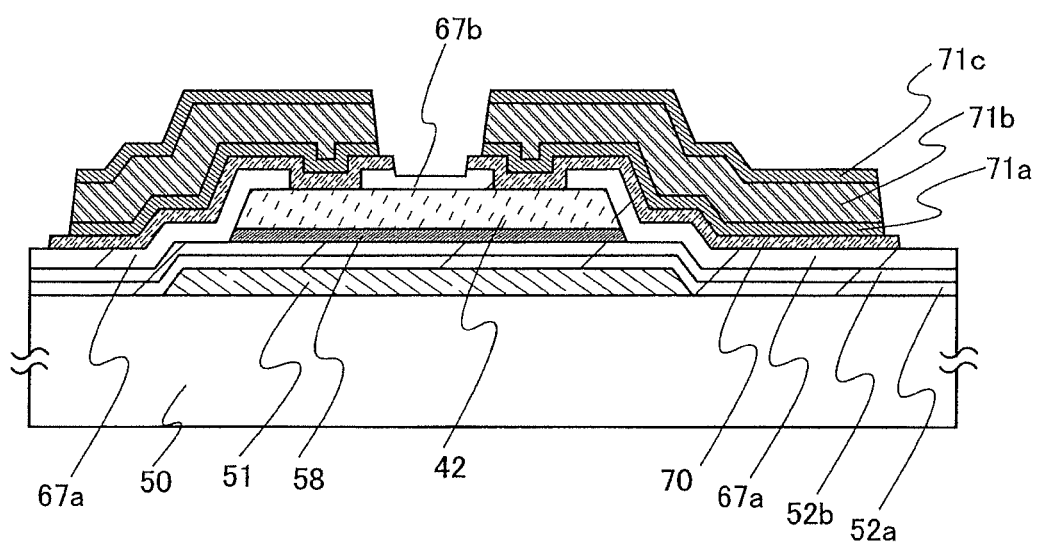
FIG. 4 is a cross-sectional view illustrating a thin film transistor according to the present invention.
Figure 35A:
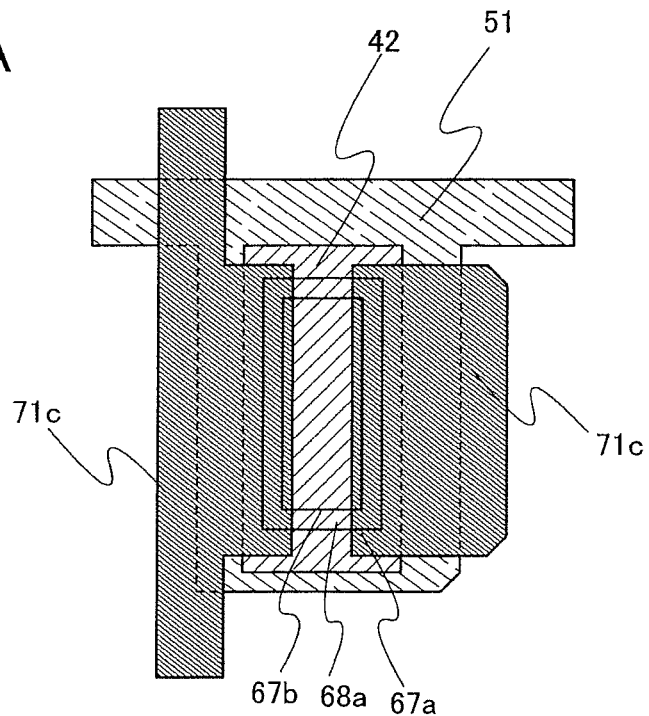
FIGS. 35A and 35B are top views each illustrating a thin film transistor according to the present invention.
Figure 35B:
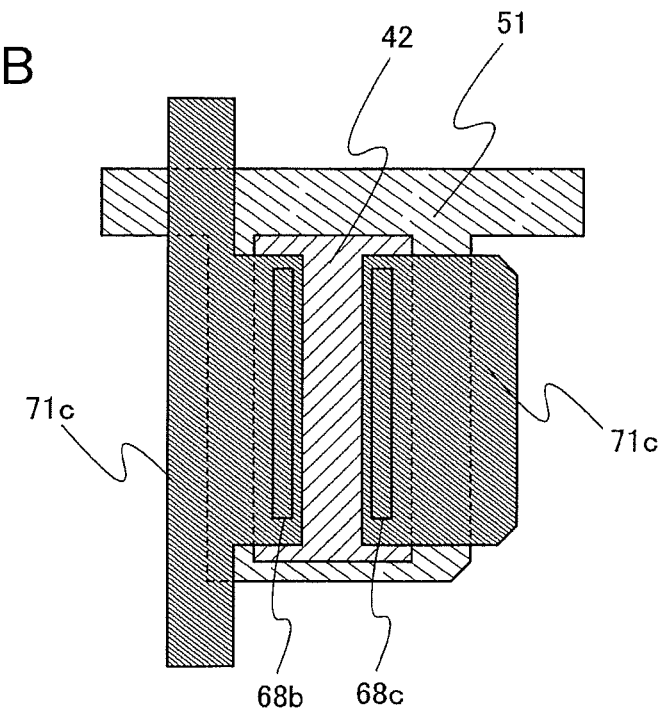

Further, although the thin film transistor illustrated in FIG. 3 has a structure in which the pair of source and drain regions 72 are formed over the buffer layer 42 and the insulating film 67a covers part of the pair of source and drain regions 72 and the side surface of the pair of source and drain regions 72, structures illustrated in FIG. 4 and FIGS. 35A and 35B can be employed. The insulating film 67a covers the side surfaces of the semiconductor film 58 containing germanium at a concentration greater than or equal to 5 at. % and less than or equal to 100 at. % or the conductive film 58 and the buffer layer 42 and one contact hole 68a is formed over the buffer layer 42 to surround an insulating film 67b (see FIG. 35A). In this case, the insulating 67a and the insulating film 67b are separated. Alternatively, a pair of contact holes 68b and 68c may be formed (see FIG. 35B). In this case, the insulating film 67a and the insulating film 67b are connected. Further a pair of source and drain regions 70 are formed over the insulating film 67a and connected to the buffer layer 42 via the contact holes 68b and 68c. In addition, the pairs of wirings 71a to 71c are formed over the pair of source and drain regions 70.

As illustrated in FIG. 4, by forming a contact hole around the insulating film 67b, the insulating film 67b surrounded by the contact hole functions as a channel protection film; therefore, the buffer layer is not overetched during separation of the source and drain regions 70 and damage to the buffer layer due to etching can be reduced. Further, in the case where a pair of contact holes are formed, the insulating film 67a and the insulating film 67b are connected to each other, and a region in the insulating film 67b functions as a channel protection film; therefore, the buffer layer is not overetched during separation of the source and drain regions 70 and damage to the buffer layer due to etching can be reduced. A manufacturing method of such thin film transistors will be described in Embodiment Mode 6.

By employing the structure illustrated in FIG. 4, the semiconductor film 58 containing germanium at a concentration greater than or equal to 5 at. % and less than or equal to 100 at. % or the conductive film 58 is not in contact directly with the pair of source and drain regions 70 and the wirings 71a to 71c, whereby leakage current and off current of the thin film transistor can be reduced.

Figure 5:
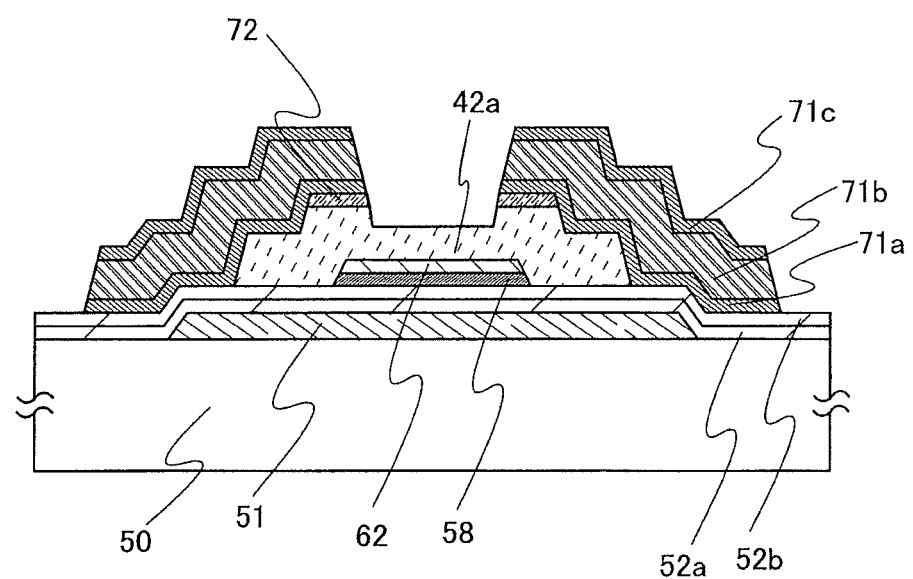
FIG. 5 is a cross-sectional view illustrating a thin film transistor according to the present invention.

Note that while a mode in which end portions of the wirings 71a to 71c and end portions of the pair of source and drain regions 70 are not aligned is described here, a structure may alternatively be employed in which the end portions of the wirings 71a to 71c and the end portions of the pair of source and drain regions 72 are aligned as illustrated in FIG. 5.

Next, a thin film transistor in which a gate insulating film has a different structure from the gate insulating film of the above thin film transistors is described with reference to FIG. 6.

Figure 6:
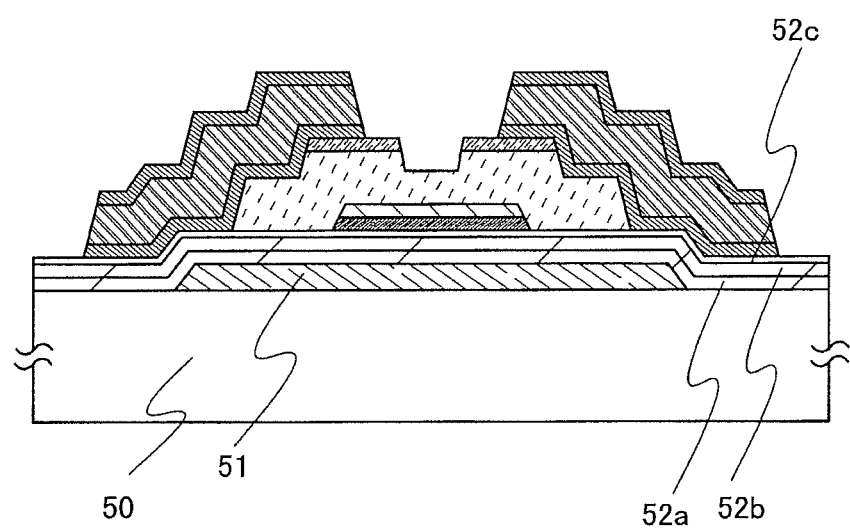
FIG. 6 is a cross-sectional view illustrating a thin film transistor according to the present invention.

Instead of the gate insulating films 52a and 52b of the thin film transistors illustrated in FIGS. 1A and 1B, FIG. 2, FIG. 3, FIG. 4, and FIG. 5, three gate insulating films 52a, 52b, and 52c may be formed as illustrated in FIG. 6. As the gate insulating film 52c, which is a third layer, a silicon nitride film or a silicon nitride oxide film with a thickness of about 1 nm to 5 nm can be formed.

As a method for forming a silicon nitride film or a silicon nitride oxide film with a thickness of about 1 nm to 5 nm as the third gate insulating layer, a plasma CVD method can be employed. Further, it is also possible to have the gate insulating film 52b undergo nitridation treatment with high-density plasma to form a silicon nitride film on the surface of the gate insulating film 52b. By nitridation treatment using high-density plasma, a silicon nitride film that contains nitrogen at a higher concentration can be obtained. High-density plasma is produced by using a microwave with a high frequency, for example, 1 GHz or 2.45 GHz. With high-density plasma, which has the characteristic of having a low electron temperature, a layer can be formed with less plasma damage and few defects compared to a layer formed by a conventional plasma treatment because the kinetic energy of active species is low. In addition, carrier mobility can be increased because surface roughness of the gate insulating film 52c can be reduced.

Further, instead of the semiconductor film 58 containing germanium at a concentration greater than or equal to 5 at. % and less than or equal to 100 at. % or the conductive film 58 in the thin film transistor illustrated in FIGS. 1A and 1B, FIG. 2, FIG. 3, FIG. 4, FIG. 5, and FIG. 6, conductive particles 60 are dispersed over the gate insulating film 52b and a semiconductor film 61 containing germanium as its main component can be formed over the conductive particles 60 and the gate insulating film 52b.

Next, the operation mechanism of the thin film transistor in which the semiconductor film containing germanium at a concentration greater than or equal to 5 at. % and less than or equal to 100 at. % or the conductive film and the buffer layer are stacked over the gate insulating film as illustrated in FIGS. 1A and 1B, FIG. 2, FIG. 3, FIG. 4, FIG. 5, FIG. 6, and FIG. 7 is described below. In the following description, as a typical example of the semiconductor film containing germanium at a concentration greater than or equal to 5 at. % and less than or equal to 100 at. % or the conductive film, a microcrystalline germanium film is used, and an amorphous silicon film is used for the buffer layer.

Figure 8A:
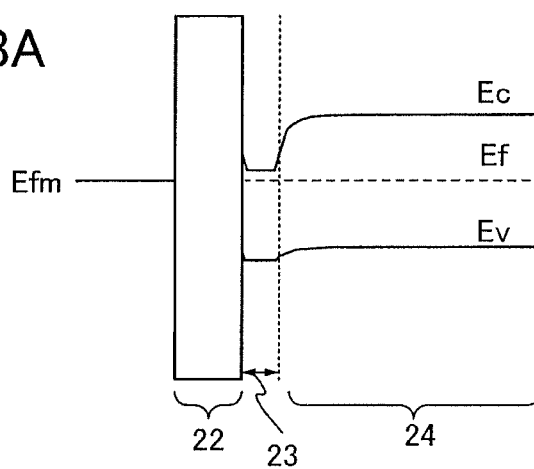
FIGS. 8A to 8C are energy band diagrams of a thin film transistor according to the present invention.
Figure 8B:
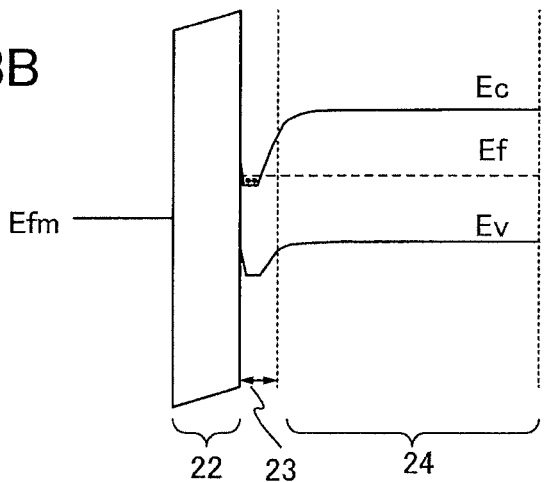
Figure 8C:
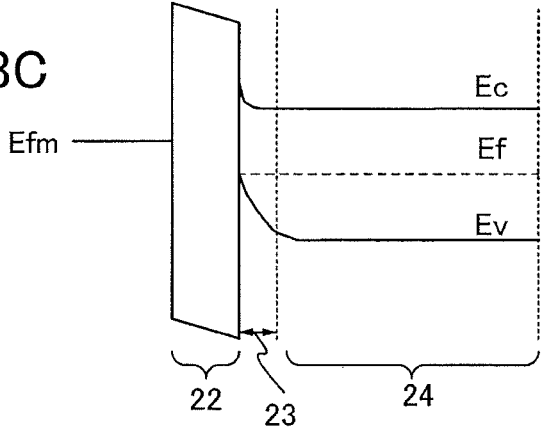
Figure 9A:
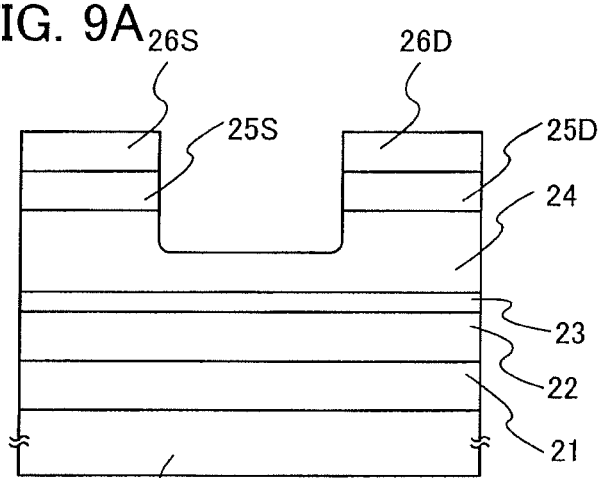
FIGS. 9A, 9C, and 9E are cross-sectional views illustrating a thin film transistor according to the present invention
Figure 9B:
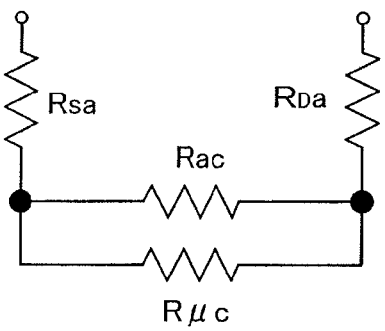
FIGS. 9B, 9D, and 9F are equivalent circuit diagrams thereof.
Figure 9C:
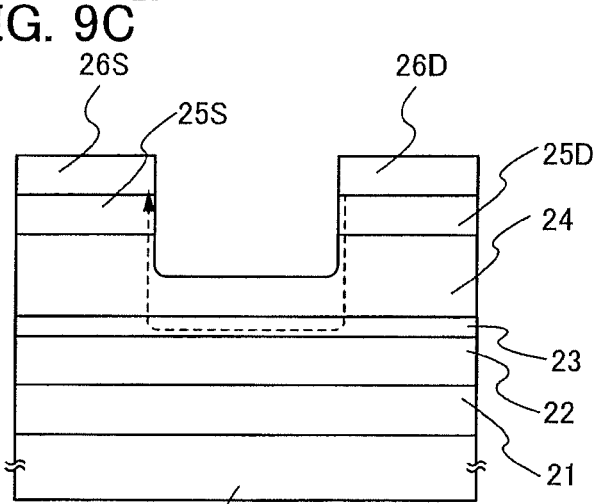
Figure 9D:
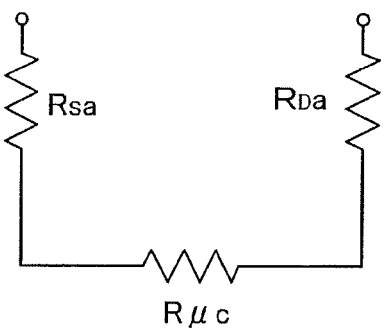
Figure 9E:
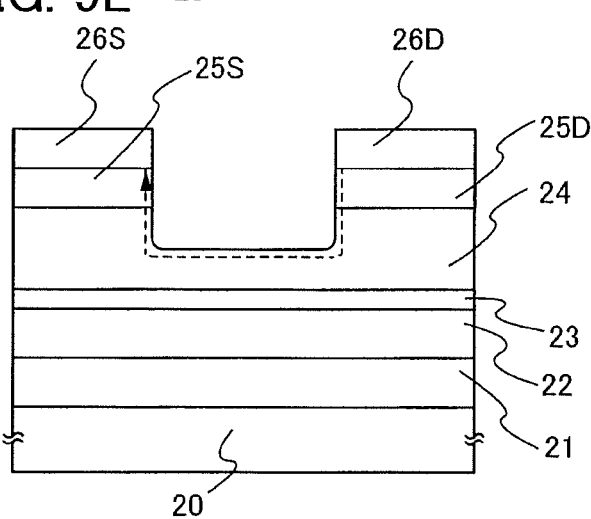
Figure 9F:
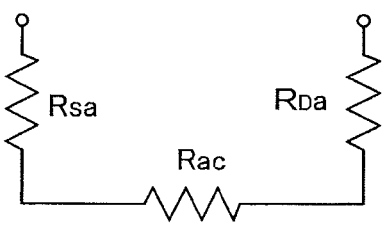

FIGS. 8A to 8C are energy band diagrams of the thin film transistor of the present invention, FIGS. 9A, 9C, and 9E are cross-sectional views of the thin film transistor, and FIGS. 9B, 9D, and 9F are equivalent circuit diagrams.

FIG. 9A illustrates a thin film transistor in which a substrate 20, a gate electrode 21, a gate insulating film 22, a microcrystalline germanium film 23 as an example of a semiconductor film containing germanium at a concentration greater than or equal to 5 at. % and less than or equal to 100 at. % or a conductive film, an amorphous silicon film 24 as a buffer layer, a source region 25S, a drain region 25D, a source electrode 26S, and drain electrode 26D are stacked.

FIG. 9B illustrates an equivalent circuit of the thin film transistor in FIG. 9A. Here, resistance $R_{Sa}$ mainly represents a resistance value of the source region 25S and the amorphous silicon film 24; resistance $R_{Da}$ mainly represents a resistance value of the drain region 25D and the amorphous silicon film 24; resistance $R_{ac}$ mainly represents a resistance value of the amorphous silicon film 24; and resistance $R_{\mu c}$ mainly represents a resistance value of the microcrystalline germanium film 23.

FIG. 8A is a band diagram of the thin film transistor in FIG. 9A in a state in which voltage is not applied to the gate electrode 21 and shows a case where a Fermi level Ef of the amorphous silicon film 24 and a Fermi level Efm of the gate electrode are equal to each other.

The microcrystalline germanium film 23 of this embodiment mode is an n-type semiconductor, and the Fermi energy Ef is close to a conduction band energy Ec in the microcrystalline germanium film 23. In addition, the microcrystalline germanium film 23 is an n-type film, and the amorphous silicon film 24 is an i-type film. Further, when the band gap (an energy difference between the bottom Ec of the conduction band and the top Ev of the valence band) of the microcrystalline germanium film 23 is 1.0 eV, for example, and the band gap of the amorphous silicon film is 1.7 eV, for example, an n-i junction is formed at the interface between the microcrystalline germanium film 23 and the amorphous silicon film 24. Thus, the energy band near the interface between the microcrystalline germanium film 23 and the amorphous silicon film 24 curves, and the bottom Ec of the conduction band of the microcrystalline germanium film 23 is below the bottom Ec of the conduction band of the amorphous silicon film 24.

Then, the gate electrode 21 is supplied with positive voltage, the source electrode 26S is grounded to have ground potential, and the drain electrode 26D is supplied with positive voltage. The path through which current flows between the drain electrode 26D and the source electrode 26S at this time is illustrated in FIG. 9C. As denoted by a dotted line in FIG. 9C, drain current flows through the drain electrode 26D, the drain region 25D, the amorphous silicon film 24, a part close to the interface with the gate insulating film 22 of the microcrystalline germanium film 23, the amorphous silicon film 24, the source region 25S, and the source electrode 26S. In other words, a carrier path between the drain electrode 26D and the source electrode 26S is formed through the source electrode 26S, the source region 25S, the amorphous silicon film 24, a part close to the interface with the gate insulating film 22 of the microcrystalline germanium film 23, the amorphous silicon film 24, the drain region 25D, and the drain electrode 26D.

FIG. 9D illustrates an equivalent circuit of the thin film transistor illustrated in FIG. 9C. Here, forward bias is applied at the interface between the source region 25S and the amorphous silicon film 24, so that the resistance $R_{Sa}$ represents a resistance value of the source region 25S and the amorphous silicon film 24 connected in forward direction, and the resistance $R_{Sa}$ is low. In addition, at the interface between the drain region 25D and the amorphous silicon film 24, reverse bias is applied and a depletion layer is formed, so that the resistance $R_{Da}$ is high. The resistance $R_{\mu c}$ represents a resistance value of the microcrystalline germanium film 23, which is inverted. Here, the inverted microcrystalline germanium film 23 refers to a microcrystalline germanium film in which conduction electrons are induced to the interface with the gate insulating film by applying potential to the gate electrode. The resistance $R_{Sa}$ is considered much lower than the resistance $R_{Da}$ and the resistance $R_{\mu c}$.

FIG. 8B is a band diagram of the thin film transistor illustrated in FIG. 9C in a state in which positive voltage, typically, positive voltage which is high enough to form an inversion layer, is applied to the gate electrode 21. By application of positive voltage to the gate electrode 21, an energy band in the microcrystalline germanium film 23 curves, and a region where the bottom Ec of the conduction band is lower than the Fermi level Ef, that is, an inversion layer is formed, and electrons are induced to a region of the microcrystalline germanium film 23 which is close to the interface with the gate insulating film 22 so as to enhance the density of conduction electrons. A positive voltage at which the inversion layer begins to be formed substantially equals to the threshold voltage Vth.

In an actual device structure, the resistance $R_{Da}$ is typically formed by the amorphous silicon film with a thickness of about 0.1 μm to 0.3 μm. On the other hand, the resistance $R_{\mu c}$ is typically formed by the microcrystalline germanium film with a length of about 3 μm to 6 μm. Therefore, the traveling distance of carriers in the channel is 10 to 30 times as long as that in the amorphous silicon film. By making the resistance $R_{\mu c}$ of the microcrystalline germanium film much smaller than the resistance $R_{ac}$ of the amorphous silicon film, ON current and field effect mobility of the thin film transistor can be increased. Therefore, by forming the microcrystalline germanium film over the gate insulating film, electric conductivity of the film formed over the gate insulating film can be improved.

On the other hand, the gate electrode 21 is supplied with negative voltage, the source electrode 26S is grounded to have ground potential, and the drain electrode 26D is supplied with positive voltage. A drain-current and carrier path at this time is illustrated in FIG. 9E. The path through which drain current flows between the drain electrode 26D and the source electrode 26S at this time is illustrated. As denoted by a dotted line in FIG. 9E, drain current flows through the drain electrode 26D, the drain region 25D, the vicinity of the surface of the amorphous silicon film 24, the source region 25S, and the source electrode 26S. In other words, a carrier path between the drain electrode 26D and the source electrode 26S is formed through the source electrode 26S, the source region 25S, the vicinity of the surface of the amorphous silicon film 24, the drain region 25D, and the drain electrode 26D.

FIG. 9F illustrates an equivalent circuit of the thin film transistor illustrated in FIG. 9E. Here, forward bias is applied at the interface between the source region 25S and the amorphous silicon film 24, so that the resistance $R_{Sa}$ represents a resistance value of the source region 25S and the amorphous silicon film 24 connected in forward direction, and the resistance $R_{Sa}$ is low. In addition, at the interface between the drain region 25D and the amorphous silicon film 24, reverse bias is applied and a depletion layer is formed, so that the resistance $R_{Da}$ is high. The resistance $R_{ac}$ represents a resistance value of the amorphous silicon film. It is considered that the resistance $R_{Sa}$ is much lower than the resistance $R_{Da}$ and the resistance $R_{ac}$.

FIG. 8C is a band diagram of the thin film transistor illustrated in FIG. 9E in a state in which negative voltage is applied to the gate electrode 21. By applying negative voltage to the gate electrode 21, electrons are forced away from the interface between the gate insulating film 22 and the microcrystalline germanium film 23. As a result, the electron density is depleted, and a depletion layer is formed. In this condition, conduction electrons are removed from the conduction band, and at the interface between the microcrystalline germanium film 23 and the gate insulating film 22, the bottom Ec of the conduction band of the microcrystalline germanium film 23 is higher than the Fermi level Ef. In addition, the surface of the microcrystalline germanium film 23 has higher resistance than the amorphous silicon film 24. Accordingly, when negative voltage is applied to the gate electrode 21, electrons pass through the amorphous silicon film 24, so that current flows. In the vicinity of the interface between the amorphous silicon film 24 and the drain region, reverse bias is applied, and a depletion layer is formed, so that the resistance $R_{Da}$ is increased. However, when the amorphous silicon film 24 has defects, impurity elements, or recombination centers, the defects, the impurity elements, or the recombination centers function as a leakage path, whereby a depletion layer does not spread and off current flows. Therefore, the amorphous silicon film 24 is formed of a film which forms perfect bonding at the interface with the drain region and has less impurity elements, less defects, and less recombination centers. That is, by forming the amorphous silicon film 24 whose photoelectric current is high and whose dark current is low, leakage current of the thin film transistor can be reduced.

Note that the microcrystalline germanium film is used for the semiconductor film containing germanium at a concentration greater than or equal to 5 at. % and less than or equal to 100 at. % or the conductive film. Alternatively, when a conductive film is used, the energy band curves at the interface between the conductive film and the buffer layer so as to be aligned with the Fermi level. Therefore, thin film transistor characteristics which are similar to characteristics of the above-described thin film transistors can be obtained.

As described in this embodiment mode, when positive voltage is applied to the gate electrode, the semiconductor film containing germanium at a concentration greater than or equal to 5 at. % and less than or equal to 100 at. % is used as a travel region for carriers; while when negative voltage is applied to the gate electrode, the amorphous semiconductor film with low conductivity is used as a travel region for carriers. Thus, a thin film transistor with a high ON/OFF ratio can be obtained. That is, a thin film transistor which has high ON current and high field effect mobility and which can suppress off current can be manufactured.

By providing a film with low resistivity over a gate insulating film, a semiconductor film containing germanium at a concentration greater than or equal to 5 at. % and less than or equal to 100 at. % or a conductive film here, ON current and field effect mobility of the thin film transistor can be improved. Further, by providing an amorphous semiconductor film or an insulating film to cover side surfaces of the semiconductor film containing germanium at a concentration greater than or equal to 5 at. % and less than or equal to 100 at. % or the conductive film, off current of the thin film transistor can be reduced. That is, a higher-performance thin film transistor can be formed. Accordingly, a driving frequency of a display device can be increased, whereby a panel size can be increased and high density of pixels can be well achieved. In addition, since the thin film transistor of this embodiment mode is an inverted staggered thin film transistor, thin film transistors can be manufactured over a large substrate with fewer steps.

Embodiment Mode 2

In this embodiment mode, another structure of the thin film transistor illustrated in Embodiment Mode 1 is described with reference to FIG. 1A and FIGS. 34A and 34B. Although FIG. 1A is referred to here, this embodiment mode can be applied to as appropriate to the thin film transistors illustrated in other drawings in Embodiment Mode 1.

In FIG. 1A, the end portion of the pair of source and drain regions 72 functioning as source and drain regions overlaps with the end portion of the semiconductor film 58 containing germanium at a concentration greater than or equal to 5 at. % and less than or equal to 100 at. % or the conductive film 58.

Figure 34A:
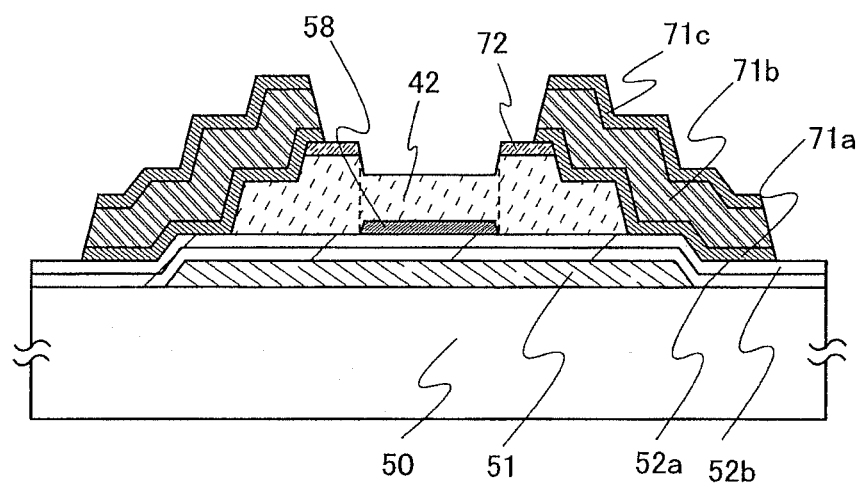
FIGS. 34A and 34B are cross-sectional views each illustrating a thin film transistor according to the present invention.

Further, in addition to the structure, as for the thin film transistor illustrated in FIG. 34A, when the end portion of the pair of source and drain regions 72 functioning as source and drain regions and the end portion of the semiconductor film 58 containing germanium at a concentration greater than or equal to 5 at. % and less than or equal to 100 at. % or the conductive film 58 substantially align. In a thin film transistor in which the pair of source and drain regions 72 functioning as source and drain regions and the semiconductor film 58 containing germanium at a concentration greater than or equal to 5 at. % and less than or equal to 100 at. % or the conductive film 58 overlap as illustrated in FIG. 1A, or end portions thereof are substantially aligned as indicated by a dotted line in FIG. 34A, a traveling distance of carriers is shortened and thus ON current can be improved.

Figure 34B:
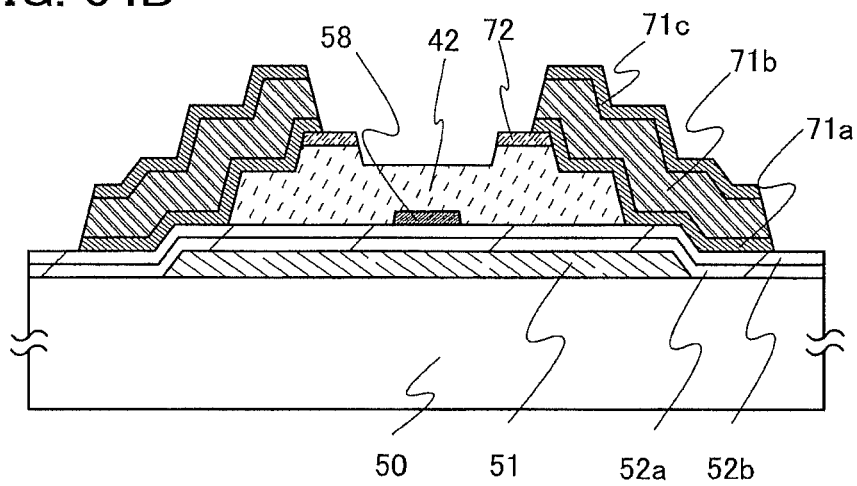

Alternatively, a so-called off-set structure illustrated in FIG. 34B in which the end portion of the pair of source and drain regions 72 functioning as source and drain regions does not overlap with the end portion of the semiconductor film 58 containing germanium at a concentration greater than or equal to 5 at. % and less than or equal to 100 at. % or the conductive film 58 can be employed. With such a structure, the pair of source and drain regions functioning as source and drain regions and the semiconductor film 58 containing germanium at a concentration greater than or equal to 5 at. % and less than or equal to 100 at. % or the conductive film 58 are spaced; accordingly, an electric field in the buffer layer 42 is relieved and off current can be reduced.

Embodiment Mode 3

In this embodiment mode, a process for manufacturing a thin film transistor having high field effect mobility, high ON current, and low off current is described. Here, as a typical example, a method for manufacturing the thin film transistor of FIG. 1B in Embodiment Mode 1 is described.

An n-channel thin film transistor having an amorphous semiconductor film or a microcrystalline semiconductor film has higher field effect mobility than a p-channel thin film transistor having an amorphous semiconductor film or a microcrystalline semiconductor film and thus the n-channel thin film transistor is more suitable for being used in a driver circuit. It is preferable that all thin film transistors formed over one substrate have the same polarity in order to reduce the number of manufacturing steps. Further, when a semiconductor film containing germanium at a concentration greater than or equal to 5 at. % and less than or equal to 100 at. % is used for a semiconductor film 45 containing germanium at a concentration greater than or equal to 5 at. % and less than or equal to 100 at. % or a conductive film 45, an n-channel transistor is employed.

Figure 10A:
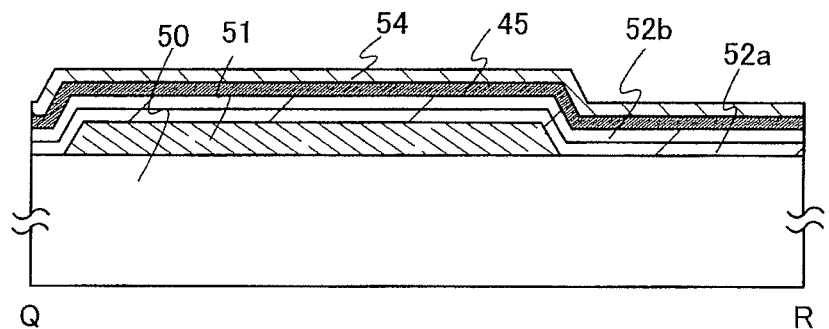
FIGS. 10A to 10C are cross-sectional views illustrating a method for manufacturing a display device according to the present invention.
Figure 10B:
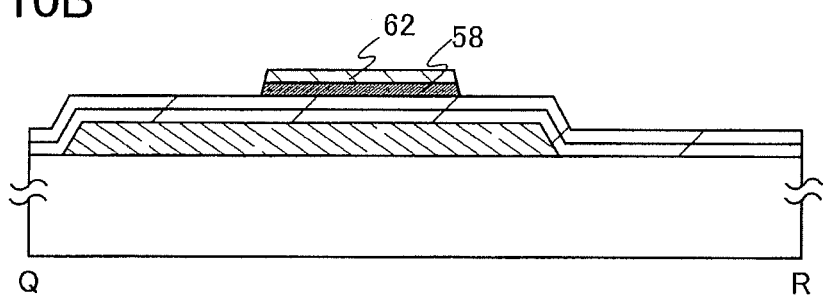

As illustrated in FIG. 10A, the gate electrode 51 is formed over the substrate 50 and the gate insulating films 52a and 52b are formed over the gate electrode 51.

The gate electrode 51 is formed by a sputtering method, a CVD method, a plating method, a printing method, a droplet discharge method, or the like using any of the metal materials which are given as materials for the gate electrode 51 in Embodiment Mode 1. Here, a molybdenum film is formed as a conductive film over the substrate 50 by a sputtering method and is etched using a resist mask which is formed using a first photomask. Thus, the gate electrode 51 is formed.

The gate insulating films 52a and 52b can each be a silicon oxide film, a silicon nitride film, a silicon oxynitride film, or a silicon nitride oxide film which is formed by a CVD method, a sputtering method, or the like. Here, a mode is described in which a silicon nitride film or a silicon nitride oxide film is formed as the gate insulating film 52a, and a silicon oxide film or a silicon oxynitride film is formed as the gate insulating film 52b to form a stacked layer structure.

Next, the semiconductor film 45 containing germanium at a concentration greater than or equal to 5 at. % and less than or equal to 100 at. % or the conductive film 45 is formed over the gate insulating film 52b. As a method for forming the semiconductor film 45 containing germanium at a concentration greater than or equal to 5 at. % and less than or equal to 100 at. % or the conductive film 45, a thermal CVD method, a plasma CVD method, an ECRCVD method, an ion plating method, a sputtering method, a vacuum deposition method, or the like can be employed as appropriate.

The semiconductor film containing germanium at a concentration greater than or equal to 5 at. % and less than or equal to 100 at. % is formed by a thermal CVD method, a plasma CVD method, an ECRCVD method, an ion plating method, a sputtering method, a vacuum deposition method, or the like. Further the semiconductor film containing germanium at a concentration greater than or equal to 5 at. % and less than or equal to 100 at. % formed by a thermal CVD method, a plasma CVD method, an ECRCVD method, an ion plating method, a sputtering method, a vacuum deposition method, or the like may be subjected to heat treatment to be crystallized. As heat treatment, heat may be added or laser beam irradiation or lamp light irradiation may be performed.

In the case of forming the semiconductor film 45 containing germanium at a concentration greater than or equal to 5 at. % and less than or equal to 100 at. % or the conductive film 45 by a plasma CVD method or an ECRCVD method, in a reaction chamber of a film formation apparatus, a deposition gas containing silicon or germanium and hydrogen are mixed, and an amorphous semiconductor film or a microcrystalline semiconductor film is formed using glow discharge plasma. Note that in the case of forming an amorphous semiconductor film, an amorphous semiconductor film can be formed by glow discharge plasma using a deposition gas containing silicon or germanium without using hydrogen.

In the step of forming the semiconductor film containing germanium at a concentration greater than or equal to 5 at. % and less than or equal to 100 at. %, glow discharge plasma is generated by applying high-frequency power with a frequency of 1 MHz to 20 MHz, typically 13.56 MHz, or high-frequency power with a frequency of more than 20 MHz to about 120 MHz, typically 27.12 MHz or 60 MHz. Alternatively, glow discharge plasma is generated by applying micro wave with a high-frequency power frequency of 1 GHz or 2.54 GHz.

As typical examples of the deposition gas containing silicon or germanium, $SiH_4$, $Si_2H_6$, $GeH_4$, and $Ge_2H_6$ are given.

In the film formation treatment of the semiconductor film containing germanium at a concentration greater than or equal to 5 at. % and less than or equal to 100 at. % or the conductive film, helium may be added to a reaction gas, in addition to a deposition gas containing silicon or germanium and hydrogen. Helium has an ionization energy of 24.5 eV, which is the largest among all gases, and has a metastable state in the level of about 20 eV, which is a little lower than the ionization energy; therefore, only about 4 eV, the difference therebetween, is necessary for ionization during discharging. Therefore, the discharge starting voltage also has the lowest value among all gases. By such characteristics, plasma can be held stably with helium. Further, since uniform plasma can be formed, even if the area of a substrate over which the semiconductor film containing germanium at a concentration greater than or equal to 5 at. % and less than or equal to 100 at. % or the conductive film is deposited is large, plasma having uniform density can be obtained.

Further, an amorphous semiconductor film or a microcrystalline semiconductor film containing germanium at a concentration greater than or equal to 5 at. % and less than or equal to 100 at. % can be formed by sputtering with helium, argon, neon, or the like using a germanium target, a silicon germanium target, or the like.

In addition, by adding heat to an amorphous semiconductor film or a microcrystalline film containing germanium at a concentration greater than or equal to 5 at. % and less than or equal to 100 at. %, a crystalline semiconductor film containing germanium at a concentration greater than or equal to 5 at. % and less than or equal to 100 at. % can be formed.

Similarly, the conductive film can be formed by a thermal CVD method, a plasma CVD method, an ECRCVD method, an ion plating method, a sputtering method, a vacuum deposition method, or the like.

Here, as the semiconductor film 45 containing germanium at a concentration greater than or equal to 5 at. % and less than or equal to 100 at. % or the conductive film 45, a microcrystalline germanium film is formed by glow discharge plasma mixing germane with hydrogen and/or a rare gas. Germane is diluted with hydrogen and/or a rare gas to be 10 times to 2000 times thinner. Thus, a large amount of hydrogen and/or a rare gas is needed. The substrate heating temperature is 100° C. to 400° C., preferably 250° C. to 350° C. Further, by using a deposition gas containing silicon together with hydrogen and a deposition gas containing germanium, a microcrystalline silicon germanium film is formed as the semiconductor film 45 containing germanium as its main component.

Next, a first buffer layer 54 is formed. As the first buffer layer 54, an amorphous semiconductor film can be formed by a plasma CVD method using a deposition gas containing silicon or germanium. Alternatively, by dilution of a deposition gas containing silicon or germanium with one or plural kinds of rare gases selected from helium, argon, krypton, and neon, an amorphous semiconductor film can be formed. Furthermore, an amorphous semiconductor film containing hydrogen can be formed using hydrogen with a flow rate of 1 to 10 times, preferably 1 to 5 times as high as that of a deposition gas containing silicon or germanium. In addition, halogen such as fluorine or chlorine may be added to the above-described hydrogenated semiconductor film or the amorphous semiconductor film containing hydrogen.

Alternatively, as the first buffer layer 54, an amorphous semiconductor film can be formed by sputtering with hydrogen or a rare gas using a semiconductor target such as a silicon target, a silicon germanium target, a germanium target.

As the amorphous semiconductor film, an amorphous silicon film, an amorphous silicon germanium film, or the like is given.

The thickness of the first buffer layer 54 is set to be 10 nm to 100 nm, preferably, 30 nm to 50 nm.

An amorphous semiconductor film or an amorphous film containing hydrogen, nitrogen, or halogen is formed, as a buffer layer 54, on the surface of the semiconductor film 45 containing germanium at a concentration greater than or equal to 5 at % and less than or equal to 100 at. % or the conductive film 45, whereby native oxidation of a surface of crystal grains contained in the semiconductor film containing germanium at a concentration greater than or equal to 5 at. % and less than or equal to 100 at. % can be prevented when the semiconductor film 45 containing germanium at a concentration greater than or equal to 5 at. % and less than or equal to 100 at. % or the conductive film 45 is formed of a microcrystalline semiconductor film. In particular, in a region where an amorphous semiconductor is in contact with microcrystal grains, a crack is likely to be caused due to distortion of local stress. If a crack is exposed to oxygen, crystal grains are oxidized to form silicon oxide. However, the first buffer layer 54 is formed on the surface of the semiconductor film 45 containing germanium at a concentration greater than or equal to 5 at. % and less than or equal to 100 at. % or the conductive film 45, whereby oxidation of the microcrystal grains can be prevented.

In addition, it is preferable that the first buffer layer 54 be formed by a plasma CVD method at a temperature of 300° C. to 400° C. after forming the semiconductor film 45 containing germanium at a concentration greater than or equal to 5 at. % and less than or equal to 100 at. % or the conductive film 45. This film formation treatment supplies hydrogen to the semiconductor film containing germanium at a concentration greater than or equal to 5 at. % and less than or equal to 100 at. %, and the same effect as hydrogenating the semiconductor film containing germanium at a concentration greater than or equal to 5 at. % and less than or equal to 100 at. % can be obtained. In other words, by depositing the first buffer layer 54 over the semiconductor film 45 containing germanium at a concentration greater than or equal to 5 at. % and less than or equal to 100 at. % or the conductive film 45, hydrogen is diffused into the semiconductor film 45 containing germanium at a concentration greater than or equal to 5 at. % and less than or equal to 100 at. % or the conductive film 45, whereby dangling bonds can be terminated.

Then, a resist is applied over the first buffer layer 54, then, the resist is exposed to light and developed through a photolithography process using a second photomask to form a resist mask. Then, using the resist mask, the first buffer layer 54 and the semiconductor film 45 containing germanium at a concentration greater than or equal to 5 at. % and less than or equal to 100 at. % or the conductive film 45 are etched to form the first buffer layer 62 and the semiconductor film 58 containing germanium at a concentration greater than or equal to 5 at. % and less than or equal to 100 at. % or the conductive film 58.

Figure 10C:
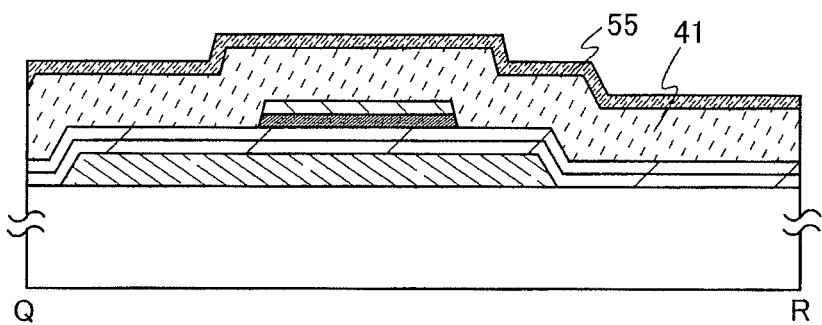

Then, as illustrated in FIG. 10C, a second buffer layer 41 and an impurity semiconductor film 55 to which an impurity element imparting one conductivity type is added are formed over the first buffer layer 62 and the gate insulating film 52b.

The second buffer layer 41 is formed in a manner similar to that of the first buffer layer 54. In some cases, the second buffer layer 42 is partly etched in a later step of formation of source and drain regions, and therefore is preferably formed with a thickness such that the second buffer layer 42 is partly left after the etching. Typically, it is preferable to form the second buffer layer 41 with a thickness greater than or equal to 30 nm and less than or equal to 500 nm, preferably greater than or equal to 50 nm and less than or equal to 200 nm.

In a display device in which high voltage (e.g., about 15 V) is applied to thin film transistors, typically, in a liquid crystal display device, if the first buffer layer 54 and the second buffer layer 41 are formed thick, withstand drain voltage is increased. Therefore, deterioration of the thin film transistors can be reduced even if high voltage is applied to the thin film transistors.

Since the first buffer layer 54 and the second buffer layer 41 are each formed using an amorphous semiconductor film or an amorphous semiconductor film containing hydrogen or a halogen, the first buffer layer 54 and the second buffer layer 41 have a larger energy gap, higher resistivity and lower mobility than the semiconductor film 45 containing germanium at a concentration greater than or equal to 5 at. % and less than or equal to 100 at. % or the conductive film 45. Therefore, in a thin film transistor which is completed later, the first buffer layer and the second buffer layer, which are formed between the source and drain regions and the semiconductor film 45 containing germanium at a concentration greater than or equal to 5 at. % and less than or equal to 100 at. % or the conductive film 45, serve as high resistance regions; therefore off current of the thin film transistor can be reduced. When the thin film transistor is used as a switching element of a display device, the contrast of the display device can be improved.

In the case of forming an n-channel thin film transistor, phosphorus may be added as a typical impurity element to form the semiconductor film 55 to which an impurity element imparting one conductivity type is added; for example, an impurity gas such as $PH_3$ may be added to a deposition gas containing silicon or germanium. If a p-channel thin film transistor is formed, boron, which is a typical impurity element, may be added; for example, a gas containing an impurity element such as $B_2H_6$ may be added to a deposition gas containing silicon or germanium as source gas. By setting a concentration of phosphorus or boron to $1\times10^{19}$ to $1\times10^{21}$ at./cm$^3$, the impurity semiconductor film 55 can have an ohmic contact with wirings 71a to 71c which is formed later, and functions as the source and drain regions. The impurity semiconductor film 55 to which an impurity element imparting one conductivity type is added can be formed of a microcrystalline semiconductor film or an amorphous semiconductor film. The impurity semiconductor film 55 to which an impurity element imparting one conductivity type is added is formed with a thickness greater than or equal to 2 nm and less than or equal to 50 nm. By reducing the thickness of the impurity semiconductor film to which an impurity element imparting one conductivity type is added, the throughput can be improved.

Then, a resist mask is formed over the impurity semiconductor film 55 to which an impurity element imparting one conductivity type is added. The resist mask is formed by a photolithography technique. Here, a resist which is applied over the impurity semiconductor film 55 to which an impurity element imparting one conductivity type is added is exposed to light using a third photomask and developed to form the resist mask.

Figure 11A:
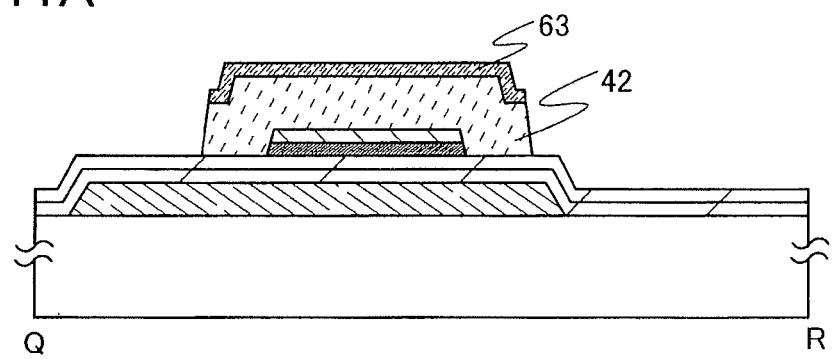
FIGS. 11A to 11C are cross-sectional views illustrating the method for manufacturing the display device according to the present invention.

Then, using the resist mask, the second buffer layer 41 and the impurity semiconductor film 55 to which an impurity element imparting one conductivity type is added are etched and separated to form the second buffer layer 42 and an impurity semiconductor film 63 to which an impurity imparting one conductivity type is added as illustrated in FIG. 11A. Then, the resist mask is removed.

The second buffer layer 42 covers the semiconductor film containing germanium at a concentration greater than or equal to 5 at. % and less than or equal to 100 at. % or the conductive film 58, whereby leakage current between the source and drain regions formed over the second buffer layer 42 and the semiconductor film 58 containing germanium at a concentration greater than or equal to 5 at. % and less than or equal to 100 at. % or the conductive film 58 can be prevented. In addition, leakage current between the wiring and the semiconductor film 58 containing germanium at a concentration greater than or equal to 5 at. % and less than or equal to 100 at. % or the conductive film 58 can be prevented.

Figure 11B:
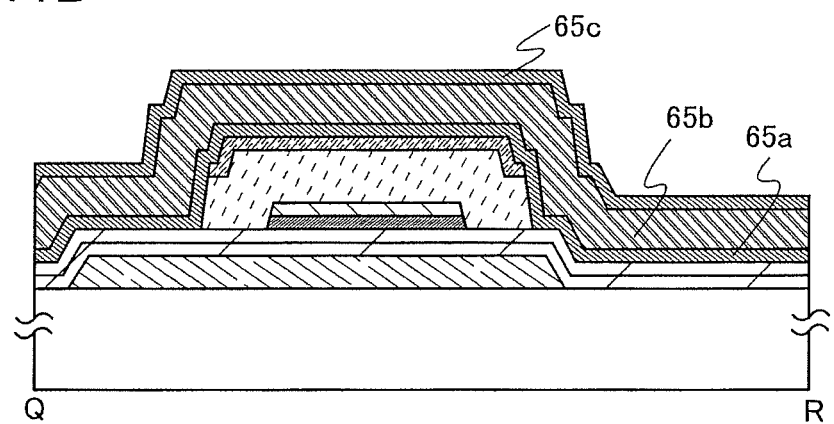

Then, as illustrated in FIG. 11B, conductive films 65a to 65c are formed over the impurity semiconductor film 63 to which an impurity element imparting one conductivity type is added and the gate insulating film 52b. The conductive films 65a to 65 are formed by a sputtering method, a CVD method, a printing method, a droplet discharge method, a vapor deposition method, or the like. Here, the conductive film having a three-layer structure of the conductive films 65a to 65c is illustrated, and a stacked layer structure in which molybdenum films are used as the conductive films 65a and 65c and an aluminum film is used as the conductive film 65b, or a stacked layer structure in which titanium films are used as the conductive films 65a and 65c and an aluminum film is used as the conductive films 65b is employed. The conductive films 65a to 65c are formed by a sputtering method or a vacuum evaporation method.

The conductive films 65a to 65c can be formed using any of the metal materials which are listed as materials for the wirings 71a to 71c in Embodiment Mode 1.

Then, a resist mask is formed over the conductive film 65c through a photolithography process using a fourth photomask.

Figure 11C:
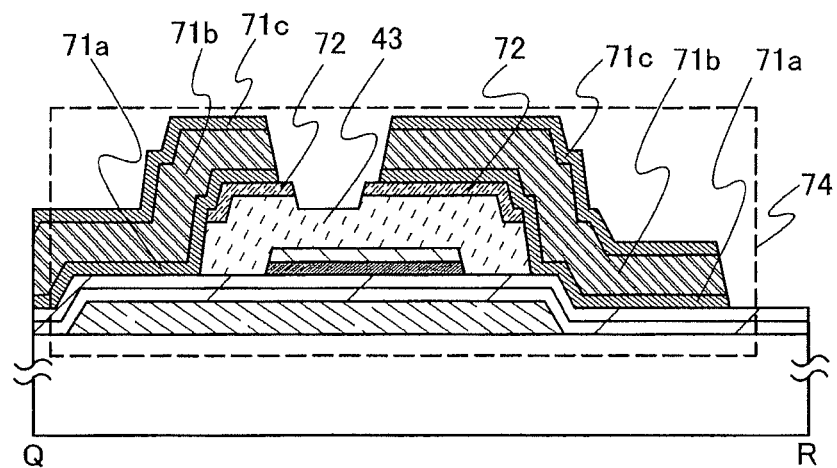

Then, the conductive films 65a to 65c are etched using the resist mask to form pairs of the wirings 71a to 71c (which serve as source and drain electrode) as illustrated in FIG. 11C.

Then, the impurity semiconductor film 63 to which an impurity element imparting one conductivity type is added is etched and separated using the resist mask. As a result, the pair of source and drain regions 72 can be formed as illustrated in FIG. 11C. Note that in this etching process, the second buffer layer 42 is also partly etched. The second buffer layer 42 which is partly etched and has a depressed portion is referred to as a second buffer layer 43. The source and drain regions and the depressed portion of the buffer layer can be formed in the same process. The depth of the depressed portion of the second buffer layer 43 is set to half to one-third of the thicknesses of the thickest region in the second buffer layer 43, whereby the leak path between the source region and the drain region can be spaced long. Accordingly, leakage current between the source region and drain region can be reduced. Then, the resist mask is removed.

Next, dry etching may be performed under such a condition that the second buffer layer 43 which is exposed is not damaged and an etching rate of the second buffer layer 43 is low. Through this step, an etching residue on the second buffer layer 43 between the source and drain regions, a residue of the resist mask, and a contamination source in the apparatus used for removal of the resist mask can be removed, whereby the source and drain regions can be certainly insulated. As a result, leakage current of the thin film transistor can be reduced; therefore, a thin film transistor with small off current and high withstand voltage can be manufactured. Note that a chlorine gas may be used for an etching gas, for example.

Through the above-described process, a channel-etched thin film transistor 74 can be formed.

Figure 12A:
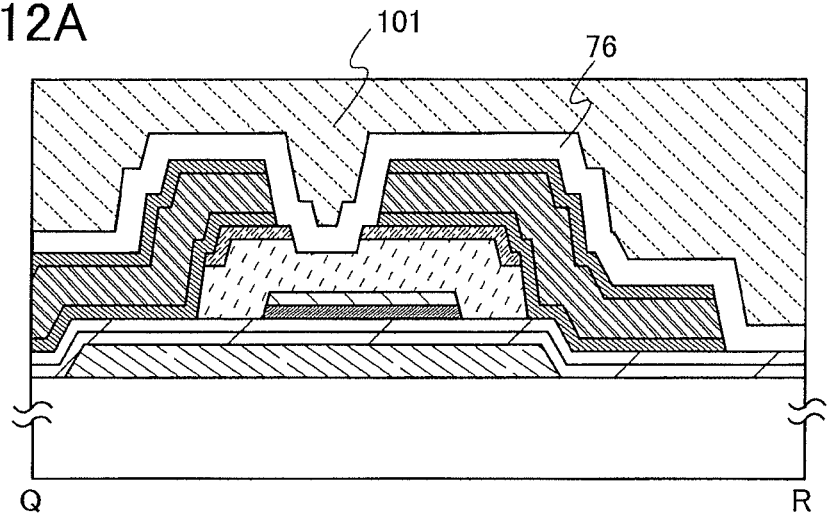
FIGS. 12A to 12C are cross-sectional views illustrating the method for manufacturing the display device according to the present invention.

Next, as illustrated in FIG. 12A, a protective insulating film 76 is formed over the wirings 71a to 71c, the source and drain regions 72, the second buffer layer 43, and the gate insulating film 52b. The protective insulating film 76 can be formed in a manner to that of the gate insulating films 52a and 52b. Note that the protective insulating film 76 is provided to prevent intrusion of contaminating impurities such as organic matters, metal, or water vapor contained in the atmosphere; thus, a dense film is preferably used for the protective insulating film 76. Further, by using a silicon nitride film as the protective insulating film 76, the oxygen concentration in the second buffer layer 43 can be $5\times10^{19}$ at./cm$^3$ or less, preferably $1\times10^{19}$ at./cm$^3$ or less, so that the second buffer layer 43 can be prevented from being oxidized.

Figure 12B:
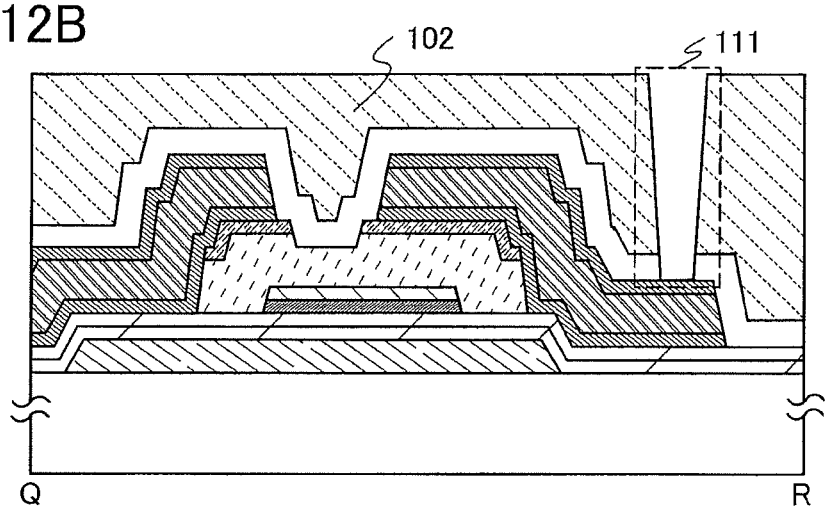

Then, an insulating film 101 is formed over the protective insulating film 76. The insulating film 101 is formed using a photosensitive organic resin here. Then, the insulating film 101 is exposed to light using a fifth photomask and developed to form an insulating film 102 with an opening being exposed the protective insulating film 76 as illustrated in FIG. 12B. Then, the protective insulating film 76 is etched using the insulating film 102 to form a contact hole 111 which partly exposes the wiring 71c.

Figure 12C:
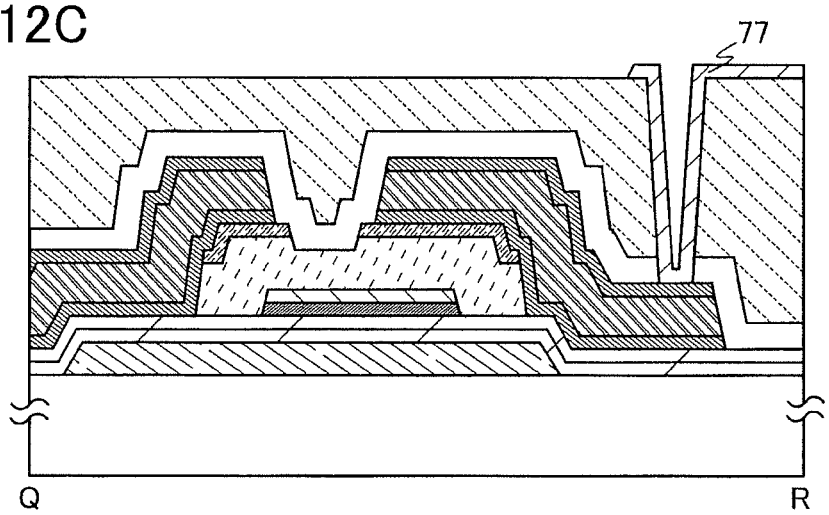

Then, as illustrated in FIG. 12C, a pixel electrode 77 is formed in the contact hole 111. Here, after a conductive film is formed over the insulating film 102, the conductive film is etched using a resist mask which is formed through a photolithography process using a sixth photomask, whereby the pixel electrode 77 is formed.

The pixel electrode 77 can be formed of a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the pixel electrode 77 can be formed using a conductive composition containing a conductive high-molecular compound (also referred to as a conductive polymer). The pixel electrode 77 which is formed of a conductive composition preferably has a sheet resistance of 10000 Ω/square or less and a transmittance for light at a wavelength of 550 nm of 70% or more. In addition, the resistivity of the conductive high-molecular compound contained in the conductive composition is preferably 0.1 Ω·cm or less.

As the conductive high-molecular compound, a so-called π-electron conjugated conductive high-molecular compound can be used. For example, polyaniline or a derivative thereof, polypyrrole or a derivative thereof, polythiophene or a derivative thereof, a copolymer of two or more kinds thereof, and the like can be given.

Here, as the pixel electrode 77, a film of ITO is formed by a sputtering method, and then, a resist is applied to the ITO film. Then, the resist is exposed to light using the sixth photomask and developed. Then, the ITO film is etched using the resist mask to form the pixel electrode 77.

Figure 13:
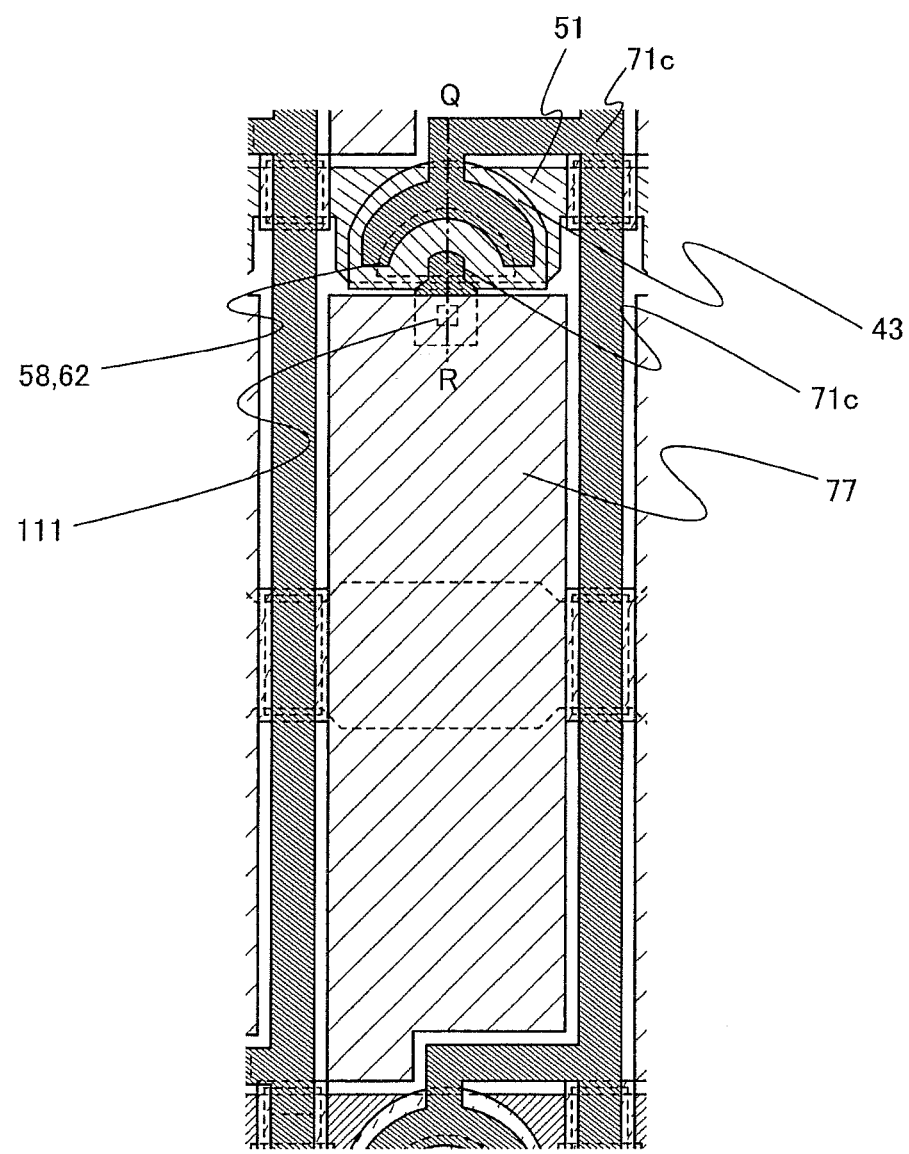
FIG. 13 is a top view illustrating the display device according to the present invention.

Note that FIG. 12C is a cross-sectional view taken along line Q-R in FIG. 13. In FIG. 13, it is not illustrated that the end portions of source and drain regions 72 are exposed and located beyond the end portion of the wiring 71c. Furthermore, one of the pair of wirings surrounds the other wiring (specifically, the former wiring is in a U-shape or a C-shape). Thus, an area in which carriers travel can be increased, and thus the amount of current can be increased and an area of the thin film transistor can be reduced. In addition, the semiconductor film 58 containing germanium at a concentration greater than or equal to 5 at. % and less than or equal to 100 at. % or the conductive film 58, the gate insulating films 52a and 52b, and the wirings 71a to 71c overlap over the gate electrode 51, and thus an influence by unevenness due to the gate electrode 51 is small and reduction in coverage and generation of leakage current can be suppressed.

Further, in the case of a liquid crystal display device, the wirings 71a to 71c which is connected to a signal line serves as a source and the wirings 71a to 71c which is connected to a pixel electrode serves as a drain, and by making the source have a U-shape or a C-shape (that is, the shape with an upper surface shape having a curve around the drain with the insulating film interposed therebetween) with which a region of the source which faces the drain is larger than a region of the drain which faces the source, parasitic capacitance between the gate electrode (gate wiring) and the drain can be reduced. Therefore, a thin film transistor in which voltage drop in the drain electrode side is reduced can be formed. In addition, the display device with a thin film transistor having such a structure can have improved response speed of pixels. In particular, in the case of thin film transistors formed in pixels in a liquid crystal display device, since drop in drain voltage can be reduced, response speed of a liquid crystal material can be improved.

Through the above-described process, a thin film transistor and an element substrate which can be used for a display device can be formed.

Although this embodiment mode describes a channel-etched thin film transistor, this embodiment mode can be applied to a channel-protective thin film transistor. In specific, it is possible to form a channel protection film over the second buffer layer and to provide the pair of impurity semiconductor films over the channel protection film and the second buffer layer.

According to this embodiment mode, a high-performance thin film transistor can be manufactured. Accordingly, a driving frequency of a display device can be increased and the panel size can be increased and higher density of pixels can be achieved.

Embodiment Mode 4

In this embodiment mode, a process for manufacturing a thin film transistor having high field effect mobility, high ON current, and low off current is described. In addition, a process for manufacturing a thin film transistor is described through which the number of photomasks can be less than that in Embodiment Mode 3. Here, as a typical example, a method for manufacturing the thin film transistor of FIG. 2 in Embodiment Mode 1 is described.

Figure 14A:
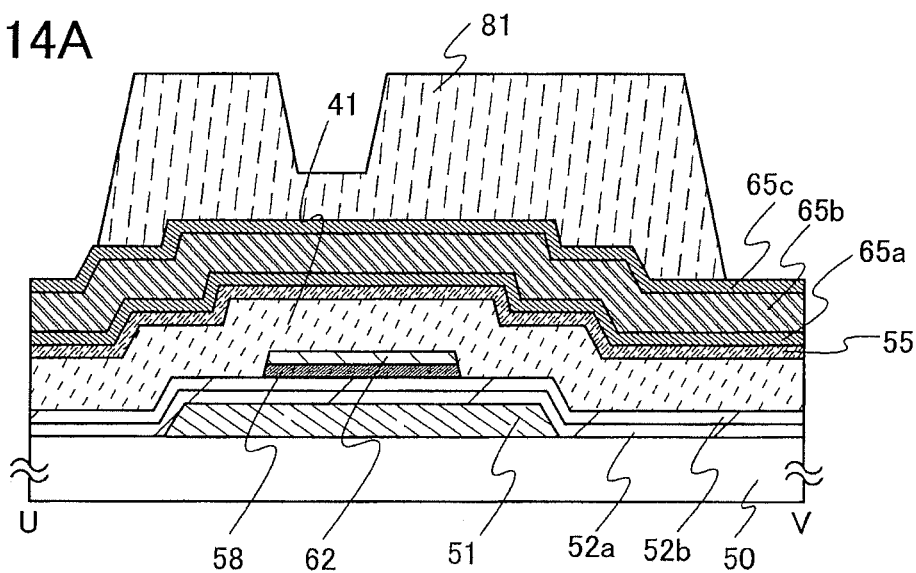
FIGS. 14A to 14C are cross-sectional views illustrating a method for manufacturing a display device according to the present invention.

In a manner similar to that in Embodiment Mode 3, as illustrated in FIG. 14A, a conductive film is formed over the substrate 50; a resist is applied to the conductive film; and the conductive film is partly etched using a resist mask which is formed through a photolithography process using a first photomask to form the gate electrode 51. Then, the gate insulating films 52a and 52b are formed over the gate electrode 51. Then, the semiconductor film 58 containing germanium at a concentration greater than or equal to 5 at. % and less than or equal to 100 at. % or the conductive film 58 and the first buffer layer 62 are formed over the gate insulating film 52b through photolithography process using a second photomask. Then, a second buffer layer 41, the impurity semiconductor film 55 to which an impurity imparting one conductivity type is added, and the conductive films 65a to 65c are formed in that order over the first buffer layer 62. Then, a resist is applied to the conductive film 65c.

As the resist, a positive resist or a negative resist can be used. Here, a positive resist is used.

Then, the resist is irradiated with light using a multi-tone mask as a third photomask, so that the resist is exposed to the light to be a resist mask 81.

Light exposure using a multi-tone mask is described here with reference to FIGS. 15A to 15D.

A multi-tone mask can perform three levels of light exposure to obtain an exposed portion, a half-exposed portion, and an unexposed portion; with which one-time light exposure and development process can form a resist mask with regions of plural thicknesses (typically, two kinds of thicknesses) to be formed. Accordingly, by using a multi-tone mask, the number of photomasks can be reduced.

Figure 15A:
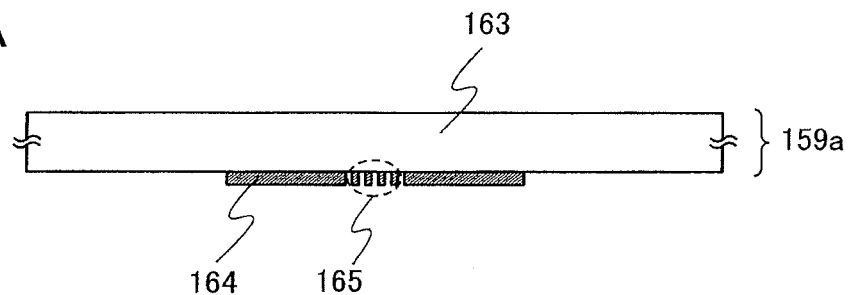
FIGS. 15A and 15C are views illustrating multi-tone masks.
Figure 15B:
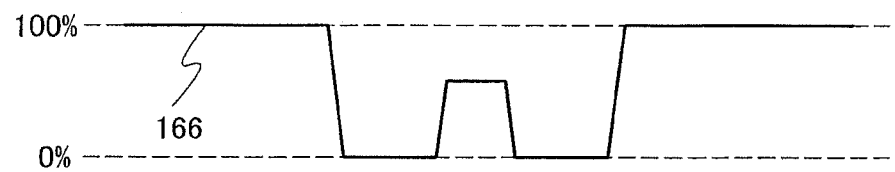
FIGS. 15B and 15D show light transmittances thereof applicable to the present invention.
Figure 15C:
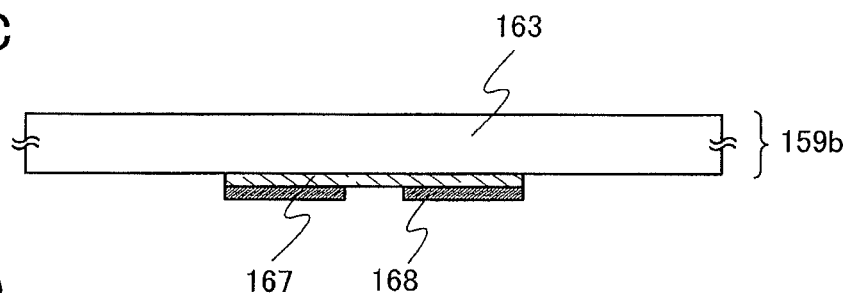

As typical examples of a multi-tone mask, a gray-tone mask 159a illustrated in FIG. 15A and a half-tone mask 159b illustrated in FIG. 15C can be given.

As illustrated in FIG. 15A, the gray-tone mask 159a includes a light-transmitting substrate 163 provided with a light-blocking portion 164 and a diffraction grating 165. The light transmittance of the light-blocking portion 164 is 0%. On the other hand, the diffraction grating 165 has a light transmitting portion in a slit form, a dot form, a mesh form, or the like with intervals of equal to or less than the resolution limit of light used for the exposure, and therefore controls the light transmittance. The diffraction grating 165 can be in a slit form, a dot form, or a mesh form with regular intervals; or in a slit form, a dot form, or a mesh form with irregular intervals.

For the light-transmitting substrate 163, a light-transmitting substrate such as a quartz substrate can be used. The light-blocking portion 164 and the diffraction grating 165 can be formed using a light-blocking material such as chromium or chromium oxide, which absorbs light.

When the gray-tone mask 159a is irradiated with light, a light transmittance 166 of the light-blocking portion 164 is 0% and the light transmittance 166 of a region where neither the light-blocking portion 164 nor the diffraction grating 165 is provided is 100% as illustrated in FIG. 15B. The light transmittance 166 of the diffraction grating 165 can be controlled in a range of 10% to 70%. The light transmittance in the diffraction grating 165 can be controlled by adjusting the interval of slits, dots, or meshes of the diffraction grating and the pitch thereof.

As illustrated in FIG. 15C, the half-tone mask 159b includes the light-transmitting substrate 163 provided with a semi-light-transmitting portion 167 and a light-blocking portion 168. The semi-light-transmitting portion 167 can be formed using MoSiN, MoSi, MoSiO, MoSiON, CrSi, or the like. The light-blocking portion 168 can be formed using a light-blocking material such as chromium or chromium oxide, which absorbs light.

Figure 15D:
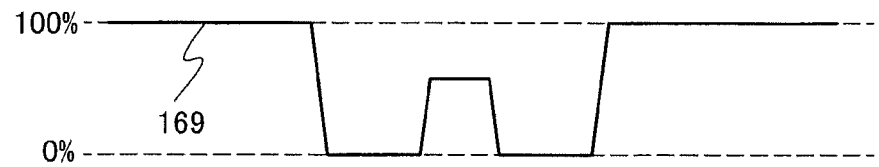

When the half-tone mask 159b is irradiated with light, a light transmittance 169 of the light-blocking portion 168 is 0% and the light transmittance 169 of the region where neither the light-blocking portion 168 nor the semi-light-transmitting portion 167 is provided is 100% as illustrated in FIG. 15D. The light transmittance 169 of the semi-light-transmitting portion 167 can be controlled in a range of 10% to 70%. The light transmittance in the semi-light-transmitting portion 167 can be controlled by a material of the semi-light-transmitting portion 167.

After light exposure using the multi-tone mask, development is carried out, whereby the resist mask 81 including regions having different thicknesses can be formed, as illustrated in FIG. 14A.

Figure 14B:
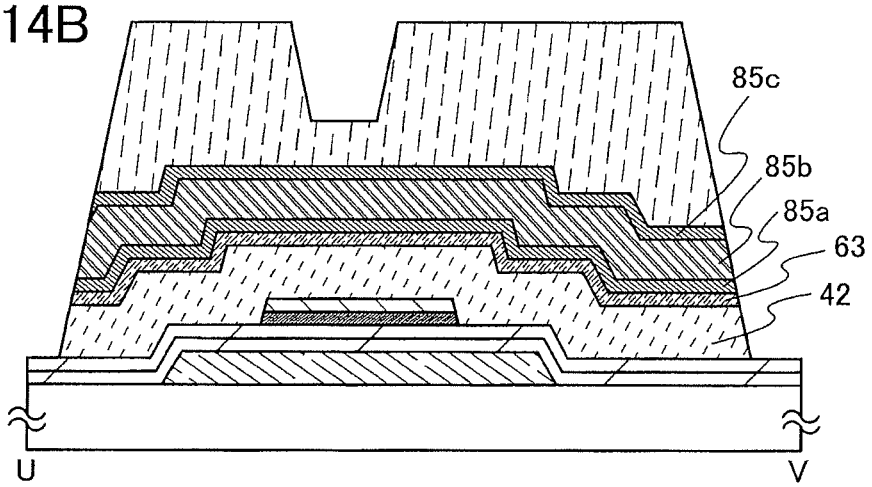

Next, with the resist mask 81, the second buffer layer 41, the impurity semiconductor film 55 to which an impurity element imparting one conductivity type is added, and the conductive films 65a to 65c are etched and separated. As a result, the second buffer layer 42, the impurity semiconductor film 63 to which an impurity element imparting one conductivity type is added, and conductive films 85a to 85c as illustrated in FIG. 14B can be formed.

Figure 14C:
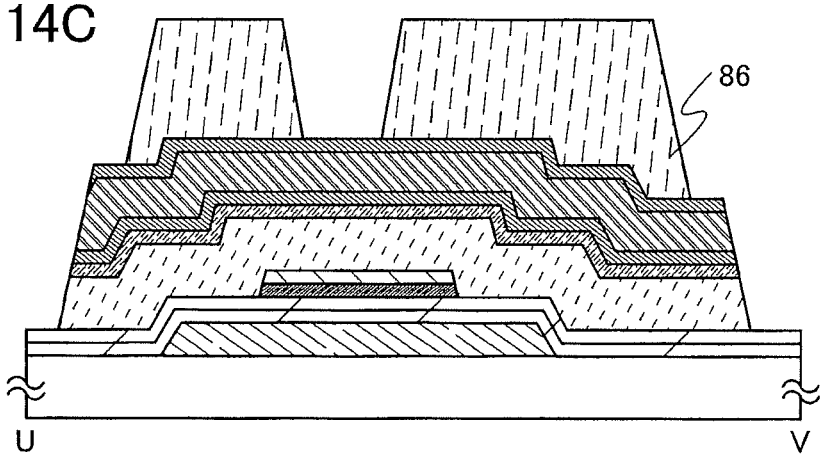

Next, ashing is performed on the resist mask 81. As a result, the areas and the thickness of the resist are reduced. Accordingly, a region of the resist having a small thickness (a region overlapping with a part of the gate electrode 51) is removed to form a separated resist mask 86 as illustrated in FIG. 14C.

Figure 16A:
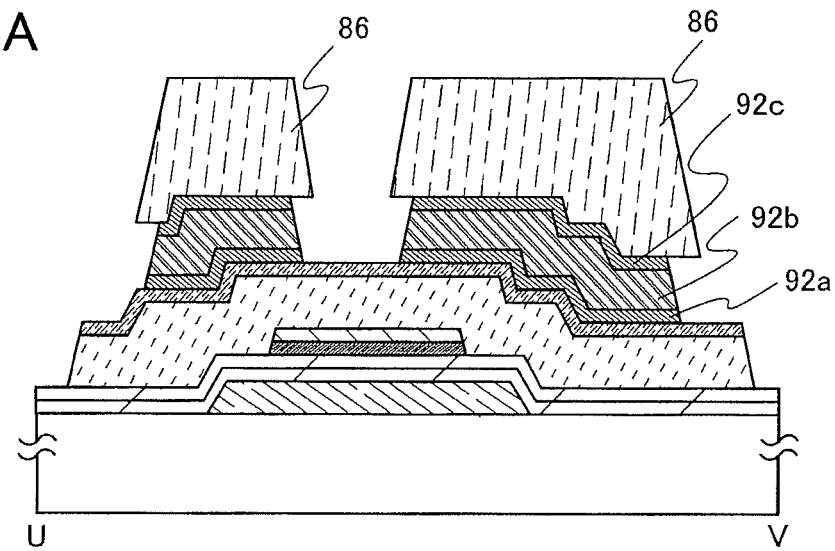
FIGS. 16A to 16C are cross-sectional views illustrating the method for manufacturing the display device according to the present invention.

Then, the conductive films 85a to 85c are etched and separated using the resist mask 86. As a result, pairs of wirings 92a to 92c as illustrated in FIG. 16A can be formed. By wet etching the conductive films 85a to 85c using the resist mask 86, end portions of the conductive films 85a to 85c are etched isotropically. As a result, the wirings 92a to 92c with smaller areas than the resist mask 86 can be formed.

Figure 16B:
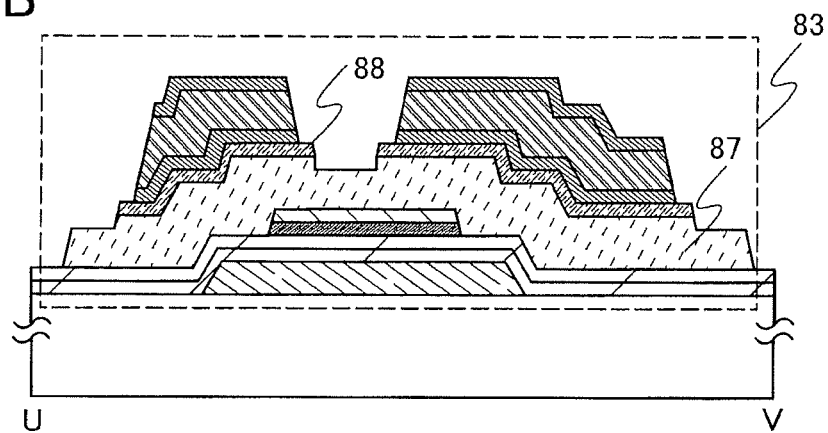

Then, the impurity semiconductor film 63 to which an impurity element imparting one conductivity type is added is etched using the resist mask 86 to form the pair of source and drain regions 88 as illustrated in FIG. 16B. Note that the second buffer layer 42 is also etched partly in this etching step. The partly etched second buffer layer is referred to as a second buffer layer 87. Note that the second buffer layer 87 has a depressed portion. The source and drain regions and the depressed portion of the second buffer layer can be formed in the same process. Here, the second buffer layer 87 is partly etched using the resist mask 86 having a smaller area than the resist mask 81; accordingly, the second buffer layer 87 is protruded from the source and drain regions 88. In addition, the end portions of the wirings 92a to 92c are not aligned with those of the source and drain regions 88, and the end portions of the source and drain regions 88 are located beyond the end portions of the wirings 92a to 92c. After that, the resist mask 86 is removed.

Next, dry etching may be performed under such a condition that the buffer layer which is exposed is not damaged and an etching rate of the buffer layer is low. Through this step, an etching residue on the buffer layer between the source and drain regions, a residue of the resist mask, and a contamination source in the apparatus used for removal of the resist mask can be removed, whereby the source and drain regions can be certainly insulated. As a result, leakage current of the thin film transistor can be reduced; therefore, a thin film transistor with small off current and high withstand voltage can be manufactured. Note that a chlorine gas may be used for an etching gas, for example.

Through the above-described process, a channel-etched thin film transistor 83 can be formed. In addition, the thin film transistor can be formed using two photomasks.

Figure 16C:
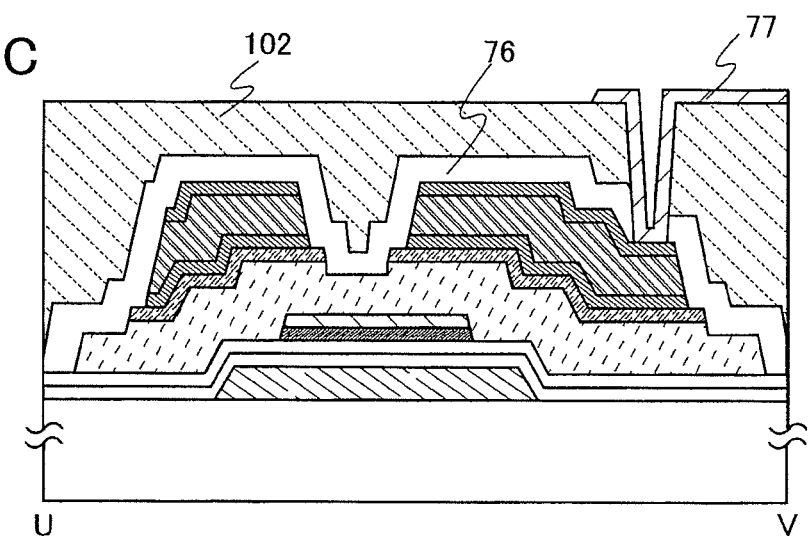

After that, through a process similar to the process in Embodiment Mode 1, the protective insulating film 76 and the insulating film 102 are formed over the wiring 92a to 92c, the source and drain regions 88, the second buffer layer 87, and the gate insulating film 52b, then, a contact hole is formed through a photolithography process using a fourth photomask as illustrated in FIG. 16C.

Figure 17:
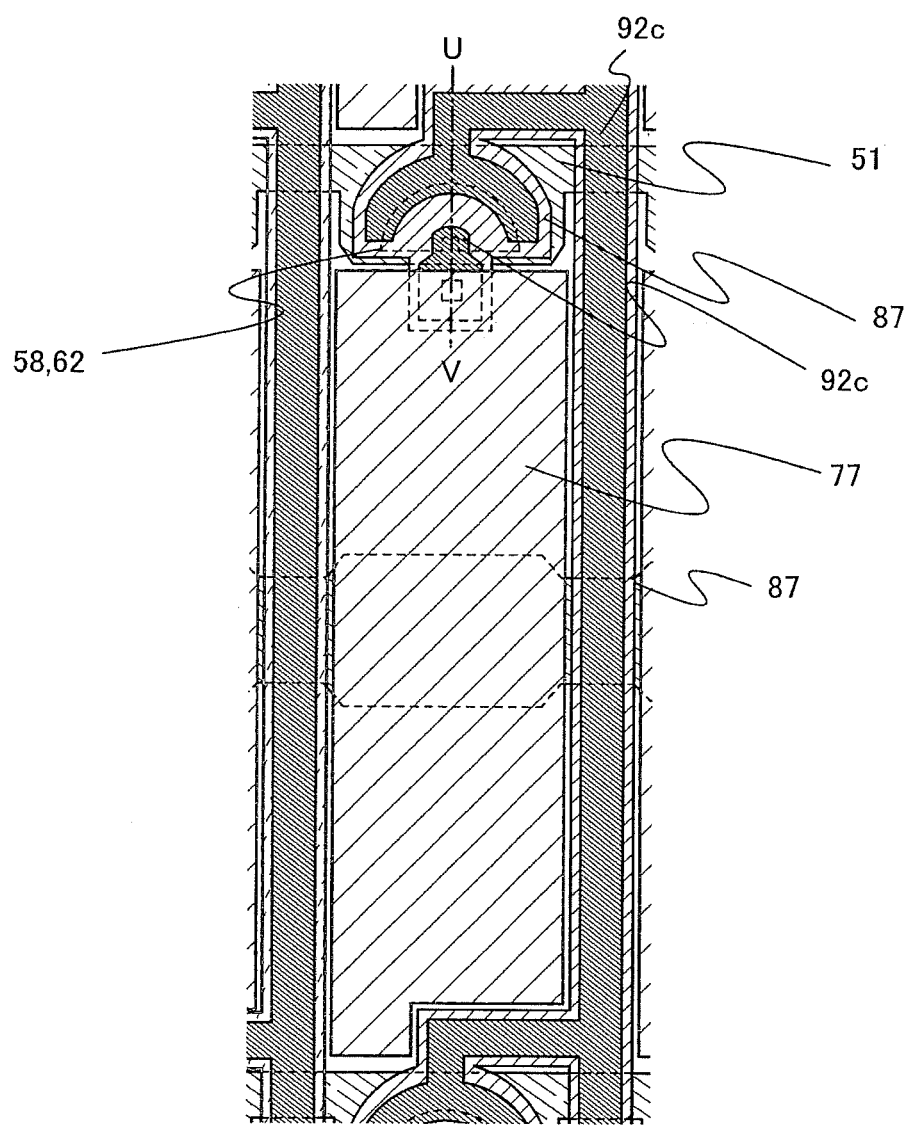
FIG. 17 is a top view illustrating the display device according to the present invention.

Then, the pixel electrode 77 is formed over the insulating film 102 through a photolithography process using a fifth photomask. Note that FIG. 16C is a cross-sectional view taken along line U-V in FIG. 17.

In this manner, a thin film transistor can be manufactured. Further, an element substrate which can be used for a display device can be formed.

Through the above-described process, an element substrate having a thin film transistor which can be used for a display device can be formed with photomasks the number of which is reduced by one compared to the number in Embodiment Mode 3.

Embodiment Mode 5

In this embodiment mode, a process for manufacturing a thin film transistor having high mobility and ON current, and low off current is described below. Here, as a typical example, a method for manufacturing the thin film transistor of FIG. 3 in Embodiment Mode 1 is described.

Figure 18A:
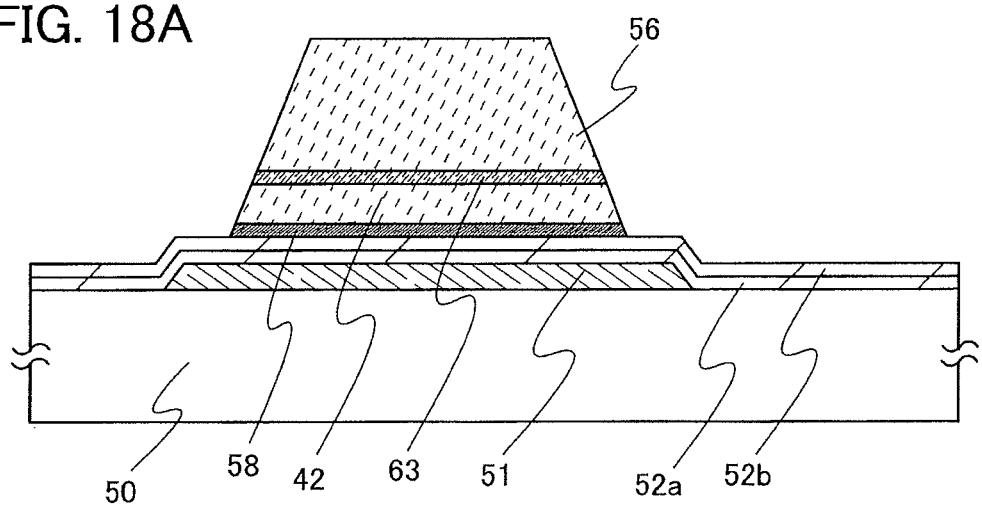
FIGS. 18A to 18C are cross-sectional views illustrating a method for manufacturing a display device according to the present invention.

In a manner similar to that in Embodiment Mode 3, the gate electrode 51 and the gate insulating films 52a and 52b are formed over the substrate 50. Then, a semiconductor film containing germanium at a concentration greater than or equal to 5 at. % and less than or equal to 100 at. % or a conductive film is formed over the gate insulating film 52b, and a buffer layer and an impurity semiconductor film to which an impurity element imparting one conductivity type is added are formed in that order over the semiconductor film. Then, a resist mask 56 is formed over the impurity semiconductor film to which an impurity element imparting one conductivity type is added, and the impurity semiconductor film to which an impurity element imparting one conductivity type is added, the buffer layer, and the semiconductor film containing germanium at a concentration greater than or equal to 5 at. % and less than or equal to 100 at. % or the conductive film are etched, whereby the semiconductor film 58 containing germanium at a concentration greater than or equal to 5 at. % and less than or equal to 100 at. % or the conductive film 58, the buffer layer 42, and the impurity semiconductor film 63 to which an impurity element imparting one conductivity type is added are formed as illustrated in FIG. 18A.

Figure 18B:
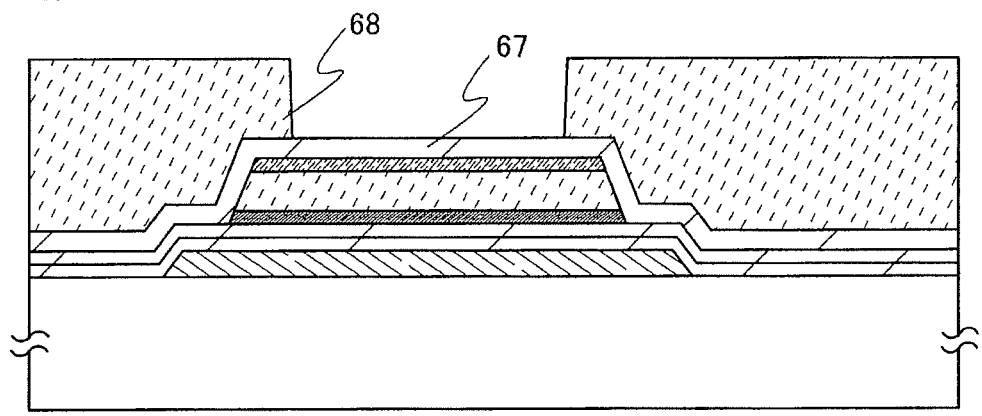

Then, as illustrated in FIG. 18B, an insulating film 67 is formed over the impurity semiconductor film 63 to which an impurity element imparting one conductivity type is added and the gate insulating film 52b. The insulating film 67 can be formed using a material similar to the material for the gate insulating films 52a and 52b as appropriate.

Then, a resist mask 68 is formed over the insulating film 67. The resist mask 68 is provided to form an insulating film by partly etching the insulating film 67. The insulating film is provided in a manner such that the wirings which are formed later are prevented from being in contact with a semiconductor film 58 containing germanium at a concentration greater than or equal to 5 at. % and less than or equal to 100 at. % or a conductive film 58, and is in contact with the impurity semiconductor film 63 to which an impurity imparting one conductivity type is added. The resist mask 68 preferably has an opening which is smaller than an area of an upper surface of the insulating film 63 to which an impurity element imparting one conductivity type is added.

Figure 18C:
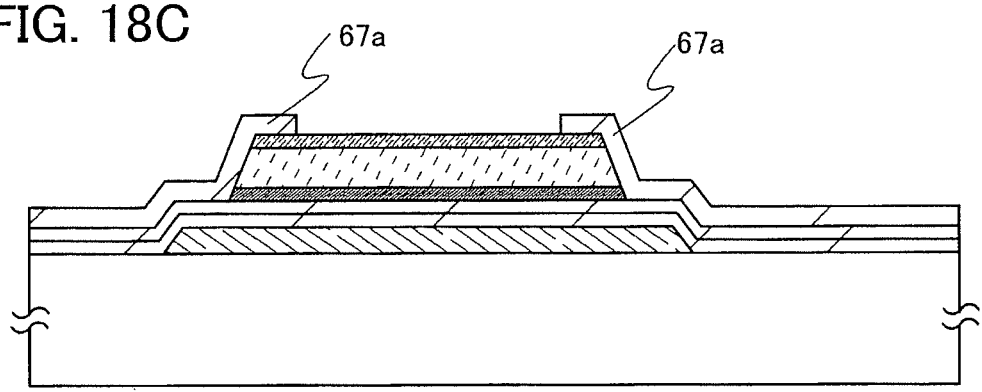

Then, as illustrated in FIG. 18C, the insulating film 67 is etched using the resist mask 68 to form the insulating film 67a which covers an end portion of the impurity semiconductor film 63 to which an impurity imparting one conductivity type is added.

Figure 19A:
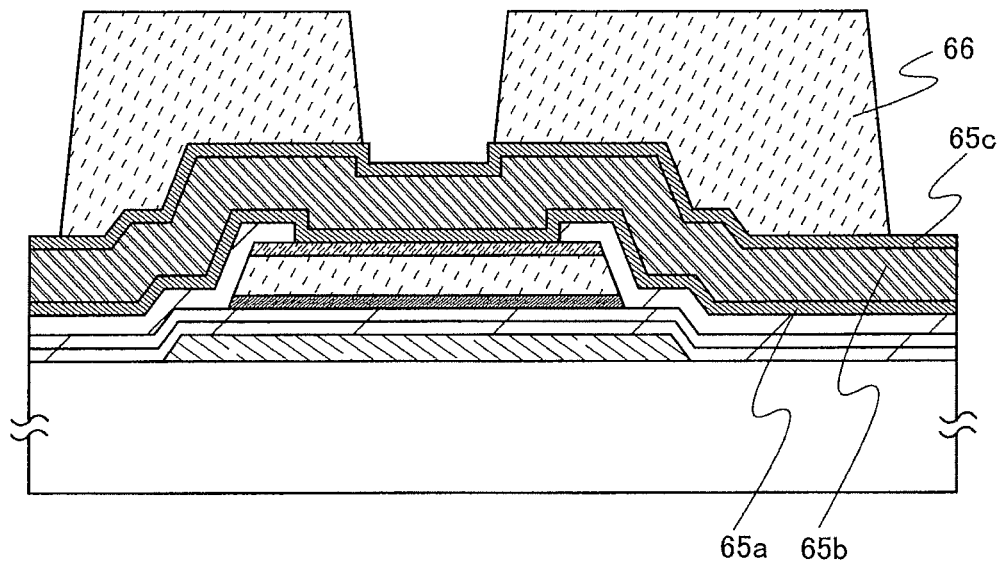
FIGS. 19A and 19B are cross-sectional views illustrating the method for manufacturing the display device according to the present invention.

Then, as illustrated in FIG. 19A, the conductive films 65a to 65c are formed over the insulating film 67a and the impurity semiconductor film 63 to which the impurity element imparting one conductivity type is added as in Embodiment Mode 3, and the resist mask 66 is formed over the conductive films 65a to 65c.

Figure 19B:
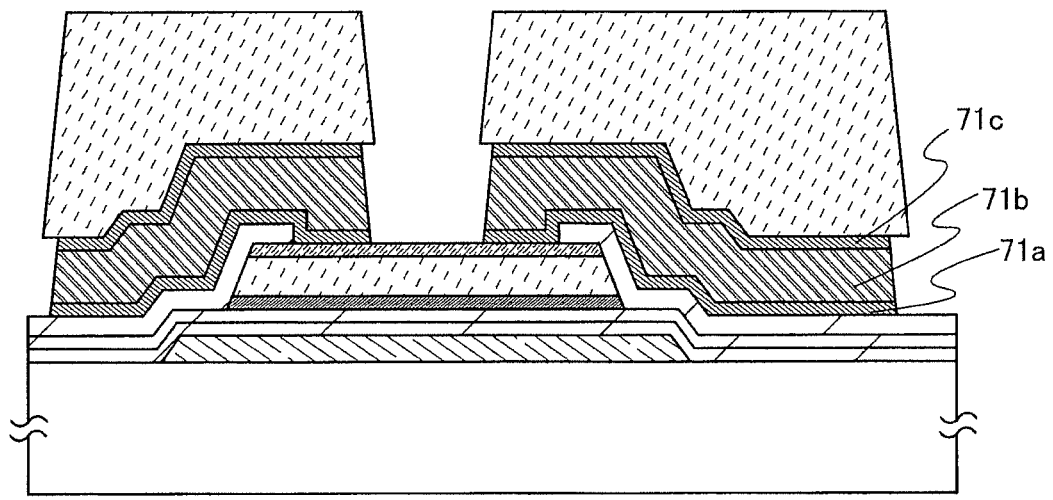

Then, as illustrated in FIG. 19B, the wirings 71a to 71c are formed by etching the conductive films 65a to 65c using the resist mask 66.

Figure 20A:
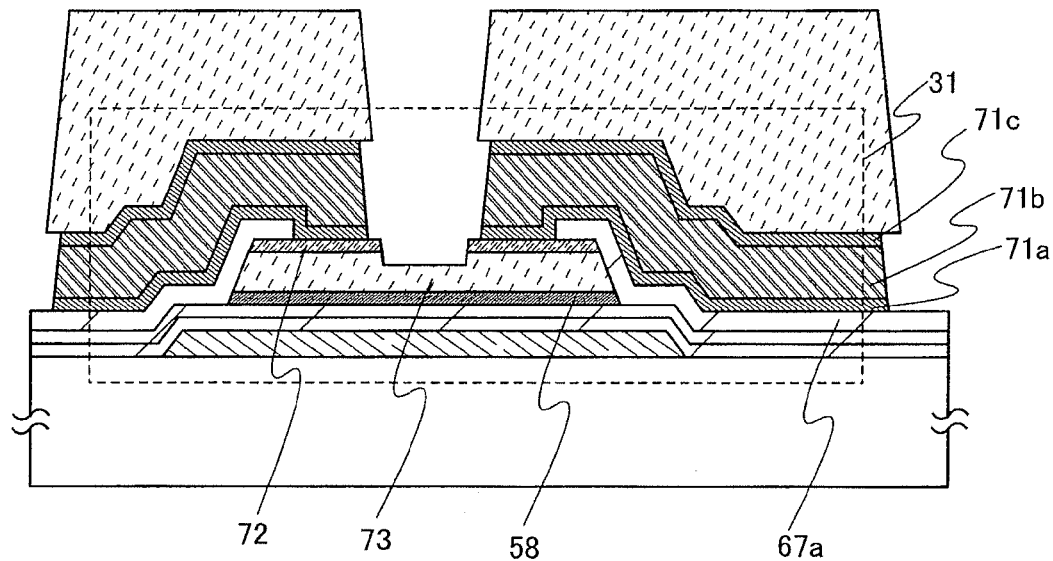
FIGS. 20A to 20C are cross-sectional views illustrating the method for manufacturing the display device according to the present invention.
Figure 20B:
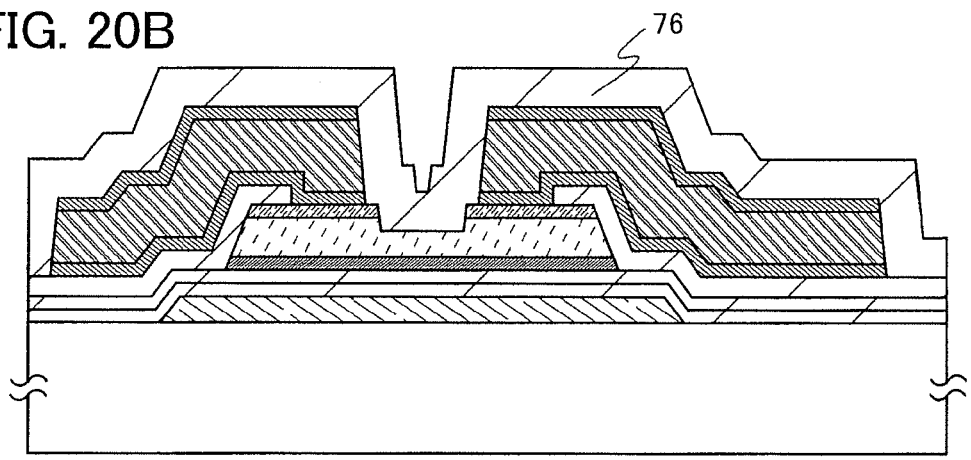

Then, the impurity semiconductor film 63 to which an impurity element imparting one conductivity type is added is etched and separated using the resist mask 66. As a result, the pair of source and drain regions 72 can be formed as illustrated in FIG. 20A. Note that in this etching process, the buffer layer 42 is also partly etched. The buffer layer which is partly etched and has a depressed portion is referred to as the buffer layer 73.

Through the above-described process, a channel-etched thin film transistor 31 can be formed. Since the semiconductor film 58 containing germanium at a concentration greater than or equal to 5 at. % and less than or equal to 100 at. % or the conductive film 58 and the wirings 71a to 71c are isolated by the insulating film 67a, leakage current between the semiconductor film 58 containing germanium at a concentration greater than or equal to 5 at. % and less than or equal to 100 at. % or the conductive film 58 and the wirings 71a to 71c can be reduced. Accordingly, a thin film transistor with low off current can be formed.

Figure 20C:
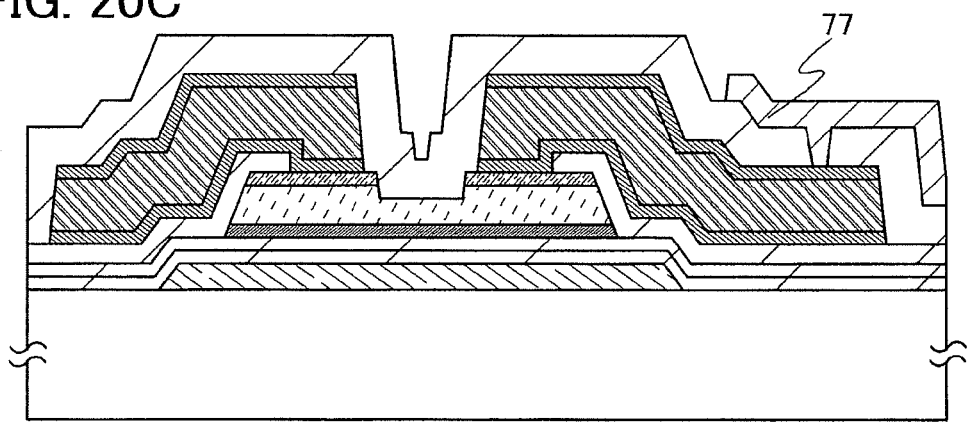

Then, a protective insulating film 76 is formed over the wiring 71c, the gate insulating film 52b and the buffer layer 73 in a manner similar to that in Embodiment Mode 3. Then, the protective insulating film 76 is partly etched to form a contact hole and expose the wiring 71c partly. Then, as illustrated in FIG. 20C, the pixel electrode 77 is formed in the contact hole as in Embodiment Mode 3. Through the above-described process, an element substrate can be manufactured.

Through the above-described process, an element substrate having a thin film transistor with low off current can be manufactured. By using the element substrate, a display device with high contrast can be manufactured.

Embodiment Mode 6

Next, a method for manufacturing a channel-protective thin film transistor, as illustrated in FIG. 4, in which leakage current can be reduced is described below.

In a manner similar to that of Embodiment Mode 3, a gate electrode 51 and gate insulating films 52a and 52b are formed over a substrate 50. Then, through a process similar to the process in Embodiment Mode 5, a semiconductor film containing germanium at a concentration greater than or equal to 5 at. % and less than or equal to 100 at. % or a conductive film is formed over the gate insulating film 52b. Then, a buffer layer is formed over the semiconductor film. Then, a resist mask is formed over the buffer layer, and then the buffer layer and the semiconductor film containing germanium at a concentration greater than or equal to 5 at. % and less than or equal to 100 at. % or the conductive film are etched to form the semiconductor film 58 containing germanium at a concentration greater than or equal to 5 at. % and less than or equal to 100 at. % or the conductive film 58 and a buffer layer 42.

Figure 21A:
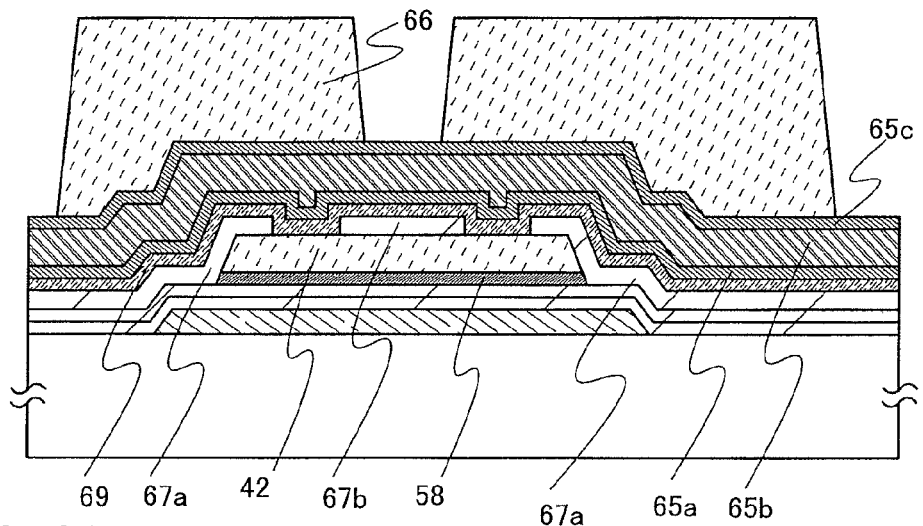
FIGS. 21A to 21C are cross-sectional views illustrating a method for manufacturing a display device according to the present invention.

Then, the insulating film 67 as illustrated in FIG. 18B is formed over the buffer layer 42, and the gate insulating film 52b. Then, a resist mask is formed over the insulating film 67 and the insulating film 67 is etched using the resist mask to form the insulating films 67a and 67b as illustrated in FIG. 21A. Note that one contact hole may be formed around the insulating film 67b. In that case, the insulating film 67a and the insulating film 67b are separated. Alternatively, a pair of contact holes may be formed. In that case, the insulating film 67a and the insulating film 67b are connected to each other. As a result, the insulating film 67a which covers an end portion of the buffer layer can be formed over the buffer layer 42 as well as the insulating film 67b which serves as a channel protection film in the thin film transistor which is completed later.

Then, an impurity semiconductor film 69 to which an impurity element imparting one conductivity type is added is formed over an exposed portion of the buffer layer 42, and the insulating films 67a and 67b. The impurity semiconductor film 69 to which an impurity element imparting one conductivity type is added can be formed in a manner similar to the impurity semiconductor film 55 to which an impurity imparting one conductivity type is added, which is described in Embodiment Mode 3.

Then, conductive films 65a to 65c are formed over the impurity semiconductor film 69 to which an impurity element imparting one conductivity type is added. Then, a resist mask 66 is formed over the conductive films 65a to 65c.

Figure 21B:
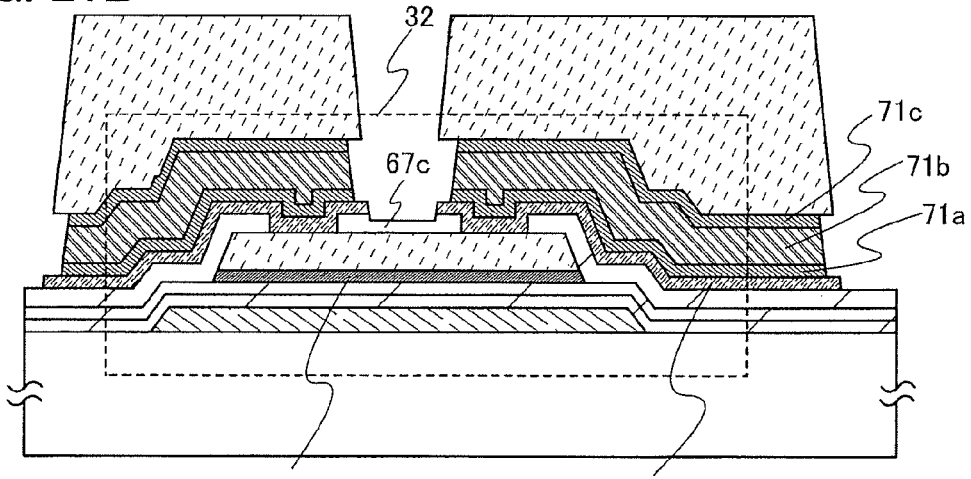

Then, as illustrated in FIG. 21B, the conductive films 65a to 65c are etched using the resist mask 66 to form wirings 71a to 71c. Then, the impurity semiconductor film 69 to which an impurity imparting one conductivity type is added is etched and separated using the resist mask 66. As a result, a pair of source and drain regions 70 can be formed as illustrated in FIG. 21B. Note that in this etching process, the insulating film 67b is also partly etched. The insulating film 67b which is partly etched and has a depressed portion is referred to as a channel protection film 67c.

Through the above-described process, a channel-protective thin film transistor 32 can be formed. Since the semiconductor film containing germanium at a concentration greater than or equal to 5 at. % and less than or equal to 100 at. % or the conductive film and the pair of source and drain regions 70 are isolated by the insulating film 67a, leakage current between the semiconductor film 58 containing germanium at a concentration greater than or equal to 5 at. % and less than or equal to 100 at. % or the conductive film 58 and the pair of source and drain regions 70 can be reduced. Accordingly, a thin film transistor with low off current can be formed. In addition, the channel protection film 67c can also be formed in formation of the insulating film 67a for reducing leakage current.

Figure 21C:
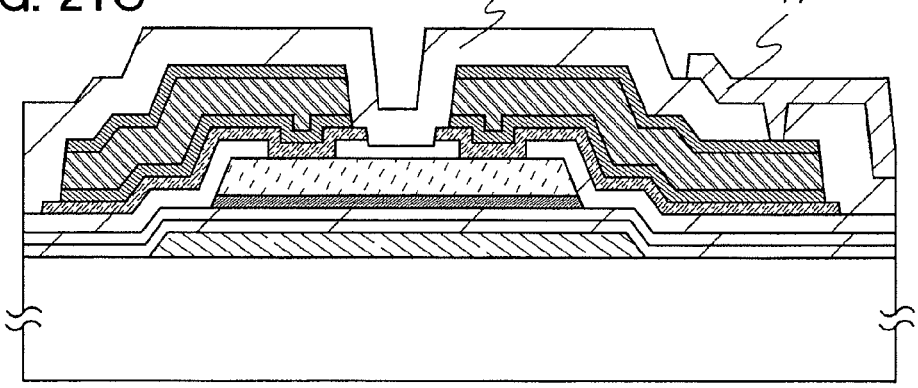

Then, the protective insulating film 76 and the pixel electrode 77 which is in contact with the wiring 71c via the protective insulating film 76 are formed as illustrated in FIG. 21C, whereby an element substrate can be manufactured.

Through the above-described process, an element substrate having a thin film transistor with low off current can be manufactured. By using the element substrate, a display device with high contrast can be manufactured.

Embodiment Mode 7

Next, a method for manufacturing a thin film transistor as illustrated in FIG. 5, in which leakage current can be reduced is described below.

After forming the wirings 71a to 71c, which are illustrated in FIG. 11C and described in Embodiment Mode 3, the wirings 92a to 92c, which are illustrated in FIG. 16B and described in Embodiment Mode 4, the wirings 71a to 71c, which are illustrated in FIG. 19B and described in Embodiment Mode 5, or the wirings 71a to 71c, which are illustrated in FIG. 4 and described in Embodiment Mode 6; a resist mask 66 or 86 is removed. Then, impurity semiconductor films 63 and 69 to which an impurity element imparting one conductivity type is added may be etched using the wirings 71a to 71c or the wiring 92a to 92c as a mask. As a result, the thin film transistor as illustrated in FIG. 5 in which end portions of the wirings 71a to 71c or 92a to 92c are aligned with end portions of the source and drain regions 70, 72, or 88 can be formed.

Embodiment Mode 8

Figure 7:
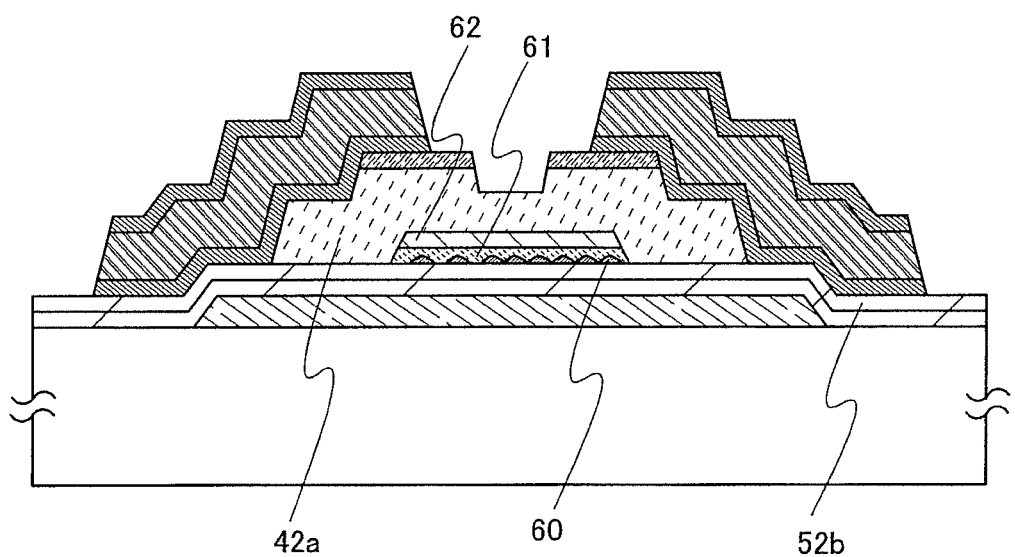
FIG. 7 is a cross-sectional view illustrating a thin film transistor according to the present invention.

Next, a method for manufacturing a thin film transistor as illustrated in FIG. 7, in which leakage current can be reduced is described below.

Described in FIG. 7 is one mode of a thin film transistor in which conductive particles 60 are dispersed over a gate insulating film 52b and in which a semiconductor film 61 containing germanium as its main component, covering the conductive particles 60 and the gate insulating film 52b is included, instead of the semiconductor film 58 containing germanium at a concentration greater than or equal to 5 at. % and less than or equal to 100 at. % or the conductive film 58 of the thin film transistors described in Embodiment Mode 1 to Embodiment Mode 7. Further a buffer layer 62 in contact with the semiconductor film 61 containing germanium as its main component is formed. Further, a buffer layer 42a covering side of the semiconductor film 61 containing germanium as its main component and top and side of the buffer layer 62.

The conductive particles 60 are formed by a thermal CVD method, a plasma CVD method, an ECRCVD method, an ion plating method, a sputtering method, a vacuum deposition method, or the like.

Next, by forming the film containing germanium as its main component over the conductive particles 60, adhesion of the film containing germanium as its main component can be improved. Further, crystal growth is performed using the conductive particles 60 as crystal nuclei, whereby a microcrystal germanium film is formed as the semiconductor film 61 containing germanium as its main component.

When the semiconductor film 61 is formed by a CVD method, hydrogen is introduced to a reaction chamber of a plasma CVD apparatus together with a deposition gas containing germanium, a high-frequency power is applied to generate plasma, and an amorphous germanium film or a microcrystalline germanium film is formed as the semiconductor film 61 containing germanium as its main component. Alternatively, a deposition gas containing silicon is used together with hydrogen and a deposition gas containing germanium to form an amorphous silicon germanium film or a microcrystalline silicon germanium film.

Note that as one mode of forming an amorphous germanium film as the semiconductor film 61 containing germanium as its main component, an amorphous germanium film can be formed by glow discharge plasma using a deposition gas containing germanium in a reaction chamber. Alternatively, by dilution of a deposition gas containing germanium with one or plural kinds of rare gases selected from helium, argon, krypton, and neon, and by glow discharge plasma, an amorphous germanium film can be formed. Furthermore, an amorphous germanium film can be formed by glow discharge plasma using hydrogen with a flow rate greater than or equal to 1 and less than or equal to 10 times, preferably greater than or equal to 1 and less than or equal to 5 times as high as that of a deposition gas containing germanium. In addition, by using a deposition gas containing silicon together with a hydrogen and deposition gas containing germanium, an amorphous silicon germanium film can be formed as the semiconductor film 61 containing germanium as its main component.

Further, as one mode of forming a microcrystalline germanium film as the semiconductor film 61 containing germanium as its main component, a deposition gas containing germanium, which is germane here, and hydrogen and/or a rare gas are mixed, and a microcrystalline germanium film is formed by glow discharge plasma. Germane is diluted with hydrogen and/or a rare gas to be 10 times to 2000 times thinner. Therefore, a large amount of hydrogen and/or a rare gas is needed. The substrate heating temperature is 100° C. to 400° C., preferably 250° C. to 350° C. Further, by using a deposition gas containing silicon together with hydrogen and a deposition gas containing germanium, a microcrystalline silicon germanium film is formed as the semiconductor film 61 containing germanium as its main component.

In the step of forming the semiconductor film 61 containing germanium as its main component, glow discharge plasma is generated by applying high-frequency power with a frequency of 1 MHz to 20 MHz, typically 13.56 MHz, or high-frequency power with a frequency of more than 20 MHz to about 120 MHz, typically 27.12 MHz or 60 MHz. Alternatively, high-frequency plasma, for example, with a frequency of 1 GHz or 2.45 GHz can be employed.

After forming the conductive particles and the semiconductor film containing germanium as its main component, instead of the semiconductor film 45 containing germanium at a concentration greater than or equal to 5 at. % and less than or equal to 100 at. % or the conductive film 45 which are described in Embodiment Mode 3, the thin film transistor illustrated in FIG. 7 can be manufactured in a process similar to that in Embodiment Mode 3. Further, the thin film transistor can be formed in a process similar to that in any of Embodiment Modes 4 to 7.

Embodiment Mode 9

In this embodiment mode, a preferred mode of Embodiment Modes 1 to Embodiment Mode 8 is described with reference to FIGS. 25A and 25B.

Figure 25A:
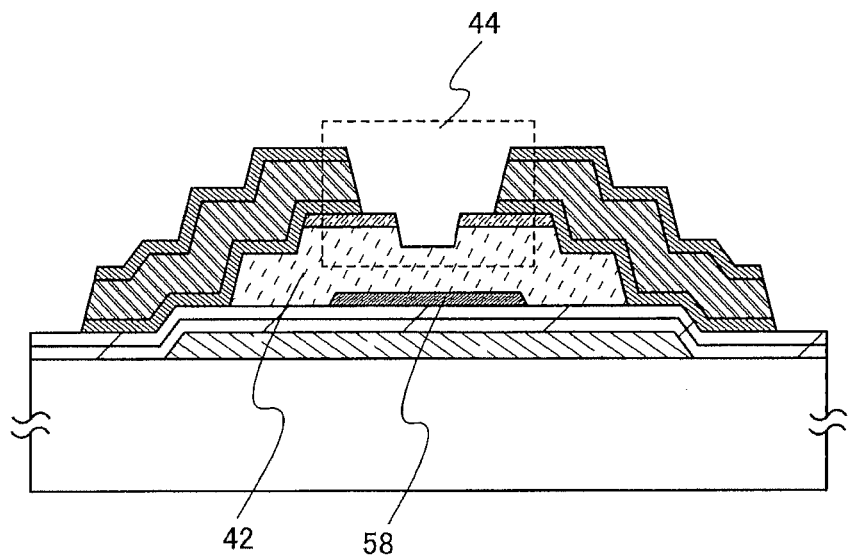
FIGS. 25A and 25B are cross-sectional views illustrating a thin film transistor according to the present invention.
Figure 25B:
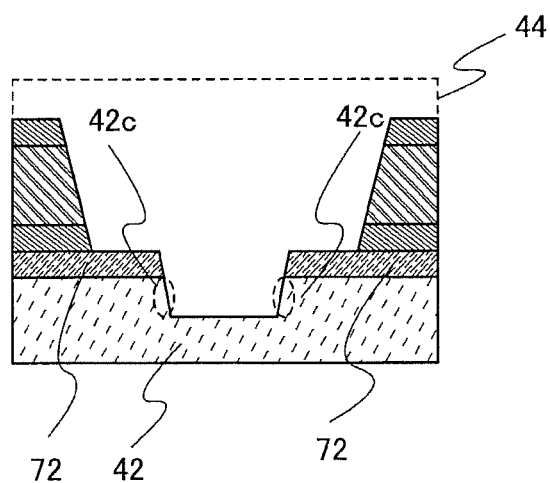

FIG. 25A illustrates one mode of a thin film transistor of the present invention. FIG. 25B is an enlarged view 44 of an upper portion of the buffer layer 42.

In the present invention, the buffer layer 42 has a depressed portion in its upper portion. This is because in formation of the pair of source and drain regions 72 by etching an impurity semiconductor film to which an impurity element imparting one conductivity type is added, the buffer layer is also partly etched. In an etching step for forming the pair of source and drain regions 72, it is preferable to perform anisotropic etching. As anisotropic etching, reactive ion beam etching (RIBE) using electronic cyclotron resonance (ECR) plasma, inductively coupled plasma (ICP) etching, or the like may be used. As a result, the depressed portion of the buffer layer 42 has a side surface 42c having an angle of 70° or more and 90° or less, preferably 80° or more and 90° or less to the substrate surface, whereby etching damage to the side surface 42c in the depressed portion can be reduced.

The side surface 42c of the depressed portion of the buffer layer 42 is a region where carriers flow when positive or negative voltage is applied to a gate electrode 51. In this region, if there is a few defects due to etching damage, carriers are not easily trapped and can easily move when positive voltage is applied to the gate electrode 51. Therefore, ON current and field effect mobility can be improved, which is preferable.

With the above-described structure, a thin film transistor with higher ON current and higher field effect mobility can be manufactured.

Embodiment Mode 10

In this embodiment mode, a step before formation of the semiconductor film 45 containing germanium at a concentration greater than or equal to 5 at. % and less than or equal to 100 at. % or the conductive film 45 described in Embodiment Mode 3 to Embodiment Mode 9 is described below. Here, Embodiment Mode 3 is used for description as a typical example, but this embodiment mode can be applied to any of Embodiment Modes 4 to 9 as appropriate.

As illustrated in FIG. 10A, the gate electrode 51 is formed over the substrate 50, and the gate insulating films 52a and 52b are formed over the gate electrode 51.

Next, a surface of the gate insulating film 52b is subjected to plasma treatment. Typically, the surface of the gate insulating film 52b is exposed to plasma, such as hydrogen plasma, ammonia plasma, helium plasma, argon plasma, or neon plasma. As plasma treatment, a substrate provided with the gate insulating film 52b is placed in a reaction chamber. In addition, a gas such as hydrogen, ammonia, helium, argon, or neon is introduced into the reaction chamber, and glow discharge is carried out, whereby plasma such as hydrogen plasma, ammonia plasma, helium plasma, argon plasma, or neon plasma is generated and a surface of the gate insulating film can be exposed to the plasma.

By exposing the surface of the gate insulating film 52b to plasma such as hydrogen plasma, ammonia plasma, helium plasma, argon plasma, or neon plasma, defects of the surface of the gate insulating film can be reduced. Typically, dangling bonds on the surface of the gate insulating film 52b can be terminated. Then, a semiconductor film containing germanium at a concentration greater than or equal to 5 at. % and less than or equal to 100 at. % or a conductive film is formed, thus, defects at the interface of the gate insulating film 52b and the semiconductor film containing germanium at a concentration greater than or equal to 5 at. % and less than or equal to 100 at. % or the conductive film can be reduced. Accordingly, trapping of carriers by defects can be reduced, whereby ON current can be improved.

Embodiment Mode 11

In this embodiment mode, a film formation apparatus which can be used in a film formation process of the above embodiment modes and flow of a substrate therein are described below.

Description is made of a structure suitable for forming a gate insulating film, a semiconductor film containing germanium at a concentration greater than or equal to 5 at. % and less than or equal to 100 at. % or a conductive film, a buffer layer, and an impurity semiconductor film to which an impurity element imparting one conductivity type is added, as an example of a plasma CVD apparatus which can be used for a film formation process of this embodiment mode. In this embodiment mode, as examples of the gate insulating film and the semiconductor film containing germanium at a concentration greater than or equal to 5 at. % and less than or equal to 100 at. % or the conductive film, a gate insulating film and a semiconductor film containing germanium at a concentration greater than or equal to 5 at. % and less than or equal to 100 at. % are described.

Figure 22:
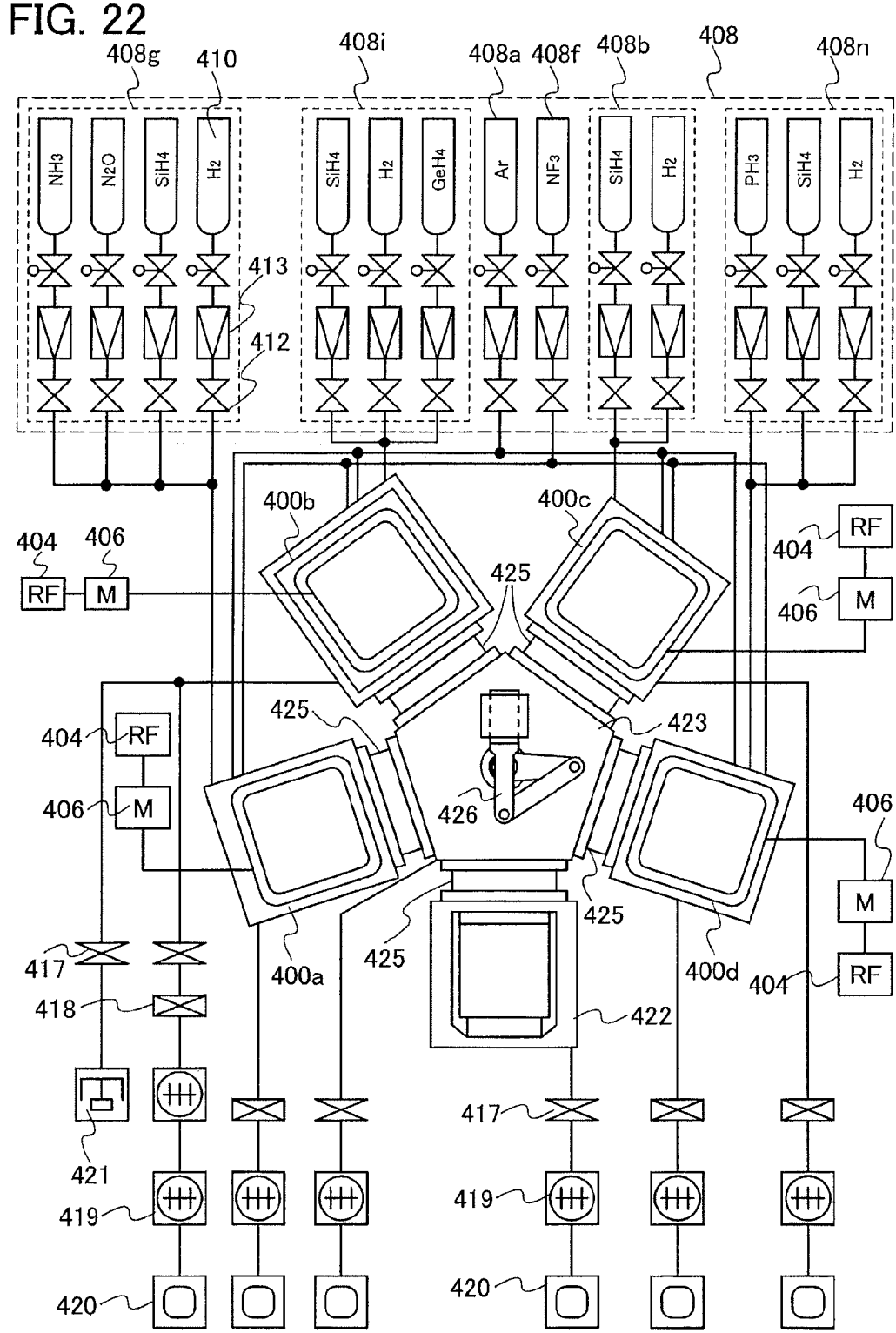
FIG. 22 is a drawing illustrating a structure of a plasma CVD apparatus applicable to the present invention.

FIG. 22 illustrates an example of a multi-chamber plasma CVD apparatus having a plurality of reaction chambers. The apparatus is provided with a common chamber 423, a load/unload chamber 422, a first reaction chamber 400a, a second reaction chamber 400b, a third reaction chamber 400c, and a fourth reaction chamber 400d. This apparatus is a single wafer-processing type in which a substrate set in a cassette in the load/unload chamber 422 is transferred to/from each reaction chamber by a transfer mechanism 426 in the common chamber 423. A gate valve 425 is provided between the common chamber 423 and each chamber so that treatment performed in the chambers does not interfere with each other.

Each reaction chamber is used for a different purpose, depending on the kinds of thin films to be formed. For example, an insulating film such as a gate insulating film is formed in the first reaction chamber 400a, a semiconductor film containing germanium at a concentration greater than or equal to 5 at. % and less than or equal to 100 at. % is formed in the second reaction chamber 400b, a buffer layer which serves as a high resistance region of a thin film transistor is formed in the third reaction chamber 400c, and an impurity semiconductor film to which an impurity element functioning as a donor and imparting one conductivity type is added, which forms a source and a drain, is formed in the fourth reaction chamber 400d. Needless to say, the number of reaction chambers is not limited to four and may be increased or decreased as necessary.

A turbo-molecular pump 419 and a dry pump 420 are connected to each reaction chamber as an evacuation means. The evacuation means is not limited to a combination of these vacuum pumps and can be other vacuum pumps as long as they can evacuate the reaction chamber to a pressure of about $10^{-1}$ Pa to $10^{-5}$ Pa. A butterfly valve 417 which can interrupt vacuum evacuation is provided between the evacuation means and each reaction chamber. A conductance valve 418 can control an evacuation speed to adjust the pressure in each reaction chamber.

Note that the second reaction chamber 400b in which a semiconductor film containing germanium at a concentration greater than or equal to 5 at. % and less than or equal to 100 at. % is formed may be connected to a cryopump 421 which performs vacuum evacuation to an ultra-high vacuum. By using the cryopump 421, the reaction chamber can be evacuated to an ultra-high vacuum of a pressure of lower than $10^{-5}$ Pa. In this embodiment mode, the pressure in the reaction chamber is set to be at an ultra-high vacuum lower than $10^{-5}$ Pa, which is effective in reduction of the oxygen concentration and the nitrogen concentration in the semiconductor film containing germanium at a concentration greater than or equal to 5 at. % and less than or equal to 100 at. %. As a result, the oxygen concentration in the semiconductor film containing germanium at a concentration greater than or equal to 5 at. % and less than or equal to 100 at. % can be set to less than or equal to $1\times10^{16}$ at./cm$^3$. When the semiconductor film containing germanium at a concentration greater than or equal to 5 at. % and less than or equal to 100 at. % is formed of a microcrystalline semiconductor film, by reducing concentrations of oxygen and nitrogen in the microcrystalline semiconductor film, a defect in the film is reduced and then crystallinity thereof can be increased, whereby the mobility of a carrier can be improved.

The gas supply means 408 includes the cylinder 410 which is filled with a gas used for the process, such as a rare gas or a semiconductor source gas typified by silane or germane, the stop valve 412, the mass flow controller 413, and the like. A gas supply means 408g is connected to the first reaction chamber 400a and supplies a gas for depositing the gate insulating film. A gas supply means 408i is connected to the second reaction chamber 400b and supplies a gas for forming the semiconductor film containing germanium at a concentration greater than or equal to 5 at. % and less than or equal to 100 at. % or the conductive film. A gas supply means 408b is connected to the third reaction chamber 400c and supplies a gas for forming a buffer layer. A gas supply means 408n is connected to the fourth reaction chamber 400d and supplies a gas for forming an n-type semiconductor film, for example. A gas supply means 408a supplies argon, a gas supply means 408f is a system for supplying an etching gas used for cleaning the reaction chamber. These are common lines for reaction chambers.

A high-frequency power supply means for generating plasma is connected to each reaction chamber. The high-frequency power supply means includes a high-frequency power source 404 and a matching box 406.

Each reaction chamber can be used for a different purpose depending on the kinds of thin films to be formed. Since each thin film has an optimum temperature for formation, the reaction chambers are provided separately, so that formation temperatures can be easily controlled. Further, the same kind of films can be repeatedly deposited, so that influence of residual impurities attributed to a film formed previously can be excluded. Particularly, in the case of the semiconductor film containing germanium at a concentration greater than or equal to 5 at. % and less than or equal to 100 at. %, it is possible to prevent germanium from mixing into the buffer layer. Therefore, the concentration of an impurity in the buffer layer can be reduced, and off current in the thin film transistor can be reduced.

Then, one mode of a plasma CVD apparatus in which a gate insulating film, a semiconductor film containing germanium at a concentration greater than or equal to 5 at. % and less than or equal to 100 at. %, a buffer layer, and an impurity semiconductor film to which an impurity element imparting one conductivity type is added are formed successively in one reaction chamber is described with reference to FIG. 23.

The apparatus is provided with the common chamber 423, the load/unload chamber 422, a waiting chamber 401, and the reaction chamber 400a. This apparatus is a single wafer-processing type in which a substrate set in a cassette in the load/unload chamber 422 is transferred to/from each chamber by the transfer mechanism 426 in the common chamber 423. The gate valve 425 is provided between the common chamber 423 and each chamber so that treatment performed in the chambers does not interfere with each other.

The turbo-molecular pump 419 and the dry pump 420 are connected to the reaction chamber 400a as an evacuation means. The evacuation means is not limited to the combination of these vacuum pumps, and may be another vacuum pump as long as the evacuation can be performed to attain a degree of vacuum of about from $10^{-1}$ Pa to $10^{-5}$ Pa. The butterfly valve 417, which can interrupt vacuum evacuation, is provided between the evacuation means 430 and the reaction chamber. The conductive valve 418 can control an evacuation speed to adjust the pressure in each reaction chamber. Further, the cryopump 421 may be connected to the reaction chamber 400a.

The gas supply means 408 includes the cylinder 410 in which a gas used for the process, such as hydrogen or a semiconductor source gas typified by silane and germane is filled, the stop valve 412, the mass flow controller 413, and the like. The gas supply means 408g, 408i, 408a, 408n, and 408f are connected to the reaction chamber 400a.

A high-frequency power supply means 403 for generating plasma is connected to each reaction chamber. A high-frequency power supply means 403 includes the high-frequency power source 404 and the matching box 406.

Figure 23:
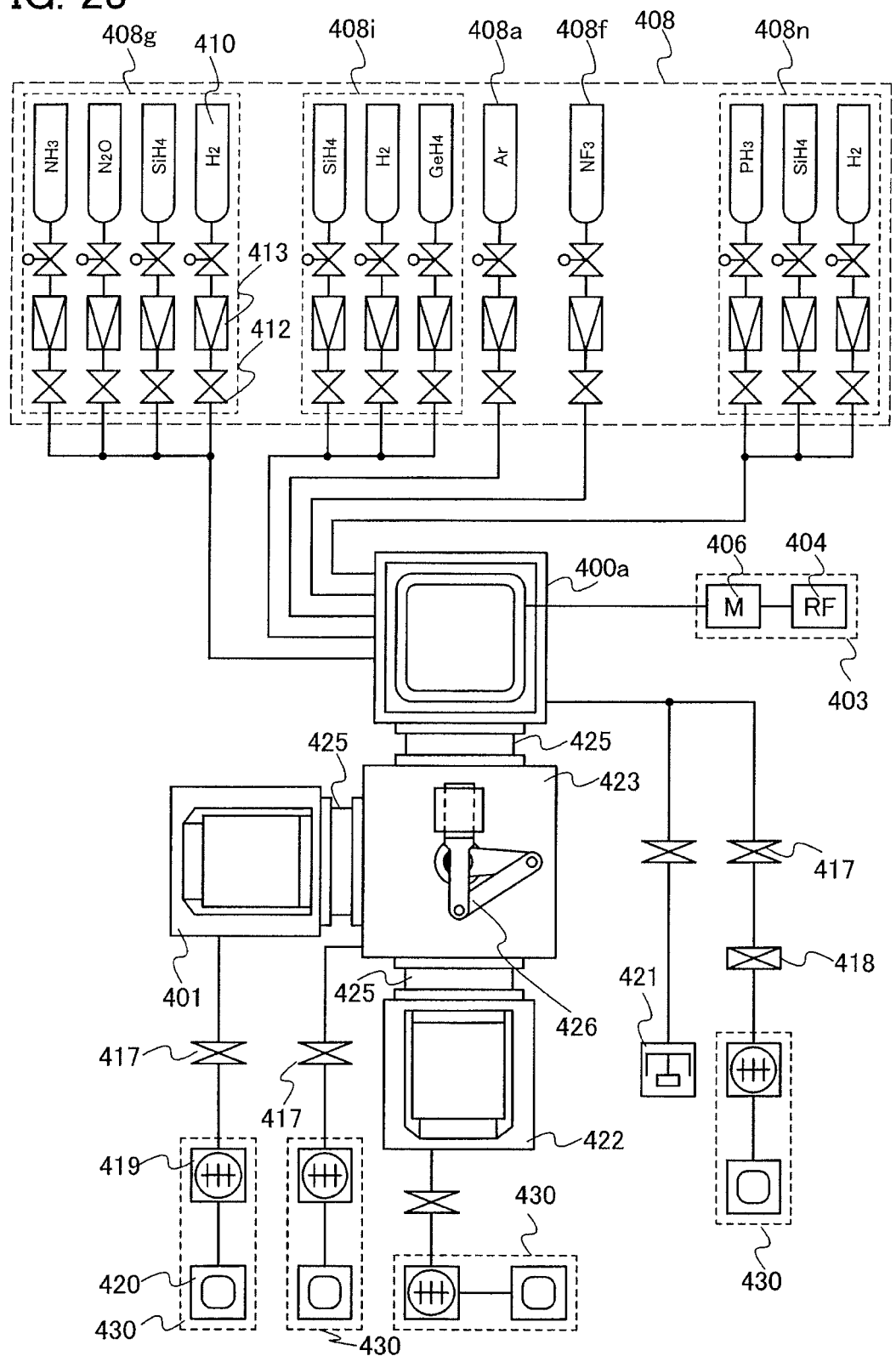
FIG. 23 is a drawing illustrating a structure of a plasma CVD apparatus applicable to the present invention.

Next, a process for forming a plurality of films successively by the plasma CVD apparatus illustrated in FIG. 23 is described with reference to FIGS. 24A to 24C.

Figure 24B:
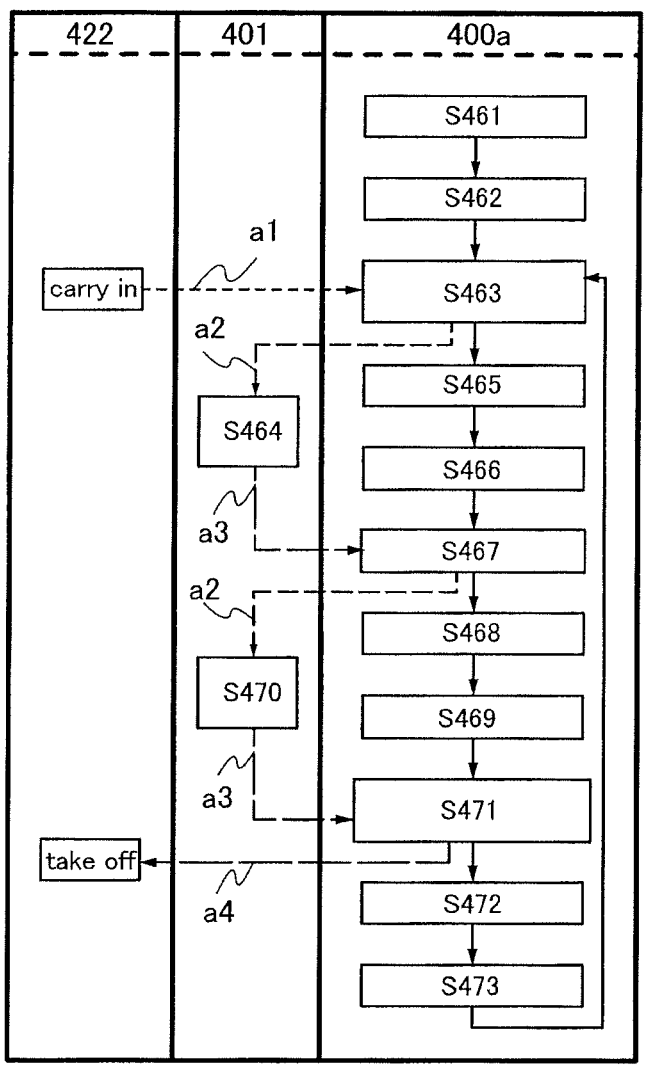
FIGS. 24A to 24C are diagrams illustrating a structure of a plasma CVD apparatus and deposition procedures, which can be applied to the present invention.
Figure 24A:
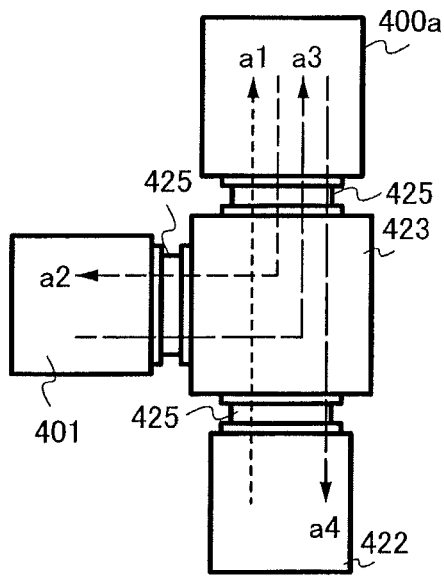

FIG. 24A illustrates the plasma CVD apparatus of FIG. 23 in a simplified manner. FIG. 24B is a schematic view illustrating a process for successively forming a gate insulating film and a semiconductor film containing germanium at a concentration greater than or equal to 5 at. % and less than or equal to 100 at % (hereinafter, referred to as a μc-Ge film) over a substrate provided with a gate electrode. An arrow of a dotted line indicates flow of the substrate and an arrow of a solid line indicates flow of the forming process.

As illustrated in FIG. 24B, the inner wall of the reaction chamber 400a is cleaned with fluorine radicals or the like (S461), to remove residual impurities in the reaction chamber 400a. Then, the inner wall of the reaction chamber 400a is coated with a film which is similar to the gate insulating film (S462). Due to this coating step, metals which form the reaction chamber 400a can be prevented from mixing into the gate insulating film as impurities.

Then, the substrate set in the cassette in the load/unload chamber 422 is transferred to the reaction chamber 400a by the transfer mechanism 426 in the common chamber 423 as indicated by the arrow a1. Then, the gate insulating film, which is a silicon oxynitride film here, is formed over the substrate in the reaction chamber 400a (S463).

Next, the substrate over which the gate insulating film is formed is transferred to the waiting chamber 401 by the transfer mechanism 426 in the common chamber 423 as indicated by an arrow a2, and the substrate is kept in waiting state (S464). Then, the inner wall of the reaction chamber 400a is cleaned with fluorine radicals or the like (S465) to remove residual impurities in the reaction chamber 400a. Then, the inner wall of the reaction chamber 400a is coated with an amorphous semiconductor film (S466). By this cleaning and coating, components (oxygen, nitrogen, or the like) of the gate insulating film which is deposited on the inner wall of the reaction chamber 400a and metals which form the reaction chamber 400a can be prevented from mixing, as impurities, into the semiconductor film containing germanium at a concentration greater than or equal to 5 at. % and less than or equal to 100 at. %. In addition, in the case where the semiconductor film containing germanium at a concentration greater than or equal to 5 at. % and less than or equal to 100 at. % is formed of a microcrystalline semiconductor film, the crystallinity of the microcrystalline semiconductor film can be improved. Then, the substrate is transferred to the reaction chamber 400a by the transfer mechanism 426 in the common chamber 423, as indicated by an arrow a3, to form the semiconductor film containing germanium at a concentration greater than or equal to 5 at. % and less than or equal to 100 at. % in the reaction chamber 400a (S467). Here, as the semiconductor film containing germanium at a concentration greater than or equal to 5 at. % and less than or equal to 100 at. %, germane and hydrogen are used as a source gas, and a microcrystalline germanium film is formed.

Then the substrate over which the semiconductor film containing germanium at a concentration greater than or equal to 5 at. % and less than or equal to 100 at. % is formed is transferred to the waiting chamber 401 by the transfer mechanism 426 in the common chamber 423 as indicated by the arrow a2 (S470). After that, the inner wall of the reaction chamber 400a is cleaned with fluorine radicals or the like (S468) to remove residual impurities in the reaction chamber 400a. Then, the inner wall of the reaction chamber 400a is coated with an amorphous semiconductor film (S469). By this cleaning and coating, metals which form the reaction chamber 400a can be prevented from mixing, as impurities, into the amorphous semiconductor film which is formed later. Accordingly, the amorphous semiconductor film can serve as a high resistance region. Then, the substrate is transferred to the reaction chamber 400a by the transfer mechanism 426 in the common chamber 423, as indicated by the arrow a3, to form an amorphous semiconductor film as a first buffer layer in the reaction chamber 400a (S471). Here, as the amorphous semiconductor film, a silane and hydrogen are used as a source gas and an amorphous silicon film is formed.

The substrate over which the first buffer layer is formed is set in the cassette in the load/unload chamber 422 by the transfer mechanism 426 in the common chamber 423 as indicated by an arrow a4. Through the above-described process, the gate insulating film, the semiconductor film containing germanium at a concentration greater than or equal to 5 at. % and less than or equal to 100 at. %, and the first buffer layer can be formed successively over the substrate over which the gate electrode has been formed. Next, the inner wall of the reaction chamber 400a is cleaned with fluorine radicals or the like (S472) to remove residual impurities in the reaction chamber 400a. Then, the inner wall of the reaction chamber 400a is coated with a film which is similar to the gate insulating film (S473). Then, another substrate which is set in the cassette in the load/unload chamber 422 is transferred to the reaction chamber 400a, and the steps similar to the above steps are performed on the substrate, starting with film formation of a gate insulating film (S463), to successively form the gate insulating film, a semiconductor film containing germanium at a concentration greater than or equal to 5 at. % and less than or equal to 100 at. %, and a first buffer layer.

After the gate insulating films, the semiconductor films containing germanium at a concentration greater than or equal to 5 at. % and less than or equal to 100 at. %, and the first buffer layers are formed over all the substrates set in the cassette in the load/unload chamber 422, the cassette is transferred from the load/unload chamber 422 to be subjected to a next process.

Note that although the substrate over which the gate insulating film and the μc-Ge film is formed is kept in a waiting state in the waiting chamber 401, the substrate may be kept in a waiting state in the load/unload chamber 422. Thus, the plasma CVD apparatus can be simplified and cost can be reduced.

Figure 24C:
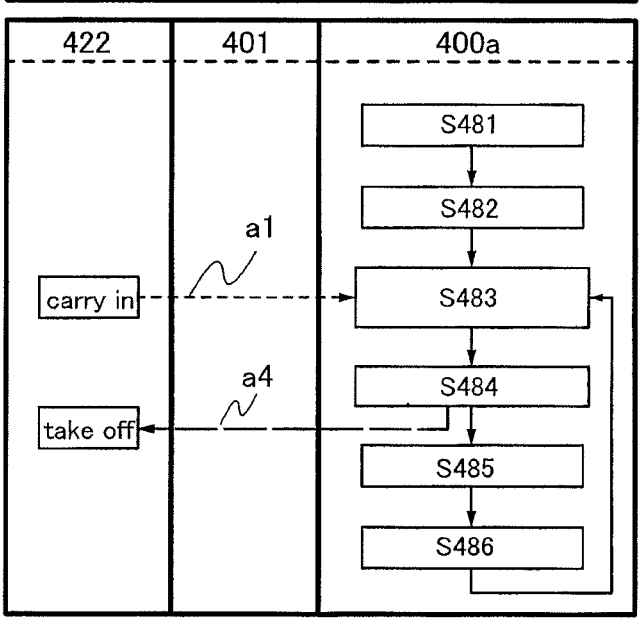

FIG. 24C illustrates a process for successively forming a second buffer layer and an impurity semiconductor film to which an impurity element imparting one conductivity type is added (hereinafter, referred to as an $n^+$ a-Si film) over the first buffer layer and the semiconductor layer containing germanium at a concentration greater than or equal to 5 at. % and less than or equal to 100 at. %, which has been formed to have an island shape. An arrow of a dotted line indicates flow of the substrate and an arrow of a solid line indicates flow of the forming process.

As illustrated in FIG. 24C, the inner wall of the reaction chamber 400a is cleaned with fluorine radicals or the like (S481), to remove residual impurities in the reaction chamber 400a. Then, the inner wall of the reaction chamber 400a is coated with a film which is similar to the second buffer layer (S482). Here, an amorphous silicon film is formed. By this coating step, metals which form the reaction chamber 400a can be prevented from mixing into the gate insulating film as impurities.

Then, the substrate set in the cassette in the load/unload chamber 422 is transferred to the reaction chamber 400a by the transfer mechanism 426 in the common chamber 423 as indicated by the arrow a1. Then, the second buffer layer, which is an amorphous silicon film here, is formed over the substrate in the reaction chamber 400a (S483).

Next, the impurity semiconductor film to which an impurity element imparting one conductivity type is added (here, referred to as the $n^+$ a-Si film) is formed over the substrate over which the second buffer layer has been formed (S484). Here, since the main components in the amorphous silicon film and the $n^+$ a-Si film are the same and the amorphous silicon does not contain any contaminant for the $n^+$ a-Si film, a coating step is not necessarily performed before formation of the $n^+$ a-Si film.

Next, the substrate over which the $n^+$ a-Si film has been formed is set in the cassette in the load/unload chamber 422 by the transfer mechanism 426 in the common chamber 423 as indicated by an arrow a4. Through the above-described process, the second buffer layer and the $n^+$ a-Si film can be formed successively over the substrate over which the island shaped semiconductor film containing germanium at a concentration greater than or equal to 5 at. % and less than or equal to 100 at. % has been formed. Next, the inner wall of the reaction chamber 400a is cleaned with fluorine radicals or the like (S485) to remove residual impurities in the reaction chamber 400a. Then, the inner wall of the reaction chamber 400a is coated with a film which is similar to the second buffer layer (S486). Then, another substrate which is set in the cassette in the load/unload chamber 422 is transferred to the reaction chamber 400a, and the steps similar to the above steps are performed on the substrate, starting with film formation of a second buffer layer (S483) to successively form a second buffer layer and the $n^+$ a-Si film.

After the second buffer layers and $n^+$ a-Si films are formed over all the substrates set in the cassette in the load/unload chamber 422, the cassette is transferred from the load/unload chamber 422 to be subjected to a next process.

Through the above-described process, a plurality of films can be formed successively without being exposed to the air. Further, the films can be formed without contaminants mixing into the films.

Note that a semiconductor film containing germanium at a concentration greater than or equal to 5 at. % and less than or equal to 100 at. % is used in this embodiment mode; however, a conductive film can be formed by using a source gas for the conductive film in a gas supply system. Further, a reaction chamber in which sputtering can be performed is connected to the film formation apparatus illustrated in FIG. 22, FIG. 23, and FIG. 24A, whereby the conductive film can be formed successively.

Embodiment Mode 12

In this embodiment mode, a liquid crystal display device including a thin film transistor described in the above-described embodiment modes will be described below as one mode of the display device. Here, a vertical alignment (VA) liquid crystal display device is described with reference to FIG. 26, FIG. 27 and FIG. 28. The VA mode is a kind of form in which orientation of liquid crystal molecules of a liquid crystal panel is controlled. The VA mode liquid crystal display device is a form in which liquid crystal molecules are vertical to a panel surface when voltage is not applied. In this embodiment mode, it is devised to particularly separate pixels into some regions (sub-pixels) so that molecules are aligned in different directions in the respective regions. This is referred to as multi-domain or multi-domain design. In the following description, a liquid crystal display device with multi-domain design is described.

Figure 26:
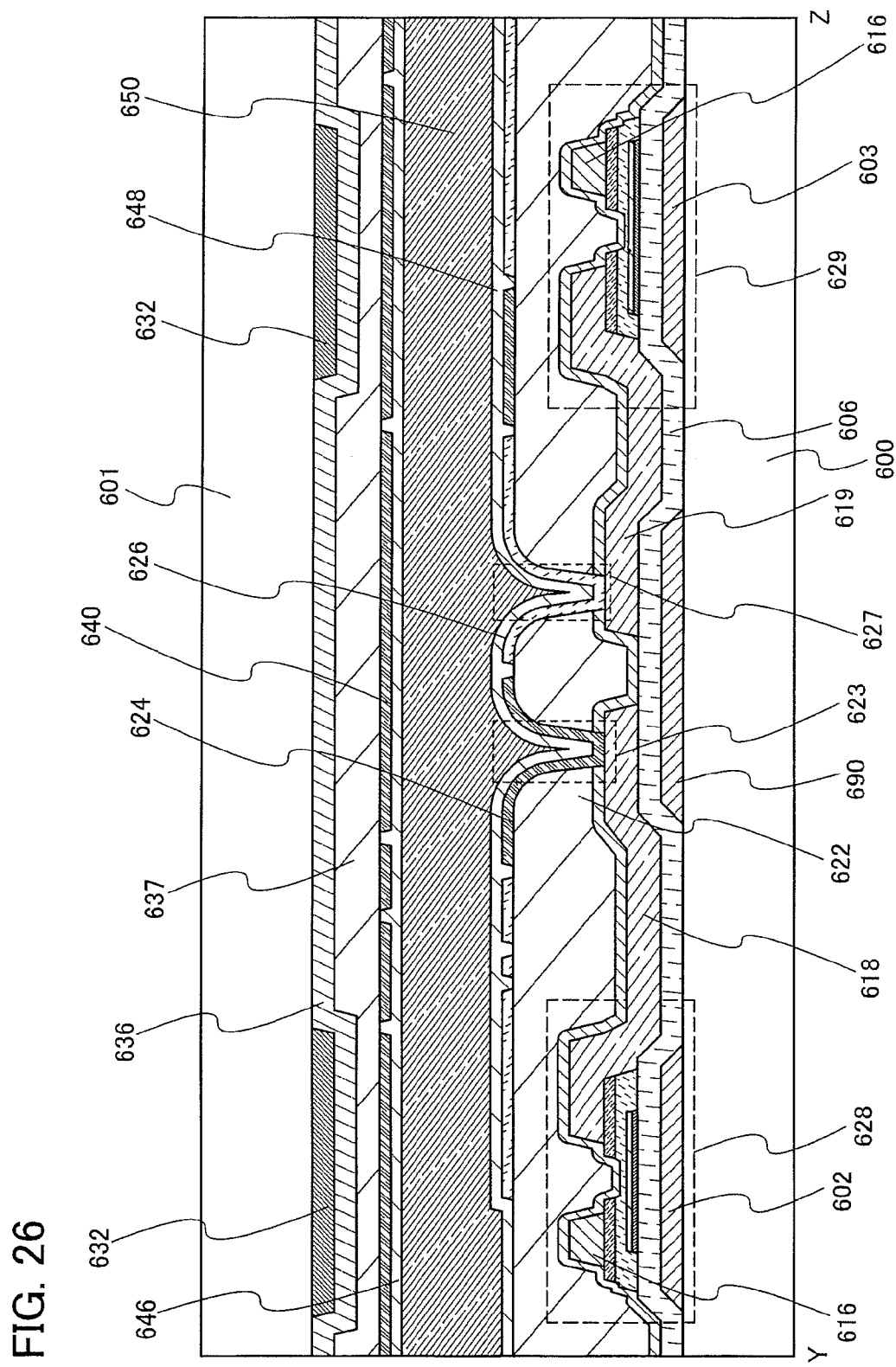
FIG. 26 is a cross-sectional view illustrating a display device according to the present invention.
Figure 27:
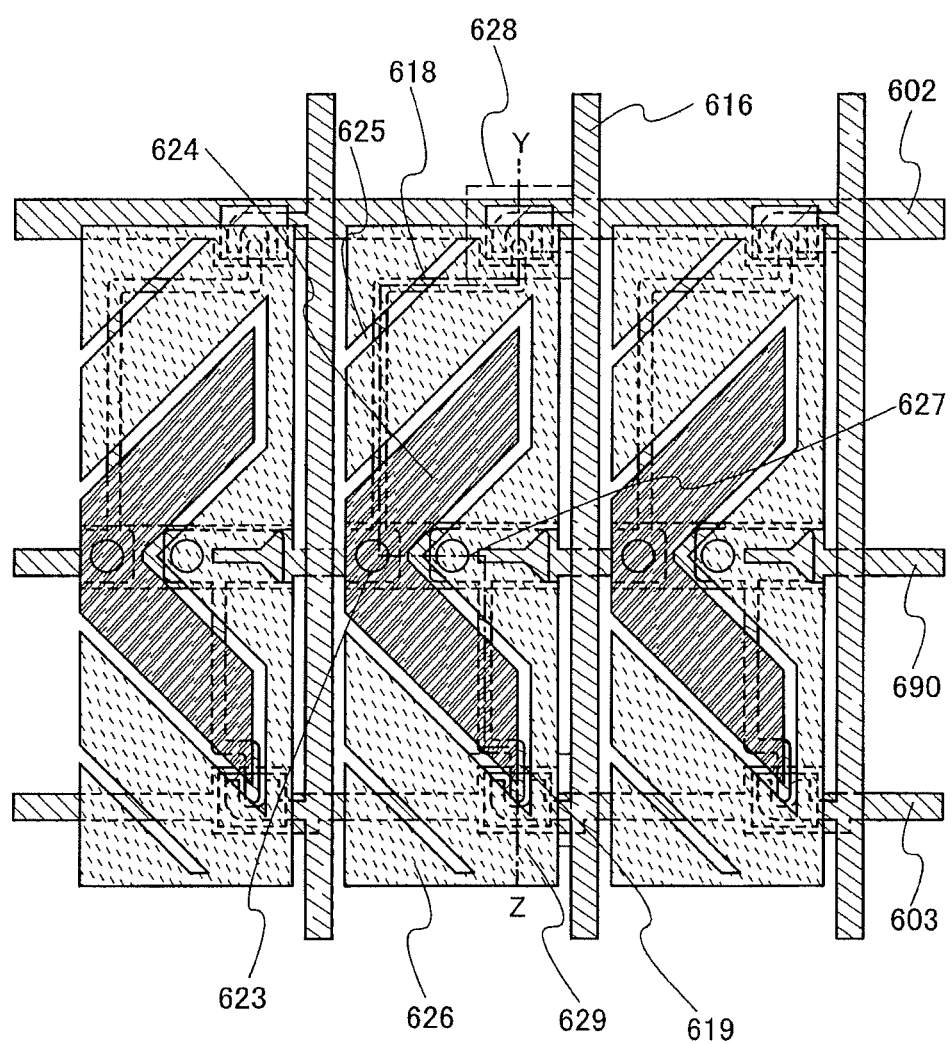
FIG. 27 is a plan view illustrating the display device according to the present invention.

FIG. 26 and FIG. 27 illustrate a pixel structure of a VA mode liquid crystal panel. FIG. 27 is a plane view over a substrate 600. FIG. 26 illustrates a cross-sectional structure taken along a line Y-Z in FIG. 27. The following explanation will be made with reference to these drawings.

In this pixel structure, a plurality of pixel electrodes 624 and 626 is included in one pixel, and thin film transistors 628 and 629 are connected to the pixel electrodes 624 and 626, respectively, through a planarization film 622. The thin film transistors 628 and 629 are driven by different gate signals. That is, a pixel of multi-domain design has a structure in which a signal applied to each of the pixel electrodes 624 and 626 is independently controlled.

The pixel electrode 624 is connected to the thin film transistor 628 via a wiring 618 in a contact hole 623. Further, the pixel electrode 626 is connected to the thin film transistor 629 via a wiring 619 in a contact hole 627. A gate electrode 602 of the thin film transistor 628 and a gate electrode 603 of the thin film transistor 629 are separated so that different gate signals can be given thereto. On the other hand, a wiring 616 functioning as a data line is used in common for the thin film transistors 628 and 629. The thin film transistors 628 and 629 can be manufactured by the methods described in the above-described embodiment modes. Further a capacitor wiring 690 is formed.

The pixel electrodes 624 and 626 have different shapes. The pixel electrodes 624 and 626 are separated by a slit 625. The pixel electrode 626 is formed so as to surround the outside of the pixel electrode 624 which is expanded in a V-shape. Timing of voltage application is made to vary between the pixel electrodes 624 and 626 by the thin film transistors 628 and 629 in order to control orientation of the liquid crystal. When different gate signals are supplied to the gate wirings 602 and 603, operation timings of the thin film transistors 628 and 629 can vary. An orientation film 648 is formed over the pixel electrodes 624 and 626.

Figure 28:
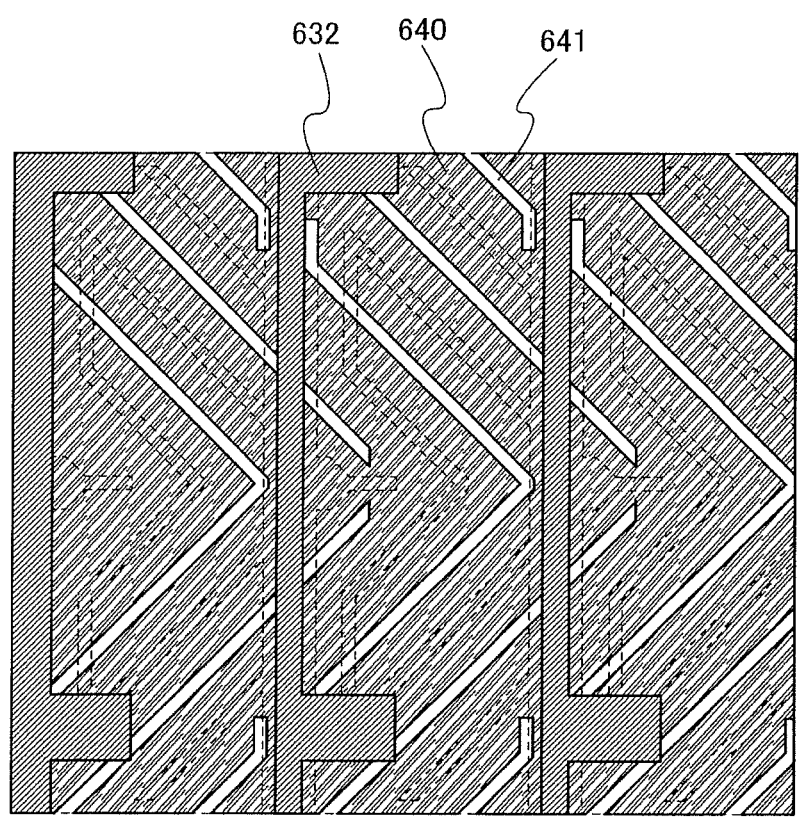
FIG. 28 is a plan view illustrating the display device according to the present invention.

A counter substrate 601 is provided with a light-blocking film 632, a coloring film 636, and a counter electrode 640. Moreover, a planarization film 637 is formed between the coloring film 636 and the counter electrode 640 to prevent alignment disorder of the liquid crystal. In addition, the orientation film 646 is provided for the counter electrode 640. FIG. 28 illustrates a structure on a counter substrate side. The counter electrode 640 is an electrode shared by different pixels and a slit 641 is formed. This slit 641 is disposed so as to alternatively mesh with the slit 625 on the side of the pixel electrodes 624 and 626, whereby an oblique electric field is generated effectively to control orientation of liquid crystals. Accordingly, the direction in which liquid crystals are oriented is made different depending on a place, and a viewing angle of the liquid crystal panel is expanded.

In this specification, a substrate, a coloring film, a light-blocking film, and a planarization film form a color filter. Note that either the light-blocking film or the planarization film, or both of them are not necessarily formed over the substrate.

The coloring film has a function of preferentially transmitting light of a predetermined wavelength range, among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for the color filter. However, the combination of the coloring films is not limited to the above combination.

A first liquid crystal element is formed by overlapping the pixel electrode 624, the liquid crystal layer 650, and the counter electrode 640. A second liquid crystal element is formed by overlapping of the pixel electrode 626, the liquid crystal layer 650, and the counter electrode 640. This is a multi-domain structure in which the first liquid crystal element and the second liquid crystal element are included in one pixel.

Although a vertical alignment (VA) mode liquid crystal display device is described here, the element substrate formed in accordance with the above-described embodiment modes can also be applied to an FFS mode liquid crystal display device, an IPS mode liquid crystal display device, a TN mode liquid crystal display device, and the like.

Through the above-described steps, the liquid crystal display device can be manufactured. Since an inverted staggered thin film transistor with small off current and high electric characteristics is used for the liquid crystal display device of this embodiment mode, the liquid crystal display device with high contrast and high visibility can be manufactured.

Embodiment Mode 13

In this embodiment mode, a light-emitting device including a thin film transistor in accordance with any of the above-described embodiment modes will be described as one mode of a display device. Here, a structure of a pixel included in the light-emitting device will be described. FIG. 29A illustrates one mode of a top view of the pixel, and FIG. 29B illustrates one mode of a cross-sectional structure of the pixel corresponding to a line A-B in FIG. 29A.

A display device including a light-emitting element utilizing electroluminescence is described as a light-emitting device. Light emitting elements utilizing electroluminescence are classified according to whether a light emitting material is an organic compound or an inorganic compound. In general, the former is referred to as an organic EL element, the latter as an inorganic EL element. In this embodiment mode, the process for manufacturing the thin film transistor in accordance with any of the above-described embodiment modes can be used.

In an organic EL element, by application of a voltage to a light-emitting element, electrons and holes are separately injected from a pair of electrodes into a layer containing a light-emitting organic compound, and current flows. The electrons and holes (i.e., carriers) are recombined, and thus, the light-emitting organic compound is excited. The light-emitting organic compound returns to a ground state from the excited state, thereby emitting light. Because of such a mechanism, such a light emitting element is referred to as a current-excitation light emitting element.

The inorganic EL elements are classified according to their element structures into a dispersion-type inorganic EL element and a thin film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element. In addition, description will be made using the channel-etch thin film transistor as a thin film transistor for switching which controls input of a signal to a first pixel electrode and a thin film transistor for driving which controls driving of a light-emitting element, but a channel protective thin film transistor can also be used as appropriate.

In FIGS. 29A and 29B, a first thin film transistor 74a corresponds to a thin film transistor for switching which controls input of a signal to a pixel electrode, and a second thin film transistor 74b corresponds to a thin film transistor for driving which controls supply of current or voltage to a light-emitting element 94.

A gate electrode of the first thin film transistor 74a is connected to a scanning line 51a, one of a source and a drain thereof is connected to a wiring 71a to 71c which function as signal lines, and the other of the source and the drain is connected to a gate electrode 51b of the second thin film transistor 74b via a wiring 71d to 71f. One of a source and a drain of the second thin film transistor 74b is connected to a power source line 93a to 93c, and the other of the source and the drain is connected to a first electrode 79 of light-emitting element via a wiring 93d to 93f. A gate electrode, a gate insulating film, and the power supply line 93a of the second thin film transistor 74b form a capacitor element 96, and the other of the source and the drain of the first thin film transistor 74a is connected to the capacitor element 96.

Note that the capacitor 96 corresponds to a capacitor for holding a voltage between the gate and the source or between the gate and the drain of the second thin film transistor 74b (hereinafter referred to as a gate voltage) when the first thin film transistor 74a is off, and the capacitor 96 is not necessarily provided.

In this embodiment mode, the first thin film transistor 74a and the second thin film transistor 74b can be each formed using the thin film transistor described in the above-described embodiment modes. Here, the first thin film transistor 74a and the second thin film transistor 74b are formed of n-channel thin film transistors; however, the first thin film transistor 74a may be formed of an n-channel thin film transistor and the second thin film transistor 74b may be formed of a p-channel thin film transistor. Alternatively, the first thin film transistor 74a and the second thin film transistor 74b may be formed of p-channel thin film transistors.

A protective insulating film 76 is formed over the first thin film transistor 74a and the second thin film transistor 74b, a planarization film 78 is formed over the protective insulating film 76, and then the first electrode 79 is formed to be connected to a wiring 93f in a contact hole formed in the planarization film 78 and the protective insulating film 76. The planarization film 78 is preferably formed using an organic resin such as acrylic, polyimide, or polyamide, or a siloxane polymer. Since the first electrode 79 is uneven due to the contact hole, a partition wall 91 having an opening is provided to cover the uneven portion of the first electrode 79. In the opening of the partition wall 91, an EL layer 92 is formed so as to be in contact with the first electrode 79, and a second electrode 93 is formed so as to cover the EL layer 92. A protective insulating film 95 is formed so as to cover the second electrode 93 and the partition wall 91.

Here, a light-emitting element 94 with a top emission structure will be described as a light-emitting element. The light-emitting element 94 with a top emission structure can emit light even over the first thin film transistor 74a or the second thin film transistor 74b; thus, a light emission area can be increased. However, if a base film of the EL layer 92 is uneven, the thickness is nonuniform due to unevenness, and the second electrode 93 and the first electrode 79 are short-circuited, so that a display defect is caused. Therefore, a planarization film 78 is preferably provided.

The light-emitting element 94 corresponds to a region where the first electrode 79 and the second electrode 93 sandwich the EL layer 92. In the case of the pixel illustrated in FIG. 29B, light from the light-emitting element 94 is emitted to the second electrode 93 side as indicated by an outline arrow.

As the first electrode 79 functioning as a cathode, a known conductive film can be used as long as it has a low work function and reflects light. For example, Ca, Al, MgAg, AlLi, or the like is preferably used. The light-emitting layer 92 may be formed using either a single layer or a plurality of stacked layers. When the EL layer 92 is formed using a plurality of stacked layers, an electron-injection layer, an electron-transporting layer, a light-emitting layer, a hole-transporting layer, and a hole-injecting layer are stacked in this order over the first electrode 79 functioning as a cathode. Note that all these layers are not necessarily provided. The second electrode 93 functioning as an anode is formed using a light-transmitting conductive material such as a light-transmitting conductive film of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

Here, a light-emitting element with a top emission structure in which light emission is extracted through a surface opposite to a substrate side is described; however, a light-emitting element with a bottom emission structure in which light emission is extracted through a surface on the substrate side, or a light-emitting element with a dual emission structure in which light emission is extracted through the surface opposite to the substrate side and the surface on the substrate side can be used as appropriate.

Although an organic EL element is described here as a light-emitting element, an inorganic EL element can also be provided as a light-emitting element.

Note that, in this embodiment mode, an example in which a thin film transistor for controlling the driving of a light-emitting element (the driving thin film transistor) is connected to the light-emitting element is described; however, a thin film transistor for controlling current may be connected between the driving thin film transistor and the light-emitting element.

Through the above-described process, a light-emitting display device can be manufactured. Since an inverted staggered thin film transistor with small off current and high electric characteristics is used for the light-emitting device of this embodiment mode, the light-emitting display device with high contrast and high visibility can be manufactured.

Embodiment Mode 14

Next, a structure of a light-emitting panel, which is one mode of a light-emitting device of the present invention, is described below.

Figure 30A:
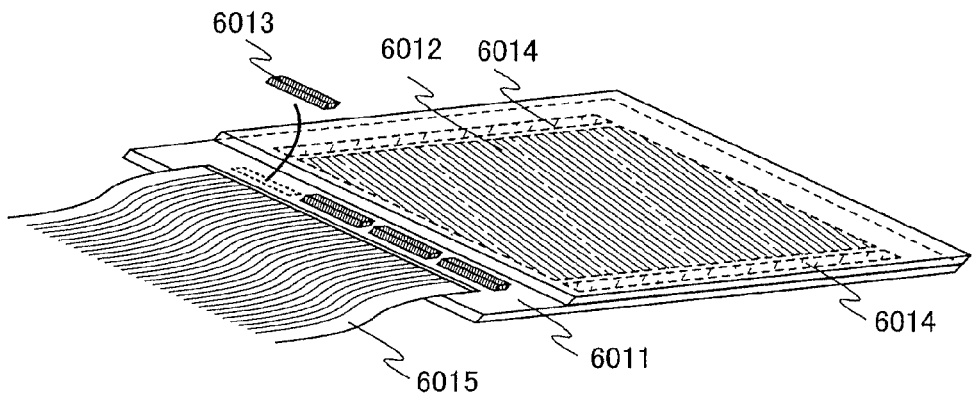
FIGS. 30A to 30C are perspective views each illustrating a display device according to the present invention.

FIG. 30A illustrates a mode of a display panel in which a pixel portion 6012 formed over a substrate 6011 is connected to signal line driver circuits 6013 that are formed separately. The pixel portion 6012 and a scanning line driver circuits 6014 are each formed using the thin film transistor described in the above-described embodiment modes. By forming the signal line driver circuit with a thin film transistor by which higher field effect mobility can be obtained than a thin film transistor in which an amorphous semiconductor film is used for a channel formation region, operation of the signal line driver circuit, which demands a higher driving frequency than the scanning line driver circuit, can be stabilized. Note that the signal line driver circuits 6013 may be formed using a transistor using a single crystal semiconductor for a channel formation region, a thin film transistor using a polycrystalline semiconductor for a channel formation region, or a transistor using SOI for a channel formation region. The pixel portion 6012, the signal line driver circuits 6013, and the scanning line driver circuits 6014 are each supplied with potential of a power source, various signals, and the like via an FPC 6015. Further, a protection circuit may be provided between the signal line driver circuits 6013 and the FPC 6015 or between the signal line driver circuits 6013 and the pixel portion 6012. The protection circuit includes one or more elements selected from a thin film transistor, a diode, a resister element, a capacitor element, and the like.

Note that the signal driver circuit and the scanning line driver circuit may both be formed over the same substrate as that of the pixel portion.

Figure 30B:
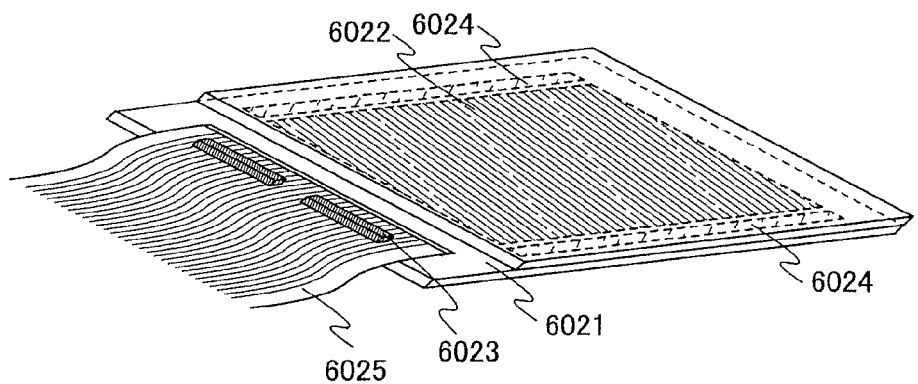

Also, when the driver circuit is separately formed, a substrate provided with the driver circuit is not always required to be attached to a substrate provided with the pixel portion, and may be attached to, for example, the FPC. FIG. 30B illustrates a mode of a panel of a display device in which signal line driver circuits 6023 are formed separately and are connected to a pixel portion 6022 and scanning line driver circuits 6024 that are formed over a substrate 6021. The pixel portion 6022 and the scanning line driver circuit 6024 are each formed using the thin film transistor described in the above-described embodiment modes. The signal line driver circuits 6023 are connected to the pixel portion 6022 via an FPC 6025. The pixel portion 6022, the signal line driver circuits 6023, and the scanning line driver circuits 6024 are each supplied with potential of a power source a variety of signals, and the like via the FPC 6025. Further, a protection circuit may be provided between the signal line driver circuits 6023 and the FPC 6025 or between the signal line driver circuits 6023 and the pixel portion 6022.

Figure 30C:
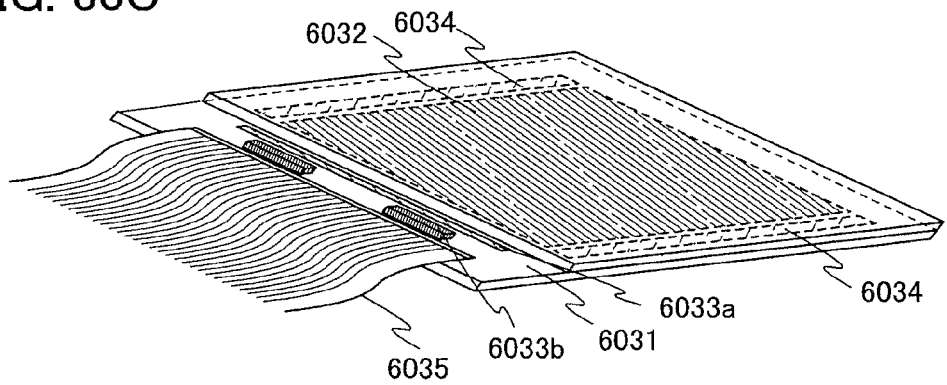

Furthermore, only part of the signal line driver circuit or only part of the scanning line driver circuit may be formed over the same substrate as the pixel portion using the thin film transistor described in the above-described embodiment modes, and the rest may be formed separately and electrically connected to the pixel portion. FIG. 30C illustrates a mode of a panel of a display device in which an analog switch 6033*a* included in a signal driver circuit is formed over a substrate 6031, over which a pixel portion 6032 and scanning line driver circuits 6034 are formed, and shift registers 6033*b* included in the signal line driver circuit is formed separately over a different substrate and then attached to the substrate 6031. The pixel portion 6032 and the scanning line driver circuit 6034 are each formed using the thin film transistor described in the above-described embodiment modes. The shift resistors 6033*b* included in the signal line driver circuit are connected to the pixel portion 6032 via an FPC 6035. The pixel portion 6032, the signal line driver circuit, and the scanning line driver circuits 6034 are each supplied with potential of a power source, a variety of signals, and the like via the FPC 6035. Further, a protection circuit may be provided between the shift register 6033*b* and the FPC 6035 or between the shift register 6033*b* and the analog switch 6033*a*.

As illustrated in FIGS. 30A to 30C, in display devices of this embodiment mode, all or a part of the driver circuit can be formed over the same substrate as the pixel portion, using the thin film transistor described in the above-described embodiment modes.

Note that there are no particular limitations on a connection method of a separately formed substrate, and a known method such as a COG method, a wire bonding method, or a TAB method can be used. Further, a connection position is not limited to the position illustrated in FIGS. 30A to 30C, as long as electrical connection is possible. Also, a controller, a CPU, a memory, or the like may be formed separately and connected.

Note that the signal line driver circuit used in the present invention includes a shift register and an analog switch. In addition to the shift register and the analog switch, another circuit such as a buffer, a level shifter, or a source follower may be included. Also, the shift resistor and the analog switch is not always required to be provided, and for example a different circuit such as a decoder circuit by which selection of signal line is possible may be used instead of the shift resistor, and a latch or the like may be used instead of the analog switch.

Embodiment Mode 15

The display device or the like obtained according to the present invention can be used for an active matrix display device panel. That is, the present invention can be applied to all electronic devices incorporating them in display portions.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). Examples of these devices are illustrated in FIGS. 31A to 31D.

Figure 31A:
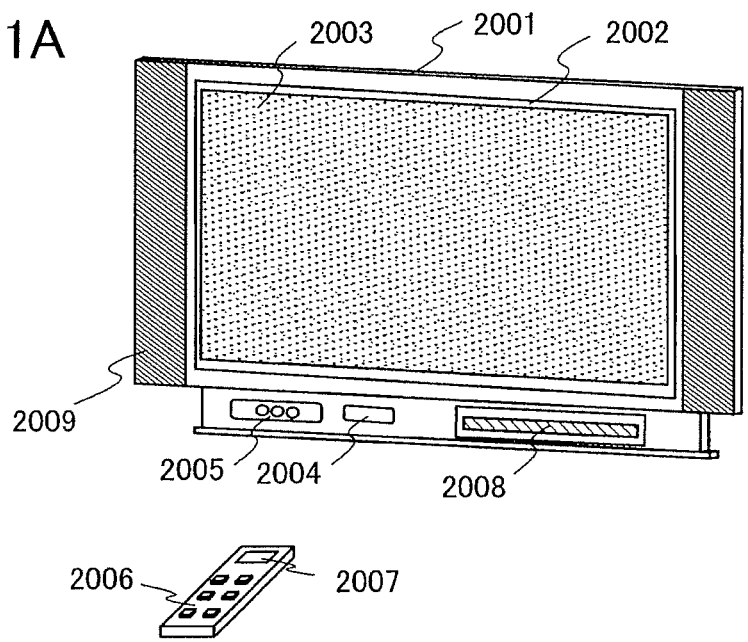
FIGS. 31A to 31D are perspective views each illustrating an electronic device using a display device according to the present invention.

FIG. 31A illustrates a television device. A television device can be completed by incorporating a display panel into a housing as illustrated in FIG. 31A. A main screen 2003 is formed using the display panel, and other accessories such as a speaker portion 2009 and an operation switch are provided. In such a manner, a television device can be completed.

As illustrated in FIG. 31A, a display panel 2002 using a display element is incorporated in a housing 2001. When a receiver 2005 is used, general reception of TV broadcast can be performed; moreover, communication of information in one way (from a transmitter to a receiver) or in two ways (between a transmitter and a receiver or between receivers) by connection to a wired or wireless communication network through a modem 2004 can also be performed. The television device can be operated by using a switch incorporated in the housing or a remote control unit 2006. Also, a display portion 2007 for displaying output information may also be provided in the remote control unit.

Further, the television device may include a sub screen 2008 formed using a second display panel for displaying channels, sound volume, and the like, in addition to the main screen 2003. In this structure, the main screen 2003 may be formed using a liquid crystal display panel, and the sub screen may be formed using a light-emitting display panel. Alternatively, a structure may be employed in which the main screen 2003 is formed using a light-emitting display panel, the sub screen is formed using a light-emitting display panel, and the sub screen can be turned on and off.

Figure 32:
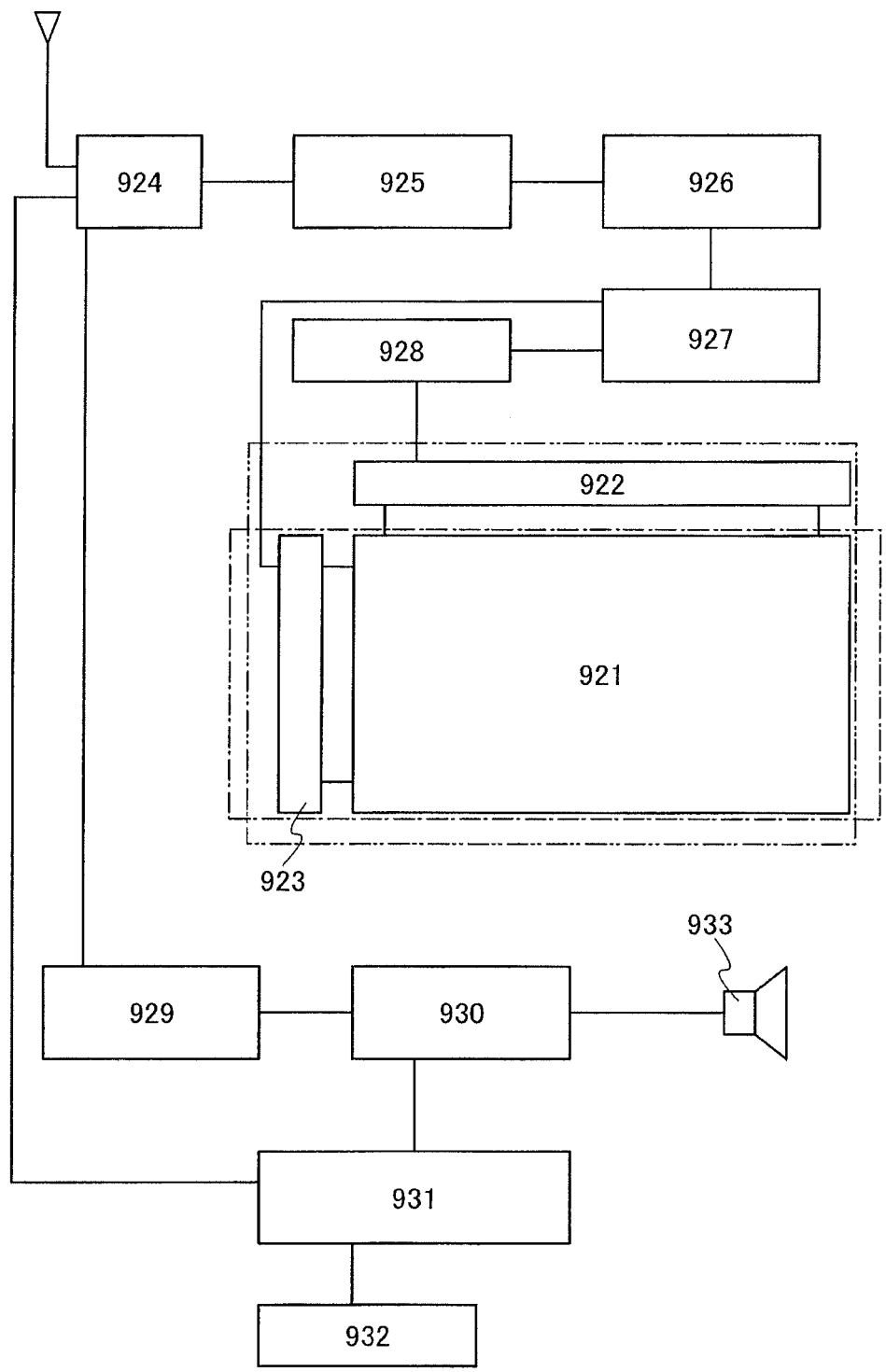
FIG. 32 is a block diagram illustrating an electronic device using a display device according to the present invention.

FIG. 32 is a block diagram illustrating a main structure of the television device. A display panel is provided with a pixel portion 921. A signal line driver circuit 922 and a scanning line driver circuit 923 may be mounted on the display panel by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like. The control circuit 927 outputs signals to each of the scanning line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

Needless to say, the invention is not limited to the television device and can be used as a large area display medium for various applications such as a monitor of a personal computer, an information display at a train station, airport and the like, an advertisement display on the streets, and the like.

The display device described in the above-described embodiment mode is applied to each of the main screen 2003 and the sub screen 2008, whereby mass productivity of television devices with improved image quality, such as contrast, can be increased.

Figure 31B:
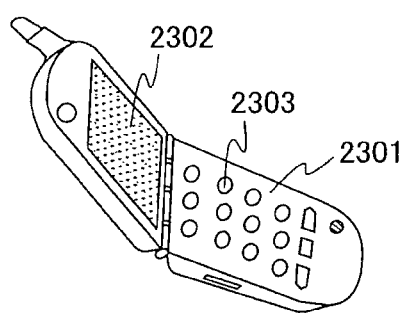

FIG. 31B illustrates one example of a cellular phone 2301. The cellular phone 2301 includes a display portion 2302, an operation portion 2303, and the like. The display device described in any of the preceding embodiment modes is applied to the display portion 2302, so that mass productivity of the mobile phone with improved image quality, such as contrast, can be increased.

Figure 31C:
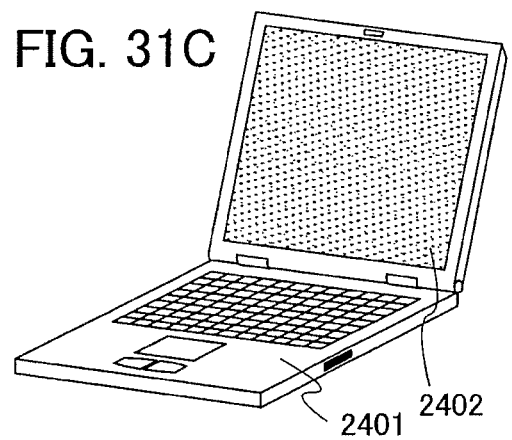

A portable computer illustrated in FIG. 31C includes a main body 2401, a display portion 2402, and the like. The display device described in any of the preceding embodiment modes is applied to the display portion 2402, so that mass productivity of the computer with improved image quality, such as contrast, can be improved.

Figure 31D:
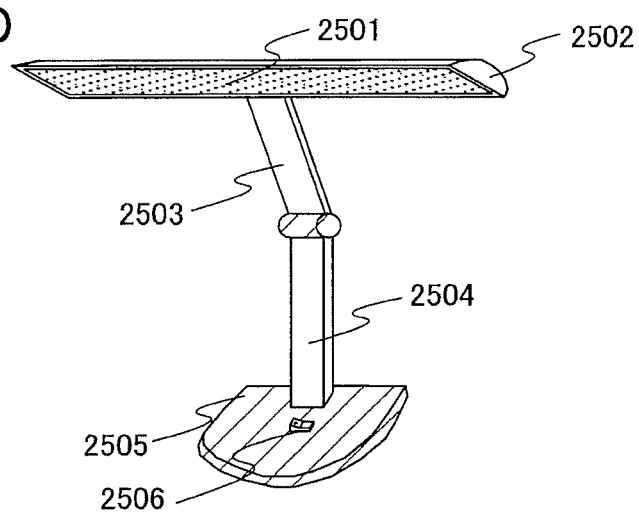

FIG. 31D illustrates a desk lamp including a lighting portion 2501, a shade 2502, an adjustable arm 2503, a support 2504, a base 2505, and a power supply switch 2506. The desk lamp can be manufactured by applying the light-emitting device of the present invention to the lighting portion 2501. Note that the lamp includes ceiling lights, wall lights, and the like in its category. Use of the display device described in any of the preceding embodiment modes can increase mass productivity and provide inexpensive desk lamps.

Figure 33A:
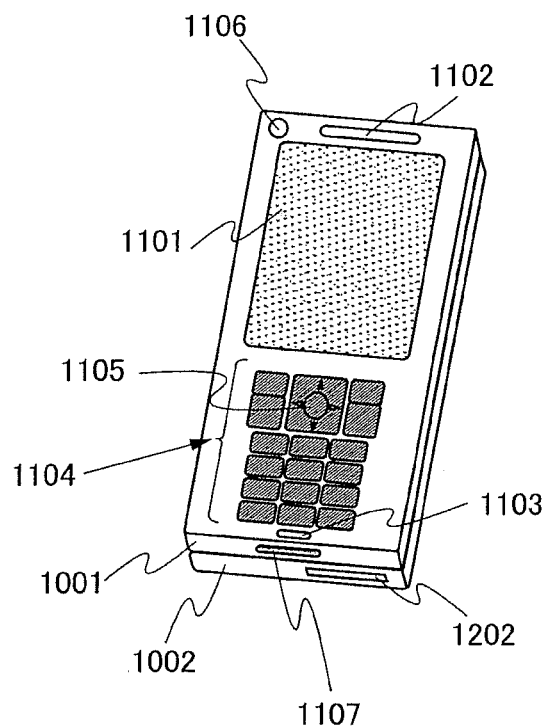
FIGS. 33A to 33C are perspective views each illustrating an electronic device using a display device according to the present invention.
Figure 33B:
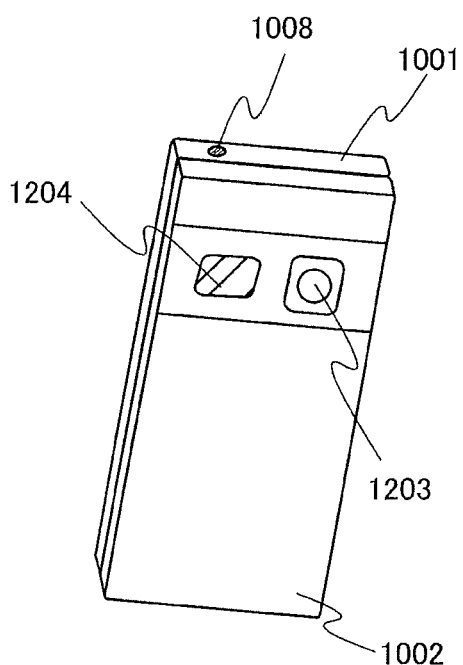
Figure 33C:
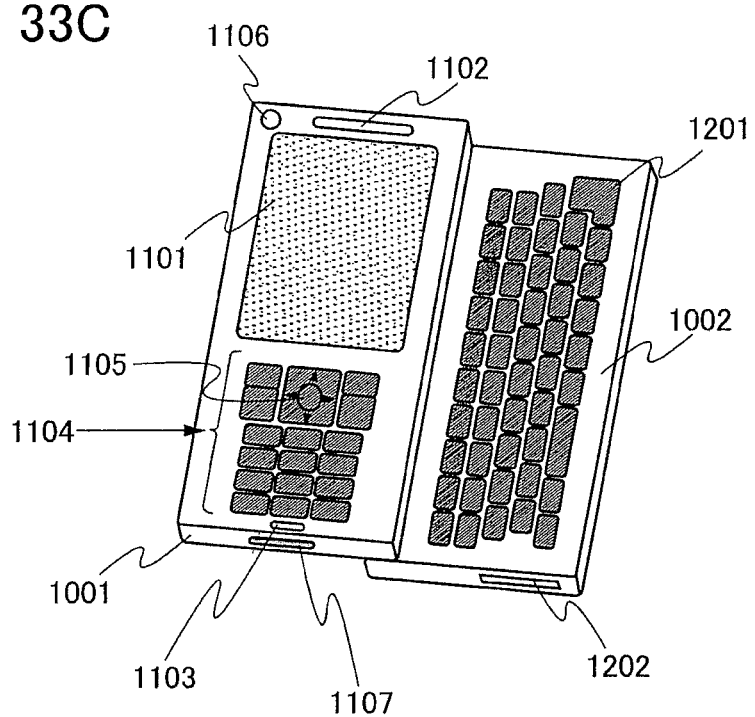

FIGS. 33A to 33C illustrate an example of a structure of a smartphone to which the present invention is applied. FIG. 33A is a front view, FIG. 33B is a rear view, and FIG. 33C is a development view. The smartphone has two housings 1001 and 1002. The smartphone has both a function of a cellular phone and a function of a portable information terminal, and incorporates a computer which conducts a variety of data processing in addition to verbal communication; therefore, it is called smartphone.

The smartphone has the two housings 1001 and 1002. The housing 1001 includes a display portion 1101, a speaker 1102, a microphone 1103, operation keys 1104, a pointing device 1105, a front camera lens 1106, a jack 1107 for an external connection terminal, an earphone terminal 1008, and the like, while the housing 1002 includes a keyboard 1201, an external memory slot 1202, a rear camera lens 1203, a light 1204, and the like. In addition, an antenna is incorporated in the housing 1001.

In addition to the above-described structure, the smartphone may incorporate a non-contact IC chip, a small size memory device, or the like.

The housing 1001 and housing 1002 (FIG. 33A) which are put together to be lapped with each other are developed by sliding as illustrated in FIG. 33C. In the display portion 1101, the display device described in the above embodiment mode can be incorporated, and display direction can be changed depending on a use mode. Because the front camera lens 1106 is provided in the same plane as the display portion 1101, the cellular phone can be used as a videophone. A still image and a moving image can be taken by the rear camera 1203 and the light 1204 by using the display portion 1101 as a viewfinder.

The speaker 1102 and the microphone 1103 can be used for videophone, recording, playback, and the like without being limited to verbal communication. With use of the operation keys 1104, operation of incoming and outgoing calls, simple information input of electronic mails or the like, scrolling of a screen, cursor motion and the like are possible.

If much information is needed to be treated, such as documentation, use as a portable information terminal, and the like, the use of the keyboard 1201 is convenient. When the housing 1001 and the housing 1002 which are put together to be lapped with each other (FIG. 33A) are developed by sliding as illustrated in FIG. 33C and the smartphone is used as a portable information terminal, smooth operation can be conducted by using the keyboard 1201 and the pointing device 1105. The jack 1107 for an external connection terminal can be connected to an AC adaptor and various types of cables such as a USB cable, and charging and data communication with a personal computer or the like are possible. Moreover, a large amount of data can be stored by inserting a storage medium into the external memory slot 1202 and can be moved.

In the rear surface of the housing 1002 (FIG. 33B), the rear camera 1203 and the light 1204 are provided, and a still image and a moving image can be taken by using the display portion 1101 as a viewfinder.

Further, the smartphone may have an infrared communication function, a USB port, a function of receiving one segment television broadcast, a non-contact IC chip, an earphone jack, or the like, in addition to the above-described functions and structures.

Use of the display device described in the preceding embodiment modes can increase mass productivity.

This application is based on Japanese Patent Application serial no. 2007-339409 filed with Japan Patent Office on Dec. 28, 2007, the entire contents of which are hereby incorporated by reference.

What is claimed is:

1. A thin film transistor comprising:
   conductive particles;
   a semiconductor film containing germanium at a concentration greater than or equal to 5 at. % and less than or equal to 100 at. % which is provided over a gate electrode with a first insulating film interposed therebetween and which is provided in an inner region of the gate electrode so as not to overlap with an end portion of the gate electrode;
   an amorphous semiconductor film formed over the semiconductor film containing germanium at a concentration greater than or equal to 5 at. % and less than or equal to 100 at. %;
   a pair of impurity semiconductor films to which an impurity element imparting one conductivity type is added, which form source and drain regions, over the amorphous semiconductor film;
   a second insulating film covering a side surface of the semiconductor film containing germanium at a concentration greater than or equal to 5 at. % and less than or equal to 100 at. %, a side surface of the amorphous semiconductor film, and at least one side surface and part of a top surface of the pair of impurity semiconductor films; and
   a pair of wirings which are formed over the second insulating film and which are in contact with the pair of impurity semiconductor films,
   wherein the conductive particles are between the first insulating film and the semiconductor film containing germanium at a concentration greater than or equal to 5 at. % and less than or equal to 100 at. %.

2. The thin film transistor according to claim 1, wherein the pair of impurity semiconductor films overlaps end portions of the semiconductor film containing germanium at a concentration greater than or equal to 5 at. % and less than or equal to 100 at. %.

3. The thin film transistor according to claim 1, wherein the pair of impurity semiconductor films does not overlap with at least one end portion of the amorphous semiconductor film.

4. The thin film transistor according claim 1, wherein a second amorphous semiconductor film is formed in contact with the semiconductor film containing germanium at a concentration greater than or equal to 5 at. % and less than or equal to 100 at. %.

5. A display device comprising the thin film transistor according to claim 1.

6. A thin film transistor comprising:
   conductive particles;
   a semiconductor film containing germanium at a concentration greater than or equal to 5 at. % and less than or equal to 100 at. % which is provided over a gate electrode with a first insulating film interposed therebetween and which is provided in an inner region of the gate electrode so as not to overlap with an end portion of the gate electrode;
   an amorphous semiconductor film formed over the semiconductor film containing germanium at a concentration greater than or equal to 5 at. % and less than or equal to 100 at. %;
   a second insulating film covering a side surface of the semiconductor film containing germanium at a concentration greater than or equal to 5 at. % and less than or equal to 100 at. % and a side surface and part of a top surface of the amorphous semiconductor film; and
   a pair of impurity semiconductor films to which an impurity element imparting one conductivity type is added, which are formed over the second insulating film and which form a source and drain regions,
   wherein the conductive particles are between the first insulating film and the semiconductor film containing germanium at a concentration greater than or equal to 5 at. % and less than or equal to 100 at. %.

7. The thin film transistor according to claim 6, wherein the pair of impurity semiconductor films overlaps end portions of the semiconductor film containing germanium at a concentration greater than or equal to 5 at. % and less than or equal to 100 at. %.

8. The thin film transistor according claim 6, wherein a second amorphous semiconductor film is formed in contact with the semiconductor film containing germanium at a concentration greater than or equal to 5 at. % and less than or equal to 100 at. %.

9. A display device comprising the thin film transistor according to claim 6.

10. A thin film transistor comprising:
    a metal film, a metal alloy film, a metal nitride film, a metal carbide film, a metal boride film, or a metal silicide film which is provided over a gate electrode with a first insulating film interposed therebetween and which is provided in an inner region of the gate electrode so as not to overlap with an end portion of the gate electrode;
    an amorphous semiconductor film formed over the metal film, the metal alloy film, the metal nitride film, the metal carbide film, the metal boride film, or the metal silicide film;
    a pair of impurity semiconductor films to which an impurity element imparting one conductivity type is added, which form source and drain regions, over the amorphous semiconductor film;
    a second insulating film covering a side surface of the metal film, the metal alloy film, the metal nitride film, the metal carbide film, the metal boride film, or the metal silicide film, a side surface of the amorphous semiconductor film, and at least one side surface of the pair of impurity semiconductor films; and
    a pair of wirings which are formed over the second insulating film and which are in contact with the pair of impurity semiconductor films.

11. The thin film transistor according to claim 10, wherein the pair of impurity semiconductor films overlaps end portions of the metal film, the metal alloy film, the metal nitride film, the metal carbide film, the metal boride film, or the metal silicide film.

12. The thin film transistor according to claim 10, wherein the pair of impurity semiconductor films does not overlap with at least one end portion of the amorphous semiconductor film.

13. The thin film transistor according claim 10, wherein a second amorphous semiconductor film is formed in contact with the metal film, the metal alloy film, the metal nitride film, the metal carbide film, the metal boride film, or the metal silicide film.

14. A display device comprising the thin film transistor according to claim 10.

15. A thin film transistor comprising:
- a metal film, a metal alloy film, a metal nitride film, a metal carbide film, a metal boride film, or a metal silicide film which is provided over a gate electrode with a first insulating film interposed therebetween and which is provided in an inner region of the gate electrode so as not to overlap with an end portion of the gate electrode;
- an amorphous semiconductor film formed over the metal film, the metal alloy film, the metal nitride film, the metal carbide film, the metal boride film, or the metal silicide film;
- a second insulating film covering a side surface of the metal film, the metal alloy film, the metal nitride film, the metal carbide film, the metal boride film, or the metal silicide film and a side surface of the amorphous semiconductor film; and
- a pair of impurity semiconductor films to which an impurity element imparting one conductivity type is added, which are formed over the second insulating film and which form a source and drain regions.

16. The thin film transistor according to claim 15, wherein the pair of impurity semiconductor films overlaps end portions of the metal film, the metal alloy film, the metal nitride film, the metal carbide film, the metal boride film, or the metal silicide film.

17. The thin film transistor according claim 15, wherein a second amorphous semiconductor film is formed in contact with the metal film, the metal alloy film, the metal nitride film, the metal carbide film, the metal boride film, or the metal silicide film.

18. A display device comprising the thin film transistor according to claim 15.

* * * * *